United States Patent
Tamaki et al.

(10) Patent No.: US 7,923,918 B2
(45) Date of Patent: Apr. 12, 2011

(54) LIGHT EMITTING FILM, LUMINESCENT DEVICE, METHOD FOR MANUFACTURING LIGHT EMITTING FILM AND METHOD FOR MANUFACTURING LUMINESCENT DEVICE

(75) Inventors: Hiroto Tamaki, Anan (JP); Shinsuke Sofue, Anan (JP); Kunihiro Izuno, Anan (JP); Junji Takeichi, Anan (JP)

(73) Assignee: Nichia Corporation, Tokushima (JP)

( * ) Notice: Subject to any disclaimer, the term of this patent is extended or adjusted under 35 U.S.C. 154(b) by 1114 days.

(21) Appl. No.: 10/548,757

(22) PCT Filed: Mar. 12, 2004

(86) PCT No.: PCT/JP2004/003363
§ 371 (c)(1),
(2), (4) Date: Sep. 9, 2005

(87) PCT Pub. No.: WO2004/081140
PCT Pub. Date: Sep. 23, 2004

(65) Prior Publication Data
US 2006/0170332 A1 Aug. 3, 2006

(30) Foreign Application Priority Data

Mar. 13, 2003 (JP) ................................. 2003-068959
Aug. 5, 2003 (JP) ................................. 2003-286742

(51) Int. Cl.
*H01J 1/62* (2006.01)
(52) U.S. Cl. ......... 313/503; 313/501; 313/502; 313/506
(58) Field of Classification Search ........... 313/498–512
See application file for complete search history.

(56) References Cited

U.S. PATENT DOCUMENTS

| | | | | |
|---|---|---|---|---|
| 4,576,833 | A | * | 3/1986 | Scholten et al. ................. 427/67 |
| 5,656,218 | A | * | 8/1997 | Lin et al. .......................... 501/89 |
| 5,811,924 | A | | 9/1998 | Okumura et al. |
| 6,004,686 | A | | 12/1999 | Rasmussen et al. |
| 6,313,578 | B1 | | 11/2001 | Mishra et al. |
| 2002/0043926 | A1 | | 4/2002 | Takahashi et al. |
| 2002/0070172 | A1 | * | 6/2002 | Schlegel .......................... 210/660 |
| 2002/0074292 | A1 | * | 6/2002 | Schlegel et al. ................ 210/681 |
| 2003/0113666 | A1 | * | 6/2003 | Endo .......................... 430/281.1 |
| 2003/0198579 | A1 | * | 10/2003 | LaBarge ......................... 422/179 |

(Continued)

FOREIGN PATENT DOCUMENTS
EP 0 936 682 8/2000

(Continued)

*Primary Examiner* — Bumsuk Won
(74) *Attorney, Agent, or Firm* — Wenderoth, Lind & Ponack, L.L.P.

(57) ABSTRACT

The present invention provides a reliable, long-life phosphor, or the like, which is prevented from darkening due to aging. A light emitting apparatus has a light emitting element and a phosphor layer. The phosphor layer has a phosphor excited by light from the light emitting element, and a binder which binds the phosphor. The binder is hydroxide oxide gel obtained by curing sol of a hydroxide oxide mixed with sol containing at least one metallic element selected from the group consisting of Al, Y, Gd, Lu, Sc, Ga, In, and B. Transmittance of hydroxide oxide in a gel state is higher than the transmittance in the polycrystal state where the sol-gel reaction is proceeded. In addition, the content of hydroxyl group or water of crystallization in the hydroxide oxide is 10% or less by weight.

17 Claims, 28 Drawing Sheets

U.S. PATENT DOCUMENTS

| | | | |
|---|---|---|---|
| 2003/0209495 A1* | 11/2003 | Schlegel | 210/660 |
| 2004/0052953 A1* | 3/2004 | Cohu | 427/402 |
| 2004/0097362 A1* | 5/2004 | Addiego | 501/127 |
| 2004/0219433 A1* | 11/2004 | Besner et al. | 429/233 |

FOREIGN PATENT DOCUMENTS

| | | |
|---|---|---|
| EP | 1 111 689 | 6/2001 |
| JP | 6-251876 | 9/1994 |
| JP | 7-45189 | 2/1995 |
| JP | 9-92213 | 4/1997 |
| JP | 11-3051 | 1/1999 |
| JP | 2001-177145 | 6/2001 |
| JP | 2002-76434 | 3/2002 |
| JP | 2002-198573 | 7/2002 |
| JP | 2002-359403 | 12/2002 |
| WO | 96/21239 | 7/1996 |
| WO | 01/40403 | 6/2001 |

* cited by examiner

PARTING LINE

609

610

CIE Chromaticity Diagram (a)

(b)

(a)

(b)

(c)

(d)

(a)

(b)

(a)

(b)

US 7,923,918 B2

LIGHT EMITTING FILM, LUMINESCENT DEVICE, METHOD FOR MANUFACTURING LIGHT EMITTING FILM AND METHOD FOR MANUFACTURING LUMINESCENT DEVICE

TECHNICAL FIELD

The present invention relates to a luminescent film and a light emitting apparatus, which can be applied to a light source for lighting, an LED display, a back light source, a signal light, an illuminated switch, various sensors, various indicators, and so on, and a method for production of the luminescent film and light emitting apparatus.

BACKGROUND ART

A light emitting apparatus which radiates light with color different from the light of a light emitting element has been developed. The light emitting apparatus converts a part of the light of the light emitting element into a different wavelength by a phosphor, and mixes the light with converted wavelength and the light with non-converted wavelength of the light emitting element (for example, Japanese Laid-Open Publication Kokai No. 2002-198573). For example, a while LED light emitting apparatus, which has a blue light emitting diode (hereinafter, occasionally referred to as an "LED") and a phosphor member coating thereon, has been in actual use. The blue light emitting diode employs an InGaN group material is used as a light emitting element. The phosphor member is composed of a transparent material, such as an epoxy resin, containing an Yttrium aluminum garnet (hereinafter, occasionally referred to as "YAG") group phosphor represented by the formula $(Y,Gd)_3(Al,Ga)_5O_{12}$. The luminescent color of the white LED light emitting apparatus is obtained based on the additive color mixture principle. After the blue light emitted from the LED enters into the phosphor member, it is repeatedly absorbed and scattered in its layer, and then is outwardly radiated. On the other hand, the blue light absorbed by the phosphor serves as an excitation source, and exhibits yellow fluorescence. Human eyes recognize the mixture of the yellow light from the phosphor and the blue light from the LED as white.

The LED light emitting apparatus using such an LED is small, highly effective in terms of electric power consumption, and emits vivid color light. Since an LED is a semiconductor element, it is not prone to burn out. In addition, it has features, such as excellent initial drive characteristics, resistance to vibration or ON/OFF repeats. Since LEDs have these excellent characteristics, LED light emitting apparatuses are used as various kinds of light sources.

However, since conventional white light emitting apparatuses employ resin much, there is a problem that the resin deteriorates in the case where a light emitting element with high power or light with short wavelength. In the case where a cured film which employs an inorganic group binder, in particular silica gel ($SiO_2$), is used, there is a problem that the film is colored and deteriorates, and then darkens in exposure to high power or ultraviolet rays. Although the reason for this is not clear, it is assumed that an organic group included in silica sol remains therein after cured and thus is reduced by excitation of high-power light.

In order to improve light-outgoing efficiency of light emitting apparatus, improvement of the transmittance of luminescent film is a candidate. The transmittance of luminescent film depends on the transmittance of binder which binds a phosphor in the luminescent film. In the case where gel obtained by curing the sol is used as the binder, as the gel becomes closer to the polycrystal state by proceeding of sol-gel reaction as shown in FIG. 1, it is generally considered that the transmittance of the luminescent film increases as shown A in the Figure.

However, it is necessary to perform the reaction at high temperature to bring the gel close to the polycrystal state. This requires more time and energy. In addition, there is a problem that high temperature affects the semiconductor light emitting element or phosphor. For example, lead wires bonded to the LED chip can be damaged by the heat, or the phosphor deteriorates. Accordingly, in terms of reaction temperature, it is difficult to vitrify the sol to obtain inorganic polycrystalline by proceeding of the sol-gel reaction for improvement of light-outgoing efficiency.

Even if it is vitrified to obtain inorganic polycrystalline by proceeding of the sol-gel reaction, various problems arise in the interface between the luminescent film and the light emitting element. The problems arise, for example, total reflection occurs in the vitrified interface, thus, the light-outgoing efficiency and the extraction of reduces, or a space layer is formed in the interface of the light emitting element or the phosphor by a cause of the cure, thus, the space layer obstructs outgoing of the light.

Additionally, in the construction where the light emitting element such as LED excites a luminescent layer, there is also a problem that the luminescent layer deteriorates in exposure to high energy of excitation light from the LED. Since the light emitting layer that deteriorates becomes colored and turns to blackish, its original transparent characteristics deteriorates, thus, the light-outgoing efficiency reduces. Although this reason of the color deterioration of the darkening is not clear, the reason is assumed that the silica employed in the binder of the light emitting layer causes it.

Even if typical resins are used as a molding member which molds the phosphor in the light emitting layer, the resins remarkably deteriorate in exposure to high-power light. Accordingly, it is difficult to use resins as the molding member. For this reason, transparent binders, such as silica ($SiO_2$), are used. Silica in a sol state has excellent binding characteristics and transparent characteristics, and provides excellent light-outgoing efficiency. In addition, it is inexpensive in industrially use. Accordingly, it is useful.

However, when exposed to high-power light from LED for a long time, a silica binder layer is colored and deteriorates. Particularly in a high-power light emitting apparatus, the silica binder layer deteriorates by the light with high density and the heat, and thus is colored black or dark brown. As a result of the research by the inventors of the present invention, this reason is considered that $SiO_x$ ($x<2$), which should be $SiO_2$ as silica, is produced by oxygen omission. Under heat-curing temperature of 250° C., the silica binder is in a silica gel state where hydroxyl group and organic group partly remain in the $SiO_2$ skeleton. When light with high density is incident from LED in a silica gel state, oxygen omission occurs, thus, $SiO_2$ produces $SiO_x$ ($x<2$). As mentioned above, since Si is prone to be oxidized and reduced, that reason is considered that oxygen omission which occurs in the silica gel causes color deterioration. When color deterioration occurs, the problem that the light output from the light emitting element reduces arises.

Further, recently, a light emitting apparatus which uses a high-power light emitting element has been developed, it tends to accelerate the deterioration of resin by the light from the light emitting element. Moreover, efforts are moving ahead to develop light emitting elements with short wavelength such as the wavelength range from blue to short wavelength in the visible light region, in addition, with the ultraviolet region. On the other hand, a coating film which can endure ultraviolet rays or the like for a long time is not known. If typical resins are employed, the resins remarkably deteriorate in exposure to high-power light. Accordingly, it is difficult to use these resins as the coating film.

The present invention is aimed at solving the problems. It is a main object of the present invention to provide a luminescent film, a light emitting apparatus, a method for producing a luminescent film, and a method for producing a light emitting apparatus which improve light-outgoing efficiency and has excellent reliability, in addition, to provide a light emitting apparatus having a coating film which is less prone to deteriorate due to the light such as ultraviolet rays from a light emitting element.

DISCLOSURE OF INVENTION

A luminescent film for coating a light emitting element of the present invention comprises a filler member including at least a luminescent material; and a binder member, wherein the binder member contains at least a hydroxide oxide of metallic element. This luminescent film can be used as a diffusion layer which does not include a phosphor.

In another luminescent film of the present invention, the luminescent material is an inorganic phosphor, the filler member is an inorganic filler, and the binder member is an inorganic binder consisting principally of the hydroxide oxide of metallic element with a constant ionic charge number.

The luminescent film consists principally of an inorganic substance, and metallic element composing the hydroxide oxide has a constant ionic charge number. Accordingly, since the luminescent film is stable due to suppression of oxidation-reduction reaction of compound after formation of the film, it is possible to provide a luminescent film which does not deteriorate even in the case of light with high density or driving at high temperature.

In another luminescent film of the present invention, the luminescent material is an inorganic phosphor, the filler member is an inorganic filler, and the binder member is an inorganic binder consisting principally of the hydroxide oxide of metallic element, wherein the hydroxide oxide of metallic element is at least a hydroxide oxide of IIIA or IIIB group element.

A trivalent metallic element is used, thus, the effect on suppression of oxidation-reduction reaction is large. Accordingly, it is possible to provide a more stable luminescent film.

In another luminescent film of the present invention, the IIIA or IIIB group element contains at least one element selected from the group consisting of Sc, Y, Gd and Lu, or the group consisting of B, Al, Ga and In.

Hydroxide oxides of these elements have high transparency. In addition, they are stable, and it is relatively easy to get them.

In another luminescent film of the present invention, the hydroxide oxide of metallic element contained in the binder member is at least a hydroxide oxide of Al having boehmite structure or pseudoboehmite structure.

In another luminescent film of the present invention, the binder member contains the hydroxide oxide of aluminum, and 0.5% to 50% of hydroxide oxide of IIIA or IIIB group element other than the aluminum by weight relative to the binder member.

In another luminescent film of the present invention, the binder member contains 0.5% to 50% of boron oxide or boric acid by weight relative to the binder member.

In another luminescent film of the present invention, the hydroxide oxide of metallic element contained in the binder member is a hydroxide oxide of yttrium.

In another luminescent film of the present invention, the binder member contains the hydroxide oxide of yttrium, and 0.5% to 50% by weight relative to the binder member of hydroxide oxide of IIIA or IIIB group element other than the yttrium.

In another luminescent film of the present invention, the binder member contains 0.5% to 50% of boron oxide or boric acid by weight relative to the binder member.

In another luminescent film of the present invention, the binder member is a porous material with bridge structure, network structure or polymer structure which is formed of particle aggregation containing the hydroxide oxide.

Dehydration and cure of the binder member of the luminescent film are not completely performed until the state of oxide. Accordingly, the film is amorphous rather than the crystalline substance to improve binding force, and it is possible to form a luminescent film with excellent light-outgoing efficiency.

In another luminescent film of the present invention, the binder member is in a gel state which is filled with inorganic particles containing the hydroxide oxide.

In another luminescent film of the present invention, the light transmittance of the luminescent film is higher than the transmittance in a polycrystalline substance or amorphous substance in the case of sintering after sol-gel reaction.

In another luminescent film of the present invention, the binder member contains 10% or less of hydroxyl group or water of crystallization by weight relative to the binder member.

In another luminescent film of the present invention, the weight ratio between the filler member and the binder member which compose said luminescent film is 0.05 to 30 of filler/binder.

Furthermore, a light emitting apparatus according to the present invention comprises a light emitting element, and a luminescent layer, which absorbs a part of light from the light emitting element and emits luminescent radiation. In this light emitting apparatus, said luminescent layer is a luminescent film which coats said light emitting element includes a filler member containing at least a luminescent material and a binder member containing at least a hydroxide oxide of metallic element.

In another light emitting apparatus according to the present invention, the luminescent layer directly coats the light emitting element.

In another light emitting apparatus according to the present invention, the luminescent layer includes phosphor particles excited by the light of the light emitting element, and a binder member which binds the phosphor particles dispersed in the layer.

In another light emitting apparatus of the present invention, the light emitting apparatus comprises a semiconductor light emitting element with light-emission wavelength of 550 nm or less, and a phosphor which is excited by light of the wavelength and emits luminescent radiation.

In another light emitting apparatus of the present invention, the light emitting apparatus comprises a semiconductor light emitting element with light-emission wavelength of 410 nm or less, and a phosphor which is excited by light of the wavelength and emits luminescent radiation.

In another light emitting apparatus of the present invention, the luminescent layer emits luminescent radiation at temperature of 50° C. or more of the luminescent layer.

It is considered that the reason of deterioration of binder of luminescent layer is light, and interaction between them. In the light emitting apparatus of the aforementioned construction, the binder is not prone to deteriorate even in the case of high power driven visible light, ultraviolet light, or high-temperature driving. Accordingly, the light emitting apparatus is effective particularly to high-density excitation in these cases.

In another light emitting apparatus of the present invention, the luminescent layer of the light emitting apparatus is formed so as to be in intimate contact with the semiconductor light emitting element, and the injection electric power during drive of the semiconductor light emitting element is 0.1 W/cm$^2$ or more. The light emitting apparatus is effective particularly to high electric power application of 1 W/cm$^2$ or more.

In another light emitting apparatus of the present invention, the light-emission wavelength of the semiconductor light emitting element of the light emitting apparatus is 410 nm or less, and the luminance maintenance ratio of the luminescent layer is 80% or more after the semiconductor light emitting element is driven at injection electric power of 1 W/cm$^2$ or more for 1000-hour operation.

In another light emitting apparatus of the present invention, the phosphor contained in the filler of the luminescent layer of the light emitting apparatus includes at least one phosphor selected from the group consisting of blue luminescent phosphor, bluish green luminescent phosphor, green luminescent phosphor, yellowish green luminescent phosphor, yellow luminescent phosphor, yellowish red luminescent phosphor, orange luminescent phosphor, and red luminescent phosphor, and emits white group or neutral-color group luminescent radiation.

In another light emitting apparatus of the present invention, the phosphor contained in the filler of the luminescent layer is a rare-earth aluminate phosphor activated by at least Ce, and emits green to yellowish red luminescent radiation of peak wavelength 510 nm to 600 nm.

In another light emitting apparatus of the present invention, the phosphor contained in the filler of the luminescent layer of the light emitting apparatus is an alkaline-earth silicon-nitride phosphor activated by at least Eu, and emits yellowish red to red luminescent radiation of peak wavelength 580 nm to 650 nm.

In another light emitting apparatus of the present invention, the phosphor contained in the filler of the luminescent layer is an alkaline-earth silicon nitride oxide phosphor activated by at least Eu, and emits bluish green to yellowish red luminescent radiation of peak wavelength 500 nm to 600 nm.

In another light emitting apparatus of the present invention, the light emitting element is a semiconductor light emitting element which emits light with light-emission wavelength of 410 nm or less, and the phosphor contained in the filler of the luminescent layer contains at least one phosphor selected from the group consisting of alkaline-earth halogen apatite phosphor activated by at least Eu, alkaline-earth halogen boric-acid phosphor activated by at least Eu and alkaline-earth aluminate phosphor activated by at least Eu, which emit blue luminescent radiation, and is mixed with rare-earth aluminate phosphor activated by at least Ce, which emit green to yellowish red luminescent radiation to emit white group luminescent radiation.

In another light emitting apparatus of the present invention, the light emitting element is a semiconductor light emitting element which emits light with light-emission wavelength of 410 nm or less, and the phosphor contained in the filler of the luminescent layer contains at least one phosphor selected from the group consisting of alkaline-earth halogen apatite phosphor activated by at least Eu, alkaline-earth halogen boric-acid phosphor activated by at least Eu and alkaline-earth aluminate phosphor activated by at least Eu, which emit blue luminescent radiation, and is mixed with rare-earth aluminate phosphor activated by at least Ce, which emit green to yellowish red luminescent radiation, and alkaline-earth silicon-nitride phosphor activated by at least Eu, which emit yellowish red to red luminescent radiation to emit white group luminescent radiation.

In another light emitting apparatus of the present invention, the light emitting element is a semiconductor light emitting element which emits light with light-emission wavelength of 440 nm to 480 nm in the blue region, and the phosphor contained in the filler of the luminescent layer is mixed with a rare-earth aluminate phosphor activated by at least Ce to emit white group luminescent radiation.

In another light emitting apparatus of the present invention, the light emitting element is a semiconductor light emitting element which emits light with light-emission wavelength of 440 nm to 480 nm in the blue region, and the phosphor contained in the filler of the luminescent layer is mixed with a rare-earth aluminate phosphor activated by at least Ce, which emit green to yellowish red luminescent radiation, and an alkaline-earth silicon-nitride phosphor activated by at least Eu, which emit yellowish red to red luminescent radiation, to emit white group luminescent radiation.

Furthermore, a method for producing a luminescent film, which coats a light emitting element and includes at least a filler member containing a luminescent material and a binder member, comprises steps of preparing slurry by mixing metalloxane sol which contains a metallic element as a binder member and a filler member; forming the slurry in a film shape; and binding the filler member with the binder member composed of structure of aggregation particles, in which the particles containing the hydroxide oxide of the metallic element aggregate by thermally curing the slurry formed in a film shape.

In another method for producing a luminescent film of the present invention, the metalloxane sol is at least aluminoxane or yttrium-oxane sol.

Furthermore, a method for producing a light emitting apparatus of the present invention, including a light emitting element and a luminescent film, which coats at least a part of light emitting element and includes a filler member containing at least a luminescent material and a binder member, comprises steps of preparing slurry by mixing metalloxane sol which contains a metallic element as a binder member and a filler member; forming said slurry, which coats said light emitting element and/or an area spaced from the light emitting element under thermal treatment, in a film shape; and binding the filler member with the binder member composed of structure of aggregation particles, in which the particles containing the hydroxide oxide of said metallic element aggregate by thermally curing the slurry formed in a film shape.

According to the present invention, it is possible to provide a luminescent film, a light emitting apparatus, a method for producing a luminescent film, and a method for producing a light emitting apparatus, which have high light-outgoing efficiency. The reason is that a hydroxide oxide is employed for the luminescent film, thus, the transmittance of the luminescent film is kept in check at low even in a gel state, which does not reach the polycrystal state, to achieve high light-outgoing efficiency. In addition, according to the present invention, since a hydroxide oxide of metallic element with a constant ionic charge number is employed, it is possible to provide a luminescent film, a light emitting apparatus, a method for producing a luminescent film, and a method for producing a light emitting apparatus, in which color deterioration due to use is less prone to occur, with high durability and excellent reliability. In the present invention, metallic elements with high ionic charge number such as silica are not employed as a binder of phosphor, thus, oxygen omission does not occur. Therefore, it is possible to avoid color deterioration of binder layer. Accordingly, deterioration of the light output due to colored binder layer can be avoided, thus, it is possible to achieve stable performance for a long time. Therefore, it is possible to provide good reliability even if high-power light emitting element is used, and to achieve long life. Since it has thermal resistance, it is possible to provide a luminescent film, a light emitting apparatus, a method for producing a luminescent film, and a method for producing a light emitting apparatus, which have improved durability of phosphor and excellent reliability.

Furthermore, a light emitting apparatus of the present invention comprises a light emitting element, and a base member on which said light emitting element is mounted, wherein said light emitting element is coated with an inorganic binder, said inorganic binder is coated with resin, said inorganic binder is impregnated with said resin, and said inorganic binder is formed in an inorganic binder layer which coats at least parts of said light emitting element and said base member.

As for the inorganic binder, it is preferable that voids contained in the inorganic binder layer are filled with the resin.

As for said inorganic binder, it is preferable that substantially 95% or more of voids contained in said inorganic binder layer are filled with said resin.

It is preferable that in coating the inorganic binder with the resin, the inorganic binder is impregnated with the resin by potting means or spray means.

In addition, it is preferable that the inorganic binder contains a phosphor.

It is preferable that the resin is formed in a resin layer which coats at least a part of the inorganic binder.

It is preferable that the surface of the resin layer is smooth.

It is preferable that the resin contains at least any of oil, gel, and rubber.

It is preferable that the resin is silicone resin having a dialkylsiloxane skeleton before or after molding. The following chemical formula 1 shows the dialkylsiloxane skeleton R in the formula shows an alkyl group.

[Chemical Formula 1]

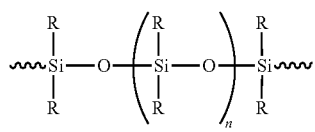

It is preferable that the resin has dimethylsiloxane as a principal chain before molding. Dimethylsiloxane is one mode of the dialkylsiloxane skeleton. The following chemical formula 2 shows dialkylsiloxane.

[Chemical Formula 2]

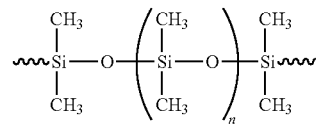

It is preferable that, in bonding absorbance intensity of infrared spectral spectrum, strength ratio of C—Si—O bonding relative to Si—O—Si bonding in the composition the resin is 1.2/1 or more.

A method for producing a light emitting apparatus of the present invention comprises a first step of mounting a light emitting element onto a base member; a second step of coating the light emitting element with an inorganic binder; and a second step of coating the light emitting element with an inorganic binder, wherein the inorganic binder is coated with the resin by potting means or spray means in the third step.

It is preferable that impregnation is performed in a vacuum in the third step.

A light emitting apparatus according to the present invention comprises a light emitting element, and a luminescent layer which absorbs a part of light from said light emitting element and emits luminescent radiation of different wavelength, wherein said luminescent layer includes phosphor particles excited by the light of said light emitting element, and a binder member which binds said phosphor particles dispersed in the layer and contains at least one element selected from the group consisting of Sc, Y, Gd, Lu, B, Al, Ga, and In.

The aforementioned construction of the present invention provides the effects as discussed below.

In the present invention, the light emitting apparatus of comprises a light emitting element, and a base member on which said light emitting element is mounted, wherein the light emitting element is coated with an inorganic binder, the inorganic binder is coated with resin, and in coating the inorganic binder with the resin, the inorganic binder is impregnated with the resin by potting means or spray means. Accordingly, even when high-power light emitting element or light emitting element which emits ultraviolet rays is used, acceleration of deterioration of the resin is kept in check. Therefore, it is possible to provide coating capable of enduring ultraviolet rays or the like for a long time. In addition, the inorganic binder which coats the light emitting element does not deteriorate, and the light-outgoing efficiency can be improved. Additionally, since the whole inorganic binder is impregnated with the resin, cracks and chips do not appear. Therefore, it is possible to form a coating with high shock resistance.

These effects are provided by the following operations.

When an inorganic binder is cured, portions where voids exist. Conventionally, these voids suppress that the light outgoes. In present invention, these voids are filled with the resin to improve light-outgoing efficiency.

Potting means or spray means is used as means for filling these voids with the resin. In the case of means other than potting means and spray means, for example, means for inject resin into the whole inorganic binder at a time, gas which comes out remains in the inorganic binder layer, or it gets into the resin, and thus is included therein. The gas which exists in the inorganic binder layer is confined in the layer, and the gas included in the layer expands due to heat generation of a light emitting element when a light emitting apparatus is driven. This may reduce the light-outgoing efficiency. On the other hand, in potting means and spray means, since the resin permeates while externally pushing the gas included in the void of the inorganic binder, little gas remains in the void of the inorganic binder, thus, the resin can nearly completely fill the void included in the inorganic binder. For this reason, even when the light emitting apparatus is driven, the reflection at the interface between the void and the inorganic binder layer can be kept in check, thus, the light-outgoing efficiency does nor reduce. The coating itself is stable.

A flexible organic group resin gets into the voids included in the inorganic binder, thus, it is possible to keep appearance of cracks by gas expansion due to heat.

As for the inorganic binder, it is preferable that the inorganic binder layer which coats at least parts of light emitting element and base member is formed. The reason is that impregnation of voids included in the inorganic binder with resin can be easy in construction of layer-structure. In addition, the reason is that the light from the light emitting element can be substantially uniformly and externally radiated considering that light outgoes.

As for the inorganic binder, it is preferable that voids contained in the inorganic binder layer are filled with the resin. This can eliminate voids in the inorganic binder, thus, the light-outgoing efficiency can be improved. Accordingly, only the amount of resin necessary for filling the voids of the inorganic binder layer is used.

As for said inorganic binder, it is preferable that substantially 95% or more of voids contained in said inorganic binder layer are filled with said resin. The reason is that, when only a part of the voids included in the inorganic binder layer is filled with resin, this suppresses that light outgoes. In the case where the inorganic binder layer is spaced from the light emitting element, the heat from the light emitting element is not directly conveyed. Accordingly, it is not necessary to particularly take deterioration due to heat into consideration. Therefore, it is not necessary to fill the voids with resin. However, since it is necessary to take the light from the light emitting element into consideration, it is preferable that the voids are nearly completely filled with the resin.

It is preferable that the inorganic binder contains a phosphor. This can provide a light emitting apparatus with a desired color tone. In the light emitting apparatus, the phosphor absorbs a part of the light from the light emitting element, and converts its wavelength to emit luminescent radiation of the wavelength different from the light of the light emitting element. The light emitting apparatus mixes the part of the light from the light emitting element with a part of light from the phosphor. In addition, the inorganic binder layer containing a phosphor provide easy color tone adjustment. Therefore, it is possible to provide a light emitting apparatus, which can emits uniform light, with high yield.

It is preferable that the resin is formed in a resin layer which coats at least a part of inorganic binder. It has layer-structure, thus, a coating with uniform thickness is formed. Therefore, the light-outgoing efficiency can be improved.

It is preferable that the surface of the resin layer is smooth. When an inorganic binder is cured, asperities exist on its surface. For this reason, when the light emitted from the light emitting element passes through the inorganic binder, and is radiated externally thereof, light directivity varies due to this asperity part. On the other hand, when an inorganic binder is impregnated with resin, the surface of coating become smooth, thus, it is possible to reduce the variation of light directivity.

It is preferable that the resin contains at least any of oil, gel, and rubber. The reason is to impregnate the inorganic binder with resin. Particularly, when the inorganic binder is impregnated by using resin in an oil state, and becomes gel by heating and so on, it is possible to provide a light emitting apparatus with high light-outgoing efficiency. In addition, in the mode where it is in the gel or rubber state, it is possible to easily control the hardness of resin. As for a wire which electrically connects an electrode provided on the light emitting element to an external terminal, the wire is not cut even if the resin is cured. In the case where epoxy resin is cured in a conventional manner, a wire is cut due to the difference between the coefficients of thermal expansion of the wire and the epoxy resin. According to the present invention, since the resin is in the oil, gel or rubber state, the wire is not cut. In the case of only inorganic binder, it has low shock resistance. However, when it is filled with resin in the rubber state, and so on, the coating will have flexibility. Therefore, it is possible to form a coating with high shock resistance.

It is preferable that the resin is silicone resin having a dialkylsiloxane skeleton before or after molding. Using this resin can further keep deterioration of resin in check, and can provide a light emitting apparatus using the coating capable of enduring ultraviolet rays or the like for a long time.

It is preferable that the resin has dimethylsiloxane as a principal chain before molding. This can keep deterioration of resin in check, and can provide a light emitting apparatus using the coating capable of enduring ultraviolet rays or the like for a long time.

It is preferable that, in bonding absorbance intensity of infrared spectral spectrum, strength ratio of C—Si—O bonding relative to Si—O—Si bonding in the composition of the resin is 1.2/1 or more. Setting the above range hold the resin in the oil, gel or rubber state, stress is released. Therefore, it is possible to provide coating in which cracks and chips are less prone to appear.

A method for producing of the light emitting apparatus of the present invention comprises a first step of mounting a light emitting element onto a base member; a second step of coating the light emitting element with an inorganic binder; and a third step of coating the inorganic binder with resin, wherein the inorganic binder is coated with the resin by potting means or spray means in the third step. Voids included in the inorganic binder can be filled with resin by means of potting means or spray means. In addition, it is possible to prevent gas existing in the voids gets into the resin. Additionally, it is possible to uniformly apply the resin for coating the binder without variation. Particularly, gel of hydroxide oxide, the ionic charge number of which does not vary in the sol-gel reaction process, with stable oxidation state such as Al and Y element is employed, thus, it is possible to improve light-outgoing efficiency.

Impregnation can be performed in a vacuum in the third step. This can provide easy impregnation of voids of the inorganic binder layer with the resin. Although this reason is not clear, it is considered that a capillary phenomenon provides this effect. The "gel" refers to a colloidal system consisting of a solid and a liquid in more solid form than a sol.

BEST MODE FOR CARRYING OUT THE INVENTION

The following description will describe embodiments according to the present invention with reference to the drawings. It should be appreciated, however, that the embodiments described below are illustrations of a luminescent film and a light emitting apparatus, and a method for producing of a luminescent film and a light emitting apparatus to give a concrete form to technical ideas of the invention, and a luminescent film and a light emitting apparatus, and a method for producing of a luminescent film and a light emitting apparatus of the invention are not specifically limited to description below. Furthermore, it should be appreciated that the members shown in claims attached hereto are not specifically limited to members in the embodiments. Additionally, the sizes and the arrangement relationships of the members in each of drawings are occasionally shown larger exaggeratingly for ease of explanation. In addition, each element composing the present invention may be configured as a single member which is composed of the same member as a plurality of elements to serve the purpose of the plurality of element.

Figure 1:
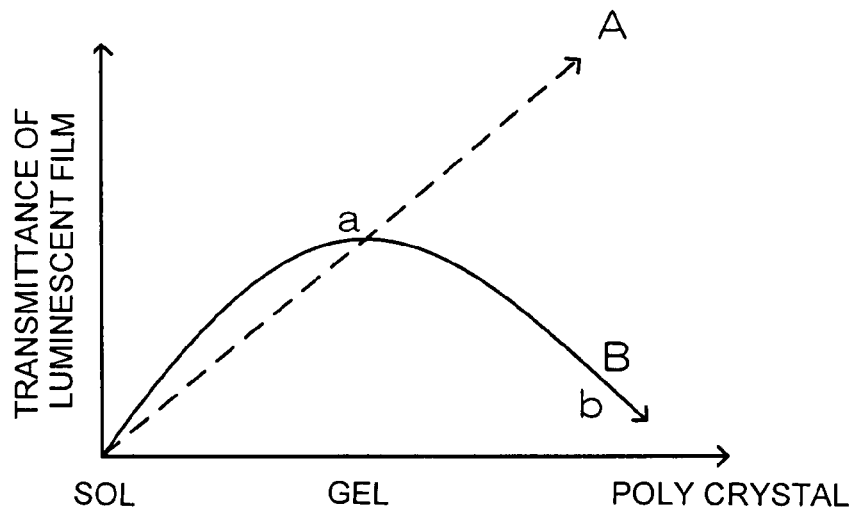
FIG. 1 is a graph showing the proceeding of sol-gel reaction, and the variation of transmittance of luminescent film.

In this embodiment of the present invention, gel of hydroxide oxide is employed as a binder. FIG. 1 is a graph showing variation of transmittance of luminescent film and variation of light-outgoing efficiency due to the proceeding of sol-gel reaction from the sol state to an amorphous or polycrystal oxide through gel or a hydroxide oxide containing water of crystallization. In the case where gel is used as a binder, as the gel becomes closer to the polycrystal structure by the proceeding of sol-gel reaction as shown in FIG. 1, it is generally considered that the transmittance of the light emitting film is improved as shown A in the Figure. However, considerable energy is required to obtain a polycrystal by the sol-gel reaction. Considerable high temperature is required to separate a hydroxyl group or an organic group included in the structure of a gel state. Accordingly, the separation is not easy.

The inventors of the present invention have diligently studied, and as a result found that light-outgoing efficiency could be obtained even in a gel state without improvement of the crystallinity in the case of particular metallic elements. Thus, we have developed the present invention. We have found the light-outgoing efficiency in a gel state is tend to be higher than the light-outgoing efficiency in the polycrystal state where the sol-gel reaction is proceeded, particularly, in the case where hydroxide oxides, the ionic charge number of which does not vary in the sol-gel reaction process, with stable oxidation state such as Al and Y elements are used, as shown by B in FIG. 1. For example, in an amorphous substance such as yttria, it is considered that one reason is dispersion of light. That is, in the crystallization process from a to b where a multi-layer is formed at the crystallization stage by high-temperature heating in terms of chemical structure, it is considered that multi-phase structure is formed. In the structure, microscopically, phase separation of a partially-crystallized part and a gel-state part occurs. Accordingly, microscopically, the phases are uniform, and light is scattered at the interface between the phases, thus, the whole transmittance reduces. It is considered that another reason is the crystal structure. That is, in the state from a to b, due to coexistence of the crystalline region and the amorphous region caused by formation of spherulite or the like, the densities and refractive indices in regions are different. Even if microscopically it is uniform, optically the multi-layer structure is formed, thus, the whole transmittance reduces. Accordingly, even when the luminescent film is formed in a gel state without achievement of polycrystal, it is possible to easily obtain luminescent film with high light-outgoing efficiency for a short time at low energy without proceeding of the sol-gel reaction.

In addition, in a gel state where a hydroxyl group or water of crystallization is contained in the hydroxide oxide, it is assumed that the light-outgoing efficiency also varies with these contents. The inventors of the present invention repeatedly performed experiments, and as a result found to confirm higher light-outgoing efficiency when the content of hydroxyl group or water of crystallization was 10% or less by weight relative to hydroxide oxide. Thus, in a gel state containing water of crystallization, a fine film can be obtained. Accordingly, in this case, light outgoes efficiently rather than the case where it is crystallized by complete cure. The reason is assumed that, in a gel state, a hydroxide oxide has bridge structure containing a partial oxide and thus improves the binding characteristics between a phosphor and an element.

In addition, a binder member is composed of gel of hydroxide oxide, thus, it is possible to improve the quality of formed luminescent film or luminescent layer. As for the binder member containing a hydroxide oxide, particles aggregate by the sol-gel process, thus, the binder member becomes a porous material with bridge structure, network structure or polymer structure. When the skeleton structure of the particle aggregation of hydroxide oxide is the network structure, the binder member becomes have porous structure. Accordingly, the flexibility of luminescent film is improved. Additionally, in the formation of film of luminescent layer, the binder member binds a filler member such as phosphor particles. Even if the object to be coated has a complicated shape, the film can be formed corresponding to the shape. Therefore, it is possible to provide luminescent film with high bonding characteristics. Furthermore, since the binder member contains hydroxide oxide, it is possible to provide a film which is stable and does not deteriorates due to heat or light.

Formed luminescent films deteriorate due to exposure to light from light emitting elements in use of light emitting apparatuses. The reason of this deterioration is assumed that reaction occurs due to the light output or heat generation from the light emitting elements, or both of them. Accordingly, the deterioration tends to occur when ultraviolet rays with high light energy are used for a large element with high heat generation and thermal resistance value. As discussed later, as a result of the endurance test of examples of the present invention which were produced, we found that they have very high resistance. Although the reason is not clear, it is assumed that a hydroxide oxide with constant ionic charge number has structure which is less prone to vary due to oxidation-reduction reaction due to heat or light energy. For this reason, it is preferable to use a metallic element the ionic charge number of which does vary as the hydroxide oxide. For example, when Si, which can have a plurality of ionic states, or the like is used as gel or a cure layer, its ionic number easily varies due to light density or heat conduction caused by heat generation of the element. It is considered that this causes color deterioration. On the other hand, the luminescent layer with trivalent hydroxide oxide obtained by this embodiment of the present invention as the binder cannot is less prone to vary due to oxidation-reduction reaction. For this reason, even in the case where the film is located to be in contact with or close to a high-power semiconductor light emitting element with light irradiation density of not less than 0.1 W/cm$^2$ and not more than 1000 W/cm$^2$, it is possible to provide a light emitting apparatus with sufficient resistance.

(Binder)

Silica ($SiO_2$) has been used as a binder binding a phosphor in the case of high temperature or ultraviolet-ray excitation. When the silica binder is used for a long time, a phosphor member 11 with mixture of a phosphor 11a, which converts light emission of a light emitting element 10, and a transparent material 11b gradually darkens. The inventors of the present invention studied the cause of color deterioration, and as a result found that the reason was assumed that oxygen omission occurred in the silica binder layer and thus produced $SiO_x$ (x<2).

Under heat-curing temperature of 250° C., the silica binder is in a silica gel state where hydroxyl group and organic group partly remain in the $SiO_2$ skeleton. When light with high density is incident from LED in a silica gel state, oxygen omission occurs due to light or heat energy, thus, $SiO_2$ produces $SiO_x$ (x<2: where x is about 1.4 to 1.9). Since this SiOx is colored, it is considered that the binder darkens. Accordingly, the metallic element Si consisting principally of silica gel can have various ionic charge numbers, it is considered that the ionic charge number of Si varies and undergoes oxidation-reduction, thus, the color deterioration occurs. For this reason, in this embodiment, a binder containing a hydroxide oxide or oxide of metallic element, the ionic charge number of which does not vary, is used. Hereafter, examples employing alumina and yttria is described.

(Alumina)

In the case where alumina sol consisting of amorphous alumina or very small particles of aluminum hydroxide oxide uniformly dispersed in water is used as a binder, it changes into pseudoboehmite structure until aluminum hydroxide oxide of stable boehmite structure is formed by heating and curing the alumina sol. The boehmite crystal structure of aluminum hydroxide oxide can be represented by chemical formulas such as AlOOH, $Al_2O_3.H_2O$, and so on, while the pseudoboehmite structure of the aluminum hydroxide oxide can be represented by chemical formulas such as (AlOOH).$xH_2O$, $Al_2O_3.2H_2O$, and so on. Specifically, an intermediate has forms of $Al_2O_3.2H_2O$, $Al_2O_3.xCH_3COOH.yH_2O$, $Al_2O_3.xCl.yH_2O$, $Al_2O_3.xHNO_3.yH_2O$, and so on, and the stable boehmite structure is formed. The crystallinity of boehmite structure further increases, thus, γ-alumina ($Al_2O_3$) or β-alumina ($Al_2O_3$) is formed. A luminescent film is formed by employing alumina sol with such characteristics as a binder.

Specifically, main materials for the luminescent film included in sol solution to be used are shown as follows. In the sol solution, an amorphous metal oxide, ultrafine particles of metal hydroxide oxide, ultrafine particles of oxide, and so on, are uniformly dispersed with small amount of inorganic acid, organic acid, and alkali as stabilizers in water or organic solvent. Metal alcoholate, metal diketonate, metal halide, hydrolysate from metal carboxylate or metal alkyl compound, or hydrolysate from mixture of them can be employed as original materials of amorphous metal oxide, ultrafine particles of metal hydroxide oxide, ultrafine particles of oxide, and so on. In addition, colloid (sol) solution, in which metal hydroxide, metal chloride, metal nitrate, or very small particles of metal oxide is uniformly dispersed in water, organic solvent, or mixed solvent of water and water-soluble organic solvent, can also be used. These are generically called as aluminoxane. Aluminoxane is a skeleton containing a repeat of $[AlO]_x$.

Aluminum methoxide, aluminum ethoxide, aluminum-n-propoxide, aluminium isopropoxide, aluminum-n-butoxide, aluminum-sec-butoxide, aluminum-iso-propoxide, aluminum-tert-butoxide, yttrium methoxide, yttrium ethoxide, yttrium-n-propoxide, yttrium iso propoxide, yttrium-n-butoxide, yttrium-sec-butoxide, yttrium-iso-propoxide, yttrium-tert-butoxide, and so on, can be employed as metal alcoholate.

Aluminum tris-ethyl-acetacetate, alkyl acetacetate aluminum isopropylate, ethyl acetacetate aluminum isopropylate, aluminum monoacetyl acetnate-bis-ethyl acetacetate, aluminum tris-acetyl acetnate, yttrium tris-acetyl acetnate, yttrium tris-ethyl-acetacetate, and so on, can be employed as metal diketonate.

Aluminum acetate, propionic-acid aluminum, 2-ethylhexanoic acid aluminum, acetic-acid yttrium, propionic-acid yttrium, 2-ethyl hexanoic-acid yttrium, and so on, can be employed as metal carboxylate.

Aluminum chloride, ammonium bromide, aluminum iodide, yttrium chloride, yttrium bromide, yttrium iodide, and so on, can be employed as metal halide.

Methanol, ethanol, n-propanol, iso-propanol, n-butanol, sec-butanol, tert-butanol, tetrahydrofuran, dioxane, acetone, ethylene glycol, methyl ethyl ketone, N.N dimethylformamide, N,N dimethylacetamide, and so on, can be employed as organic solvent.

A phosphor and diffusion particles as a filler can be additionally mixed with them in use as a binder forming a luminescent layer. In addition, they may be mixed to form a mixed material to adjust its coefficient of linear expansion to an application substrate or a light emitting element. As for the filler, needless to say, mixture of phosphor provides luminescent radiation, but it also serves to form a path for moisture evaporation in cure, and thus provide an effect that accelerate curing and drying of binder. In addition, the filler serves to scatter luminescent radiation of phosphor, and to increase the adhesion strength and physical strength of luminescent layer. The luminescent layer or luminescent film can be used as a diffusion layer which does not contain a phosphor. In the case of mixture to be used as a binder, a small amount of element with a plurality of ionic charge numbers other than a trivalent metallic element may be included. In this embodiment, the binder is only required to contain a hydroxide oxide as principle compound, and provides operation even when partially containing a metal oxide, a metal hydroxide, or combination of them.

(Filler)

The filler is a filler material. Barium titanate, titanium oxide, aluminum oxide (alumina), yttrium oxide (yttria), silicon dioxide, calcium carbonate, hydroxide oxide, and so on, can be employed as a filler. For example, a filler having the thermal conductivity higher than a colorless hydroxide oxide containing at least one element selected from the group consisting of Al, Ga, Ti, Ge, P, B, Zr, Y, and alkaline earth metal, or an oxide containing at least one element selected from the group consisting of Si, Al, Ga, Ti, Ge, P, B, Zr, Y, and alkaline earth metal may be included. Addition of this type of filler improves the heat diffusion effect of light emitting apparatus. Metal powders, such as alumina, Ag, and so on can be given as this type of filler in the case of die-bonding of LED chip onto an adhesion layer formed of the aforementioned inorganic binder.

In addition to the phosphor and lower alcohol, dispersing agent is mixed with sol of the binder, thus, it is possible to form fine coating at low temperature by azeotropic dehydration with the lower alcohol in curing. In addition, a light stabilizing material, a coloring agent, an ultraviolet absorption agent, and so on, may be included.

A boron oxide or boric acid may be added in formation of the luminescent film. Since addition of boron oxide or boric acid reduces the elasticity of luminescent film, the quality of film is improved. For example, appearance of cracks is kept in check, thus, it is possible to form a fine film. Boric acid or a boron oxide is preferably included 0.5% to 50% by weight relative to the binder member. A thickener other than boric acid and a boron oxide can also be added to the luminescent film. As discussed above, an additive used for viscosity control of slurry may be included other than a hydroxide oxide of aluminum or the like as a binder member. Thus, viscosity control and thixotropy characteristics are improved in formation of film. Accordingly, it is possible to form a film with a complicated shape. In addition, after formation of film, the binder of hydroxide oxide improves admissibility of additive, and allows the additive to serve for structure control of binder structure.

The luminescent layer is formed from slurry solution. The slurry solution is prepared by mixing the phosphor and the filler with the sol solution. The sol solution contains an amorphous metal hydroxide oxide, very small particles of metal hydroxide oxide or metal hydroxide as a principal component, and an amorphous metal oxide or very small particles of metal oxide, which are uniformly dispersed in water. It is preferable that weight ratio between the effective solid component and the phosphor in the sol solution, or the weight ratio between the effective solid component and the mixture of the phosphor and filler in the sol solution is 0.05 to 30. For example, the adjustment ranges between the ratio of 90 g of phosphor to 20 g of sol solution with effective solid component concentration of 15%, and the ration of 4.5 g of phosphor to 600 g of sol solution with effective solid component concentration of 15%.

(Yttria)

When yttria sol, in which amorphous yttria or very small particles of yttria is uniformly dispersed in water, is used as the binder, even when the yttria sol is heated and cured, the principle component of crystal structure is amorphous. An oxidation hydroxylation yttrium can be represented by the chemical formula $YOOH.xH_2O$, while an yttrium oxide can be represented by the chemical formula $Y_2O_3.xH_2O$, or the like. Specifically, an yttrium hydroxide oxide or an yttrium oxide is partly included through the process in the form of $YOOH.xCH_3COOH.yH_2O$, or $Y_2O_3.xCH_3COOH.xH_2O$ as an intermediate. Yttria forms a stable film even in this gel state. The reason is assumed that each component has bridge structure and thus is stable.

Yttria has characteristics that is less prone to form crystal structure as compared with alumina. Although Yttria has amorphous structure without crystallinity, it is a stable compound, and the ionic charge number of Y does not vary from the trivalent state. That is, oxidation-reduction reaction is prone to occur, thus, it has a feature that color deterioration does not occur.

As for the rest, the luminescent layer is formed similar to the aforementioned alumina. A commercially available inorganic group adhesive agent, ceramic binder, and so on, can be also employed as the sol used as a binder for a phosphor as mentioned above. In addition, materials which can be used as a binder is not limited to hydroxide oxides containing Al or Y element such as alumina and yttria, but a hydroxide oxide, oxide, hydroxide of other IIIA group elements or IIIB group elements, and so on, can be employed. It is preferable to select metallic elements the ionic charge numbers of which do not vary. Particularly, stable trivalent metallic elements are preferable. Additionally, it is preferable that they are colorlessness or transparent. For example, metallic compounds containing metallic elements, such as Gd, Lu, Sc, Ga, and In, in addition to Al or Y, can be employed, preferably, Sc and Lu can be employed. Alternatively, a mixed oxide or mixed hydroxide oxide, which mixes two or more of these elements, may be employed. It contains not only aluminum or yttrium but also hydroxide oxide, and so on, of other III group elements, thus, it is possible to adjust various characteristics such as optical functions including the refractive index of luminescent film or the like, and film quality including flexibility, bonding property of film or the like, to desired values. The luminescent layer formed from the inorganic binder containing gel of hydroxide oxide, the ionic charge number of which is constant, preferably trivalent, obtained as mentioned above in this embodiment of the present invention can be a stable luminescent layer with good light-outgoing efficiency. Additionally, it is composed of inorganic materials, and thus can be a stable luminescent layer or luminescent film with less variation from aging.

First Embodiment

Figure 2:
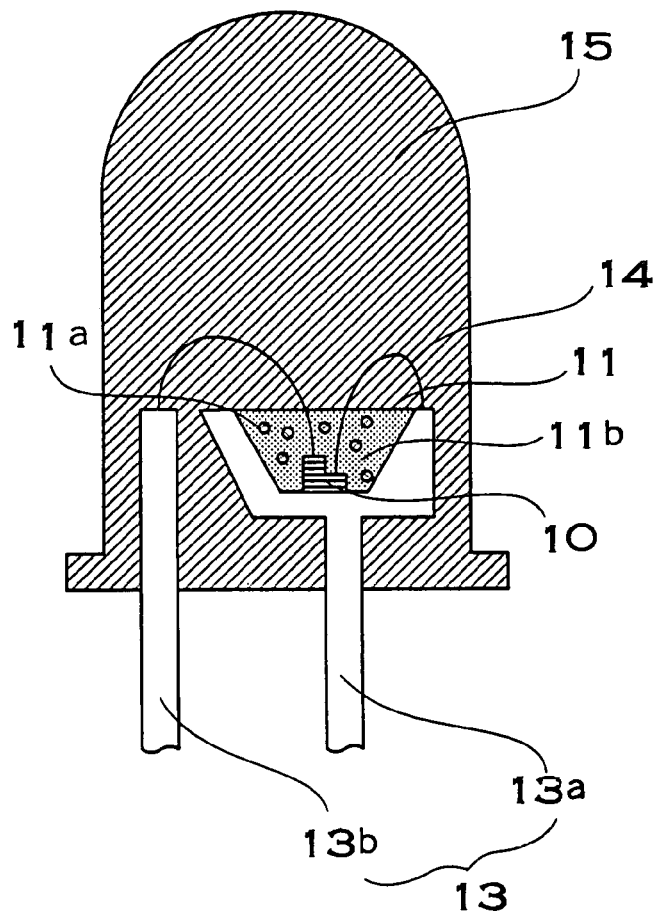
FIG. 2 is a schematic view showing a light emitting apparatus according to a first embodiment of the present invention.

With reference to FIG. 2, a light emitting apparatus according to a first embodiment of the present invention is now described. The light emitting apparatus of first embodiment includes a light emitting element 10, the phosphor 11a, and the phosphor member 11 composed of the transparent binder 11b containing the phosphor 11a.

The light emitting element 10 composed of a bullet-shaped LED, for example, is mounted in a substantially central part of a cup disposed on the upper part of a mount lead 13a by die-bonding. The electrodes formed in the light emitting element 10 are electrically connected to the mount lead 13a and an inner lead 13b of a lead frame 13 with conductive wires 14. The Phosphor 11a contains a YAG group phosphor and a nitride group phosphor which absorb at least a part of light emitted light in the light emitting element 10 and emit luminescent radiation of wavelength different from the absorbed light. In addition, the nitride group phosphor can be coated with a coating material, such as microcapsule. The phosphor member 11 containing this phosphor 11a in the binder 11b is provided in the cup on which the light emitting element 10 is mounted. As mentioned above, in order to protect the LED chip and the phosphor from external stress, moisture, dust, and so on, and to improve the light-outgoing efficiency, the lead frame 13 in which the light emitting element 10 and the phosphor member 11 are provided is molded with a mold member 15, thus, the light emitting apparatus is formed. After the luminescent layer containing the binder composed of a hydroxide oxide is formed as discussed above, a lens, or the like, may be formed by a mold composed of resin.

(Light Emitting Element)

In this specification, light emitting elements include semiconductor light emitting elements, and elements for emitting light by vacuum discharge or calorescence. For example, ultraviolet rays by vacuum discharge or the like can be used as a light emitting element. In this embodiment of the present invention, a light emitting element with wavelength 550 nm or less, preferably 460 nm or less, and more preferably 410 nm or less is used. For example, an ultraviolet light LED which emits light with wavelength of 250 nm to 365 nm as ultraviolet light, or a high-pressure mercury lamp with wavelength of 253.7 nm can be used. Particularly, as discussed later, in this embodiment, since the durability is high, there is the advantage that a high-power light emitting element can be used.

A group III nitride semiconductor light emitting element is described as the light emitting element 10. For example, the light emitting element 10 has a laminated structure formed above the sapphire substrate so as to interpose a GaN buffer layer between them. In the laminated structure, a first n-type GaN layer, an n-type contact layer, a second GaN layer, a light emitting layer, a p-cladding layer, and a p-type contact layer are successively laminated. The first n-type GaN layer is undoped, or has a low concentration of Si. The n-type contact layer is formed of n-type GaN doped with Si, or n-type GaN which has a Si concentration higher than the first n-type GaN layer. The second GaN layer is undoped, or has a Si concentration lower than the n-type contact layer. The light emitting layer has a multi-quantum-well structure (quantum-well structure with sets of GaN barrier layer/InGaN well layer). The p-cladding layer is formed of p-type GaN doped with Mg. The p-type contact layer is formed of p-type GaN doped with Mg. Electrodes are formed as follows. It needless to say that a light emitting element different from this construction can be used.

A p-ohmic electrode is formed on the substantially whole surface of the p-type contact layer. A p-pad electrode is formed on a part of the p-ohmic electrode.

A part of n-type contact layer is exposed by removing the first GaN layer from the p-type contact layer by etching. An n-electrode is formed on the exposed part.

Although the light emitting layer of multi-quantum-well structure is used in this embodiment, the present invention is not limited to this construction. For example, a single-quantum-well structure or multi-quantum-well structure with InGaN may be used. In addition, GaN doped with Si, or Zn may be used.

Varying content of In can vary the main peak wavelength of light emission by the light emitting layer of the light emitting element 10 within a range between 420 and 490 nm. The wavelength of light emission is not limited to the above range, but a light emitting layer with wavelength between 360 nm and 550 nm can be used. Particularly, when the light emitting apparatus according to the embodiment of the present invention is applied to an ultraviolet LED light emitting apparatus, the absorption-and-conversion efficiency of excitation light can be improved. Accordingly, it is possible to reduce penetrating ultraviolet light.

(Phosphor)

The phosphor converts visible light or ultraviolet light, which is emitted from the light emitting element, into light with different wavelength. For example, it is excited by the light emitted from the semiconductor light emitting layer in the LED, and emits luminescent radiation. Phosphors of YAG group phosphor, nitride group phosphor such as alkaline-earth silicon-nitride phosphor, and oxynitride group phosphor such as alkaline-earth silicon oxynitride phosphor can be used as a preferable phosphor. In this embodiment, a phosphor, which is excited by ultraviolet light and emits light of a desired color, is used as the phosphor. Specifically, the following substance can be used.

(1) $Ca_{10}(PO_4)_6FCl:Sb, Mn$
(2) $M_5(PO_4)_3Cl:Eu$ (where M is at least one element selected from the group consisting of Sr, Ca, Ba, and Mg)
(3) $BaMg_2Al_{16}O_{27}:Eu$
(4) $BaMg_2Al_{16}O_{27}:Eu, Mn$
(5) $3.5MgO.0.5MgF_2.GeO_2:Mn$
(6) $Y_2O_2S:Eu$
(7) $Mg_6As_2O_{11}:Mn$
(8) $Sr_4Al_{14}O_{25}:Eu$
(9) $(Zn, Cd)S:Cu$
(10) $SrAl_2O_4:Eu$
(11) $Ca_{10}(PO_4)_6ClBr:Mn, Eu$
(12) $Zn_2GeO_4:Mn$
(13) $Gd_2O_2S:Eu$
(14) $La_2O_2S:Eu$
(15) $Ca_2Si_5N_8:Eu$
(16) $Sr_2Si_5N_8:Eu$
(17) $SrSi_2O_2N_2:Eu$
(18) $BaSi_2O_2N_2:Eu$ Needless to say, a YAG group phosphor which is a rare-earth aluminate phosphor represented by $(Y, Gd)_3(Al, Ga)_5O_{12}:Ce$ emits luminescent radiation of the yellow region can be used additionally to the above substance.

When the light emitted by the LED chip and the light of luminescent radiation emitted by the phosphor have a complementary color relationship, mixing them can provide white light emission. Specifically, for example, three primary colors (red group, green group, and blue group) of light are given by light from an LED chip and light emitted by the phosphors excited by the LED, or the combination between blue light emitted from an LED chip and yellow light emitted by the phosphor which is excited by the LED. Particularly, in the case where ultraviolet light is used, luminescent color of the phosphor excited by the ultraviolet light can be used alone. Accordingly, it is possible to provide a light emitting apparatus with various neutral colors, such as bluish green, yellowish red, red, and so on, for signal light, and pastel color.

Arbitrary white group color tone, such as electric bulb color, can be provided as the light-emission color of light emitting apparatus by adjusting the ratio among the phosphor, the inorganic binder member, such as various kinds of resin and glass, which serves as a binding agent, the filler, etc., the sedimentation time of phosphor, the shape of phosphor, or the like, or by selecting the light-emission wavelength of the LED chip. It is preferable that light from the LED chip and light from the phosphor efficiently pass through the mold member outwardly of the light emitting apparatus.

Zinc cadmium sulfide activated by copper, and a YAG group phosphor cerium activated can be given as typical phosphors. Particularly, in use for high luminance and for a long time, it is preferable that $(Re_{1-x}Sm_x)_3(Al_{1-y}Ga_y)_5O_{12}$:Ce (where, $0 \leq x \leq 1$, $0 \leq y \leq 1$, and Re is at least one element selected from the group consisting of Y, Gd, La, and Lu), or the like, is employed.

Since the phosphor of $(Re_{1-x}Sm_x)_3(Al_{1-y}Ga_y)_5O_{12}$:Ce has garnet structure, it has heat, light, and moisture resistance, and its peak of excitation spectrum can be near 470 nm. In addition, the light emission peak is near 530 nm, and it is possible to provide broad emission spectrum with foot extending to 720 nm.

In the light emitting apparatus according to this embodiment of the present invention, as for the phosphor, two or more kinds of phosphors may be mixed. That is, the wavelength components of RGB can be increased by mixing two or more kinds of phosphors of $(Re_{1-x}Sm_x)_3(Al_{1-y}Ga_y)_5O_{12}$:Ce with different Al, Ga, Y, La, Lu and Gd, or different content of Sm. In addition, the reddish component can be increased by using a nitride phosphor with yellow to red light emission, thus, it is possible to provide lighting with high general color rendering index Ra, or an LED with electric bulb color. Specifically, adjusting the amount of phosphor with a different chromaticity point on the chromaticity diagram of CIE depending on the light-emission wavelength of light emitting element can provide light emission of arbitrary point on the chromaticity diagram on the line connected between the phosphor and the light emitting element.

This type of phosphor can be dispersed and uniformly released in the vapor phase or the liquid phase. The phosphor in of the vapor phase or the liquid phase sediments by its weight. Particularly, in the liquid phase, when the suspension is set aside calmly, it is possible to form a film more uniformly containing a phosphor. A plurality of repeats can provide a desired amount of phosphor if necessary.

As for the phosphor formed as mentioned above, a luminescent layer consisting of one layer on the surface of light emitting device may includes two or more kinds of the phosphors, or a luminescent layer consisting of two layers may include one or two kind(s) in each layer. Thus, white light can be obtained by color mixture of the light from different phosphors. In this case, in order to provide more preferable color mixture of light emitted from each phosphor, and to reduce color unevenness, it is preferable that the respective average particle sizes and shapes of phosphors are similar. In addition, the luminescent layer can be formed in consideration of the sedimentation characteristics depending on the shape. A spray process, a screen printing process, a potting process, and so on, can be given as a formation process of a luminescent layer which is less prone to have the influenced of sedimentation characteristics. In this embodiment, the inorganic binder has the effective solid component of 1% to 80%, and the viscosity can be adjusted in a wide range of 1 cps to 5000 cps, and additionally, the thixotropy characteristics can be adjusted. Accordingly, the inorganic binder is available for these formation processes of a luminescent layer. As mentioned above, it is preferable that the weight ratio between the filler and the inorganic binder is in the range 0.05 to 30. In addition, adjustment of the amounts of combination, and the particle size of filler can increase the binding force.

The combination of a YAG group phosphor and a phosphor capable of emitting luminescent radiation of red group light, particularly, a nitride phosphor, such as an alkaline-earth silicon-nitride phosphor, can be used as the phosphor used in this embodiment. These YAG group phosphor and phosphor can be mixed and included in the luminescent layer, or may be separately included in a plurality of layers which compose the luminescent layer. Hereinafter, each phosphor is described.

(YAG Group Phosphor)

The YAG group phosphor used in this embodiment is a phosphor, which contains Y and Al, at least one element selected from the group consisting of Lu, Sc, La, Gd, Tb, Eu, and Sm, and least one element selected from the group consisting of Ga and In, and is activated by a rare earth element, such as cerium or Pr, and emits luminescent radiation due to excitation by visible light or ultraviolet rays emitted from an LED chip. Particularly, in this embodiment, two or more kinds of yttrium aluminum oxide group phosphors with different compositions activated by cerium or Pr can be also used. When blue group light emitted from the light emitting element using a nitride group compound semiconductor as a light emitting layer is mixed with green group light and red group light emitted from a phosphor with yellow body color for absorption of the blue light, or yellow group light, which is closer to green group light and red group light, it is possible to provide desired white group light-emission color display. In the light emitting apparatus, in order to provide this color mixture, particles or bulk of the phosphor may be included in various resins, such as epoxy resin, acrylic resin and silicone resin, or transparent inorganic substance such as an inorganic binder according to this embodiment. The resin or the substance including the phosphor can be formed in a dot shape or a film shape to be thin to the extent that light from the LED chip passes depending on various applications. Arbitrary color tone such as electric bulb color including white can be provided by adjusting the ratio between the phosphor and the transparent inorganic substance, or by selecting the light-emission wavelength of light emitting element.

In addition, when two or more kinds of phosphors are disposed in a certain order in the direction of light incident from the light emitting element, it is possible to provide light emitting apparatus capable of efficiently emitting light. That is, for example, when layers are laminated on the light emitting element with a reflective member, it is possible to effectively use the reflected light; one layer is a color converting member containing a phosphor capable of absorbing light in long wavelength side and emitting light with long wavelength, i.e., a luminescent layer containing a phosphor as a filler, and other layer is a color converting member capable of absorbing light in wavelength side longer than that and emitting light with longer wavelength.

In use of a YAG phosphor, even in the case where the phosphor is located to be in contact with or close to an LED chip with light irradiation density (Ee)=not less than 0.1 $W \cdot cm^{-2}$ and not more than 1000 $W \cdot cm^{-2}$, it is possible to provide a light emitting apparatus with effective and sufficient resistance.

Since a YAG group phosphor, which is an yttrium aluminum oxide group phosphor activated by cerium and can emit luminescent radiation of green group light, used in this embodiment, has garnet structure, it has heat, light, and moisture resistance, and its peak of excitation spectrum can be near 420 nm to 470 nm. In addition, the light emission peak wavelength $\lambda p$ is near 510 nm, and provides broad emission spectrum with foot extending to near 700 nm. On the other hand, since a YAG group phosphor, which is an yttrium aluminum oxide group phosphor activated by cerium and can emit luminescent radiation of red group light, used in this embodiment, also has garnet structure, it has heat, light, and moisture resistance, and its peak of excitation spectrum can be near 420 nm to 470 nm. In addition, the light emission peak wavelength $\lambda p$ is near 600 nm, and provides broad emission spectrum with foot extending to near 750 nm.

In the composition of YAG group phosphor with garnet structure, substituting Ga for a part of Al shifts the emission spectrum toward the short wavelength side. Substituting Gd and/or La for a part of Y in the composition shifts the emission spectrum toward the long wavelength side. Thus, varying composition can continuously adjust the luminescent color. Accordingly, the ideal condition of conversion into white group light emission by using blue group light emission of nitride semiconductor is provided by continuous variation of intensity in the long wavelength side by composition ratio of Gd, and so on. When the substitution of Y is less than twenty percent, the green component increases and the red component reduces. On the other hand, when it is not less than eighty percent, the red component increases but luminance sharply reduces. In addition, similarly to the excitation absorption spectrum, in the composition of YAG group phosphor with garnet structure, substituting Ga for a part of Al shifts the excitation absorption spectrum toward the short wavelength side. Substituting Gd and/or La for a part of Y in the composition shifts the excitation absorption spectrum toward the long wavelength side. It is preferable that the peak wavelength of the excitation absorption spectrum of YAG group phosphor is in the short wavelength side relative to the peak wavelength of the emission spectrum of light emitting element. In this construction, when a current supplied to a light emitting element increases, the peak wavelength of the excitation absorption spectrum substantially agrees with the peak wavelength of the emission spectrum of light emitting element. Accordingly, it is possible to provide a light emitting apparatus in which occurrence of chromaticity deviation is kept in check without reduction of excitation efficiency of phosphor.

As for this type of phosphor, an oxide or a compound, which easily becomes into an oxide at high temperature, is employed as a material of Y, Gd, Ce, La, Lu, Al, Sm, and Ga, thus, the material is obtained by sufficiently mixing them at the stoichiometric ratio. Alternatively, a mixed material is obtained by mixing a coprecipitated oxide with an aluminum oxide and a gallium oxide; the coprecipitated oxide is obtained by burning a material obtained by coprecipitating solution, in which a rare earth element of Y, Gd, Ce, La, Lu, Al, and Sm are dissolved in acid, with an oxalic acid at the stoichiometric ratio. After mixing the mixed material and an appropriate amount of fluoride such as ammonium fluoride as flux, inserting them in to a crucible, then burning them at temperature 1350° C. to 1450° C. in air for 2 hours to 5 hours, as a result, a burned material can be obtained. Next, the burned material is crushed in water by a ball mill. Then washing, separating, drying it, finally sifting it through a sieve, the photo-luminescent phosphor can be obtained. Additionally, a method for producing a phosphor according to another embodiment includes two steps for burning. In a first burning step, mixture composed of mixed material, in which a material of phosphor is mixed, and flux is burned in the air or a weak reducing atmosphere. In a second burning step, the mixture is burned in a reducing atmosphere. The weak reducing atmosphere refers to a reducing atmosphere with low effect including at least a necessary amount of oxygen to form a desired phosphor from a mixed material in the reaction process. The first burning process is performed in this weak reducing atmosphere until desired structure formation of the phosphor is completed, thus, it is possible to prevent a phosphor from darkening, and light-absorption efficiency from reducing. The reducing atmosphere in the second burning process refers to a reducing atmosphere with high effect stronger than the weak reducing atmosphere. In the case of two steps for burning as discussed above, a phosphor with high absorption efficiency of excitation wavelength is obtained. Accordingly, when a light emitting apparatus is formed by using the phosphor formed as discussed above, the amount of phosphor necessary for obtaining desired color tone can be reduced. Therefore, it is possible to provide a light emitting apparatus with high light-outgoing efficiency.

Two or more kinds of yttrium aluminum oxide group phosphors activated by cerium with different compositions may be mixed or be independently located for use. In the case where the phosphors are independently located, it is preferable that they are located in the order from a light emitting element of a phosphor, which absorbs the light and emits luminescent radiation in the shorter wavelength side, and a phosphor, which absorbs the light and emits luminescent radiation in the wavelength side longer than that. This allows them to efficiently absorb the light and emits luminescent radiation.

(Nitride Phosphor)

An alkaline-earth nitride group phosphor activated by Eu or a rare earth element with yellowish red to red luminescent radiation is preferably employed as a phosphor used in this embodiment other than the aforementioned yttrium aluminum oxide group phosphor activated by cerium. This phosphor absorbs visible light or ultraviolet rays emitted from an LED chip, or light emitted from a YAG group phosphor, and is excited and thus emits luminescent radiation. The phosphor according to this embodiment of the present invention is a silicon nitride such as Sr—Ca—Si—N:R; Ca—Si—N:R; Sr—Si—N:R; Sr—Ca—Si—O—N:R; Ca—Si—O—N:R; and Sr—Si—O—N:R group silicon nitrides. The basic component elements of this phosphor is represented by general formulas $L_XSi_YN_{(2/3X+4/3Y)}$:R or $L_XSi_YO_ZN_{(2/3X+4/3Y-2/3Z)}$:R (where L is any element of Sr, Ca, Sr, or Ca). It is preferable that X and Y in the general formulas are X=2, Y=5, or X=1, Y=7, however, arbitrary values can be used. R represents rare earth elements necessary to include Eu. N is nitrogen. O is oxygen. Specifically, as basic component elements, it is preferable that phosphors represented by $(Sr_XCa_{1-X})_2Si_5N_8$:Eu; $Sr_2Si_5N_8$:Eu; $Ca_2Si_5N_8$:Eu; $Sr_XCa_{1-X}Si_7N_{10}$:Eu; $SrSi_7N_{10}$:Eu; and $CaSi_7N_{10}$:Eu are employed. However, the phosphor may include at least one element selected from the group consisting of Mg, B, Al, Cu, Mn, Cr, and Ni. However, the present invention is not limited in these embodiments and examples.

L is any element of Sr, Ca, Sr, and Ca. The composition ratio of Sr and Ca can be varied, if desired.

Europium Eu, which is a rare-earth element, is mainly employed as center of luminescent radiation. Europium mainly has a divalent or trivalent energy level. The phosphor according to this embodiment of the present invention employs $Eu^{2+}$ as the activator for the base material of alkaline-earth-metal group silicon nitride. In addition, Mn may be used as an additive.

Next, a process for producing the phosphor $((Sr_XCa_{1-X})_2Si_5N_8$:Eu) used in this embodiment of the present invention is described as follows. However, this process is not for the purpose of limiting the invention. The aforementioned phosphor contains Mn, and O.

The materials Sr and Ca are pulverized. It is preferable to use Sr and Ca alone as the materials. However, an imide compound, an amide compound, or the like, also can be employed. It is preferable that Sr and Ca have the average particle size about 0.1 μm to 15 μm, however it is not specifically limited to this range. It is preferable that the purity of Sr and Ca is 2N or more, however it is not specifically limited to this.

The material Si is pulverized. It is preferable to use Si alone as the materials. However, a nitride compound, an imide compound, an amide compound, or the like, also can be employed. It is preferable that the purity of Si is 3N or more. Si is also pulverized. It is preferable that the compound of Si has the average particle size about 0.1 μm to 15 μm.

Subsequently, the materials Sr and Ca are nitrided in a nitrogen atmosphere. The equations are represented by the following Chemical Formulas 3 and 4, respectively.

$3Sr+N_2 \rightarrow Sr_3N_2$ [Chemical Formula 3]

$3Ca+N_2 \rightarrow Ca_3N_2$ [Chemical Formula 4]

Sr and Ca are nitrided in a nitrogen atmosphere at 600° C. to 900° C. for about 5 hours. It is preferable that the nitrides of Sr, and Ca have high purity. However, nitrides available on the market also can be employed.

The material Si is nitrided in a nitrogen atmosphere. The equation is represented by the following Chemical Formula 5.

$3Si+2N_2 \rightarrow Si_3N_4$ [Chemical Formula 5]

Silicon Si is also nitrided in a nitrogen atmosphere at 600° C. to 900° C. for about 5 hours. It is preferable that the silicon nitride has high purity. However, a silicon nitride available on the market also can be employed.

The nitride of Sr, Ca, or Sr—Ca is pulverized. The nitride of Si is pulverized similarly. In addition, the compound of Eu, $Eu_2O_3$ is also pulverized similarly. The europium oxide is employed as the compound of Eu, however metal europium, an europium nitride, or the like, can be employed. Additionally, an imide compound, an amide compound, or the like, can be employed as the material of Eu. It is preferable that the europium oxide has high purity. However, an europium oxide available on the market also can be employed. It is preferable the nitride of alkaline earth metal, the silicon nitride, and the europium oxide have the average particle size about 0.1 μm to 15 μm.

The above materials may contain at least one element selected the group consisting of Mg, B, Al, Cu, Mn, Cr, O, and Ni. In addition, an adjusted content of the above element such as Mg, Mn, and B may be mixed in the following processes.

After pulverized, the nitrides of Sr, Ca, and Sr—Cr, the nitride of Si, and the compound of Eu, $Eu_2O_3$ are mixed, and then are mixed with Mn added thereto.

Finally, the mixture of the nitrides of Sr, Ca, and Sr—Cr, the nitride of Si, and the compound of Eu, $Eu_2O_3$ is burned in an ammonia atmosphere. Burning them can provide the phosphor represented by formula $(Sr_XCa_{1-X})_2Si_5N_8$:Eu with added Mn. The equation of the basic component elements in the burning is represented by the following Chemical Formula 6.

$$\frac{X}{3}Sr_3N_2 + \frac{(1.97-X)}{3}Ca_3N_2 + \frac{5}{3}Si_3N_4 + \frac{0.03}{2}Eu_2O_3$$

[Chemical Formula 6]

$$\rightarrow Sr_XCa_{1.97-X}Eu_{0.03}Si_5N_{7.98}O_{0.045}$$

In addition, the composition ratio of materials can be changed so as to obtain composition of the desired phosphor.

The burning is performed at burning temperature in the range 1200° C. to 1700° C., however it is preferable that the burning temperature is 1400° C. to 1700° C. It is preferable that the materials of the phosphor are burned in a crucible or a boat of a boron nitride (BN) material. Instead of the crucible of a boron nitride material, a crucible of alumina ($Al_2O_3$) also can be used.

The desired phosphor can be obtained by the aforementioned method.

In the example of the present invention, the nitride group phosphor is particularly used as the phosphor which emits reddish luminescent radiation. However, in this embodiment of the present invention, the light-emitting apparatus can have the above YAG group phosphor and the phosphor capable emitting red group luminescent radiation. This type of phosphor capable of emitting red group luminescent radiation is a phosphor, which is excited by the light with wavelength 250 nm to 600 nm and emit luminescent radiation. For example, $Y_2O_2S$:Eu, $La_2O_2S$:Eu, CaS:Eu, SrS:Eu, ZnS:Mn, ZnCdS:Ag, Al, ZnCdS:Cu, Al, or the like, can be given as the phosphor. Using the phosphor capable of emitting red group luminescent radiation together with the YAG group phosphor can improve the color rendering of light-emitting apparatus.

In the light emitting apparatus according to each embodiment of the present invention, various phosphors can be used as the phosphor. For example, a barium magnesium aluminate group phosphor activated by europium represented by $BaMgAl_{10}O_{17}$:Eu, a calcium halophosphate group phosphor activated by europium represented by $(Ca, Sr, Ba)_5(PO_4)_3Cl$:Eu, an alkaline-earth chloroborate group phosphor activated by europium represented by $(Ca, Sr, Ba)_2B_5O_9Cl$:Eu, an alkaline-earth aluminate group phosphor activated by europium represented by $(Sr, Ca, Ba)Al_2O_4$:Eu or $(Sr, Ca, Ba)_4Al_{14}O_{25}$:Eu, an alkaline-earth silicon oxynitride group phosphor activated by europium represented by $(Mg, Ca, Sr, Ba)Si_2O_2N_2$:Eu, an alkaline-earth magnesium silicate group phosphor activated by europium represented by $(Ba, Ca, Sr)_2SiO_4$:Eu, a YAG group phosphor which is a rare earth aluminate represented by $(Y, Gd)_3(Al, Ga)_5O_{12}$:Ce or the like, and a rare-earth oxychalcogenide group phosphor activated by europium represented by $(Y, La, Gd, Lu)_2O_2S$:Eu, and so on, can be used as the phosphor. The barium magnesium aluminate group phosphor activated by europium emits luminescent radiation of the blue range. The calcium halophosphate group phosphor activated by europium emits luminescent radiation of the blue range. The alkaline-earth chloroborate group phosphor activated by europium emits luminescent radiation of the blue range. The alkaline-earth aluminate group phosphor activated by europium emits luminescent radiation of the bluish green range. The alkaline-earth silicon oxynitride group phosphor activated by europium emits luminescent radiation of the green range. The alkaline-earth magnesium silicate group phosphor activated by europium emits luminescent radiation of the green range. The YAG group phosphor emits luminescent radiation of the yellow range. The rare-earth oxychalcogenide group phosphor activated by europium emits luminescent radiation of the red range. But, the phosphor is not limited to these materials. Additionally the aforementioned phosphor, or other phosphor can be used in the luminescent layer according to this embodiment of the present invention. Furthermore, a phosphor with fracture surfaces which is treated against coating deterioration may be used.

In the aforementioned phosphors, such as the alkaline-earth chloroborate group phosphor activated by the europium, the alkaline-earth aluminate group phosphor activated by the europium, the alkaline-earth silicon oxynitride group phosphor activated by the europium, the YAG group phosphor, and the alkaline-earth silicon nitride group phosphor activated by the europium, for example, it is preferable that they contain a B element, so that their crystallinity becomes excellent, their particle sizes become large, and their crystal shape is adjusted. This can improve luminance of light emission. These phosphors are also effective as a filler of phosphor according to this embodiment. As for the crystal structure, for example, $Ca_2Si_5N_8$ has a monoclinic system, $Sr_2Si_5N_8$ and $(Sr_{0.5}Ca_{0.5})_2Sr_5N_8$ have a orthorhombic system, and $Ba_2Si_5N_8$ has a monoclinic system.

In addition, this phosphor includes 60% or more of, preferably 80% or more of crystalline substance in its composition. Typically, it is preferable that x=2, y=5 or x=1, y=7, but arbitrary values can be used.

In a very small amount of additive, B, or the like, can improve crystallinity without reducing light emission characteristics. Mn, Cu, and so on, also achieve a similar effect. In addition, La, Pr, and so on, are effective for improving light emission characteristics. In addition, Mg, Cr, Ni, and so on, have an effect that makes persistence short, thus, they are used if necessary. In addition, elements which are not shown in this specification can be added without reducing luminance remarkably, if their concentrations are within a range about 10 to 1000 ppm.

It is preferable that at least one element of Y, La, Ce, Pr, Nd, Gd, Tb, Dy, Ho, Er, and Lu is included as the rare earth element contained in R. But, R, Sc, Sm, Tm, or Yb may be included. Additionally, B, Mn, and so on, other than the above elements have an effect that improve luminance, thus, they may be included. These rare-earth elements are mixed in the material as single substance, oxide, imide, amide, or other states. Although rare earth elements mainly have a stable trivalent configuration, Yb, Sm, and so on, can also have a divalent configuration, and Ce, Pr, Tb, and so on, can also have a tetravalent configuration. When a rare earth element oxide is used, oxygen affects light emission characteristics of the phosphor. In other words, when oxygen is included, light emission luminance may reduce. But, when Mn is used, the particle size becomes larger due to the flux effect of Mn and O, thus, it is possible to improve light emission luminance.

Europium Eu, which is a rare-earth element, is preferably employed as center of fluorescent. Specifically, examples of basic composition elements are given as follows: $Ca_2Si_5O_{0.1}N_{7.9}$:Eu, $Sr_2Si_5O_{0.1}N_{7.9}$:Eu, $(Ca_xSr_{1-x})_2Si_5O_{0.1}N_{7.9}$:Eu and $CaSi_7O_{0.5}N_{9.5}$:Eu in which Mn and B are added; $Ca_2Si_5O_{0.5}N_{7.9}$:Eu, $Sr_2Si_5O_{0.5}N_{7.7}$:Eu and $(Ca_xSr_{1-x})_2Si_5O_{0.1}N_{7.9}$:Eu in which rare earth is added; or the like.

The nitride group phosphor as discussed above absorbs a part of blue light emitted from the light-emitting element and emits luminescent radiation of the yellow to red region. Employing this phosphor in the light emitting apparatus of the aforementioned construction can provide the light-emitting apparatus capable of emitting a warm white color by mixing the blue light emitted from the light-emitting element and the light in the region from the phosphor. Particularly, in a white light emitting apparatus, the apparatus preferably includes a nitride group phosphor, and an yttrium aluminum oxide phosphor material activated by cerium which is a rare-earth aluminate phosphor. Including the aforementioned yttrium aluminum oxide phosphor can adjust desired chromaticity. The yttrium aluminum oxide phosphor activated by cerium can absorb a part of blue light emitted from the light-emitting element and emit luminescent radiation of yellow region. The blue group light emitted from the light-emitting element and the light of the yttrium aluminum oxide phosphor are mixed, thus, bluish white light emission can be obtained. Accordingly, the phosphor, which has the binder mixed with the yttrium aluminum oxide phosphor and the aforementioned nitride phosphor together, blue light emitted by the light emitting element are combined, thus, it is possible to provide a warm, white light emitting apparatus. In this warm, white light emitting apparatus, the general color rendering index Ra can be 75 to 95, and the color temperature can be 2000 K to 8000 K. Especially, it is preferable that a white light emitting apparatus, which has a high general color rendering index Ra, and the color temperature of which is located on the blackbody line in the chromaticity diagram. In order to provide a light emitting apparatus with desired color temperature and general color rendering index, the amounts of combination of the yttrium aluminum oxide phosphor and the phosphor, or the composition ratio of phosphors can be changed if necessary. Particularly this warm white light emitting apparatus is aimed at improving the special color rendering index R9. In a conventional light emitting apparatus which is composed of the combination of a blue light emitting element and an yttrium aluminum oxide phosphor activated with cerium and emits white light, the special color rendering index R9 is low, and the reddish component is insufficient. Accordingly, there was a problem to be solved that the special color rendering index R9 was improved. On the other hand, an alkaline-earth silicon nitride oxide phosphor activated by Eu is included in the yttrium aluminum oxide phosphor activated by cerium, thus, the special color rendering index R9 can be increased to the range 40 to 70. In addition, it is possible to produce an LED light emitting apparatus of electric bulb color light emission.

(Light Emitting Apparatus)

The light emitting element (LED chip) 10 is preferably mounted in a substantially central part of the cup disposed on the upper part of the mount lead 13a by die-bonding. The lead frame 13 is composed of, for example, copper containing iron. The electrodes formed on the light emitting element 10 are electrically connected to the lead frame with the conductive wires 14. Gold is used for the conductive wire 14. Ni is preferably plated on bumps for electrically connecting the electrodes and the conductive wires 14.

The phosphor member 11, which is slurry obtained by sufficiently mixing the aforementioned phosphor 11a with the binder 11b, is put in the cup in which the light emitting element 10 is mounted. After that, gel including the phosphor 11a is heated and cured. The heat curing of slurry is preferably at 50° C. to 500° C. The heat curing temperature of Al or Y is about 100° C. to 500° C. In this case, the thermosetting is performed at 150° C. or less. Ultraviolet ray irradiation can be used for heat curing of sol. For example, mercurial line, VUV, and so on, can be used, additionally, a plurality of light sources and heat sources may be used together. Strong light irradiation such as in the case of VUV can efficiently cut the bonding of organic groups in carboxylic acid, or the like, thus, the cure reaction can be stable. In the case where the slurry of phosphor member is irradiated with VUV, mixed gas of $O_2$ and $N_2$ is flowed, thus, a part of $O_2$ reacts with a hydroxyl group or an organic group separated by the VUV irradiation to form $CO_2$ and $H_2O$. This can accelerates removal of these hydroxyl group, organic group, and so on. In this embodiment, when vacuum-ultraviolet irradiation of 254 nm or more, and heating are combined, at the film formation stage in the cure of film, its bonding characteristics with the interface a phosphor and a filler, and the bonding characteristics on a light emitting element, such as an LED, are improved. Accordingly, it is possible to form a film with less micropores.

Thus, the phosphor member 11 composed of the binder including the phosphor is formed on the LED chip 10, and the LED chip 10 is fastened. Subsequently, in order to protect the LED chip and the phosphor from external stress, moisture, dust, and so on, a transparent epoxy resin is preferably further formed as the mold member 15. The lead frame 13 is inserted into a mold with a bullet-shaped cavity in which the color transformation member is formed. Then, the transparent epoxy resin is mixed therein, and the mold member 15 is cured.

The phosphor member 11 may be provided such that it is in direct contact with the LED chip 10, or such that a transparent resin, or the like, is interposed between them. Needless to say, in this case, it is preferable to use a transparent resin with high light resistance.

In the phosphor according to this embodiment of the present invention, even in the case where it is placed under high temperature environment during reflow of the light emitting apparatus, and so on, it is possible to reduce that the luminous efficiency sharply reduces. Particularly, in a light emitting element in which its lead is contact with or close to the phosphor member, and heat is prone to being highly conducted to the phosphor through the lead, the phosphor according to this embodiment of the present invention is useful.

Second Embodiment

Figure 3:
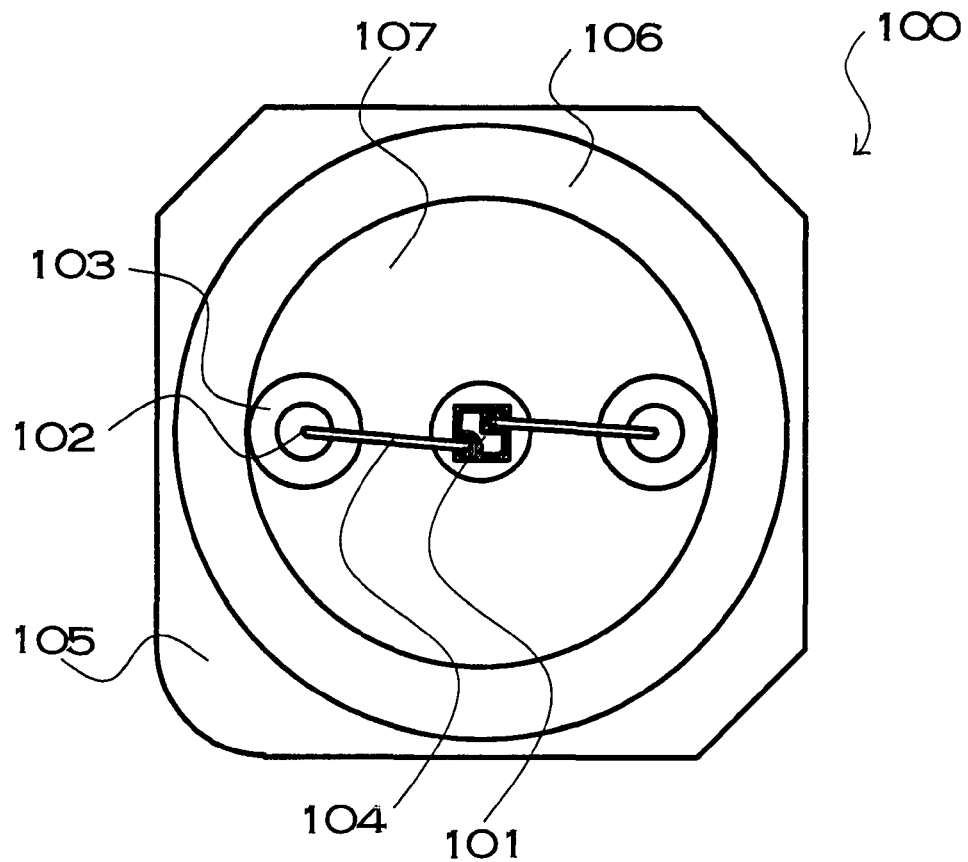
FIG. 3 is a plan view schematically showing a light emitting apparatus according to a second embodiment of the present invention.
Figure 4:
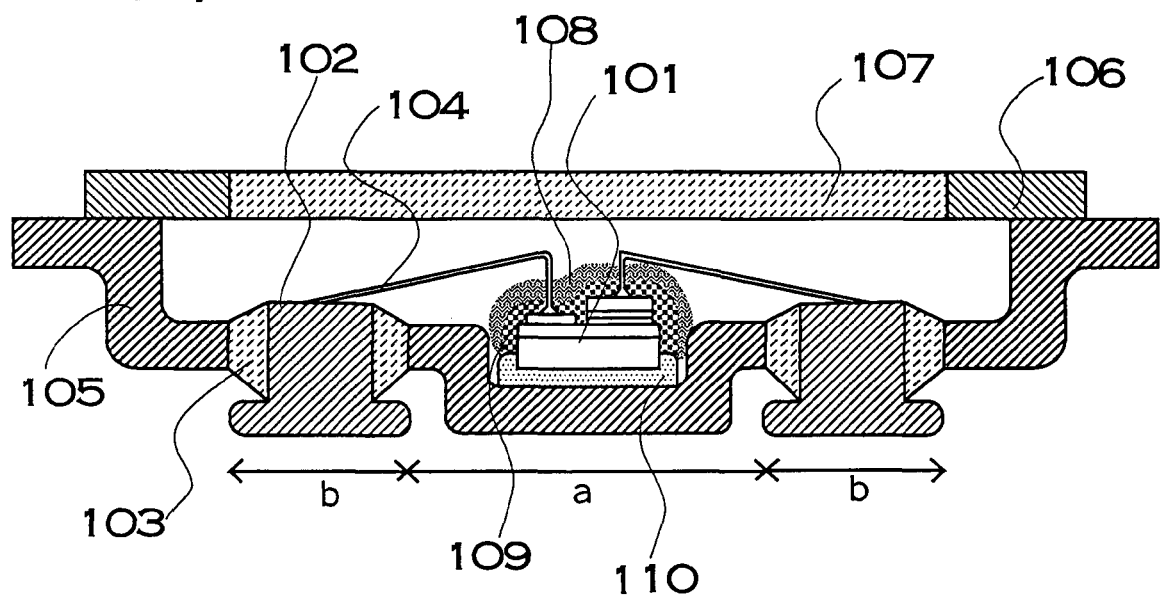
FIG. 4 is a cross-sectional view of the light emitting apparatus of FIG. 3.

FIGS. 3 and 4 show a schematic plan view and a schematic cross-sectional view showing the structure in the state where an LED as light emitting element is mounted in a metal package, as an example of light emitting apparatus according to a second embodiment of the present invention.

A package 105 is formed of metal and has a recessed portion a in the center. A base portion b is located around said recessed portion. The base portion b has the two through holes penetrating in the thickness direction. The through holes are opposed to each other so as to sandwich said recessed portion a. The positive and negative lead terminals 102 are inserted into the through holes, respectively, so as to interpose hard glass, which is an insulating member 103, between each lead terminal and the through hole. A lid 106 composed of a transparent window portion 107 and a metal portion is located in the principal plane side of the metal package 105. The light emitting element, or the like, in the package is airtightly sealed together with nitrogen gas by welding the contact surface between the metal portion and the metal package 105. An LED chip 101 accommodated in the recessed portion a is a light emitting element which emits blue light or ultraviolet rays. The adhesion between the LED chip 101 and the metal package 105 is performed via an adhesion layer 110 obtained by burning and drying hydrolysis solution of ethyl silicate.

As shown in FIG. 4, a luminescent layer 109 is formed on the light emitting element in the recessed portion a which is insulated from the lead terminals 102. CCA-Blue (the chemical formula is $Ca_{10}(PO_4)_6ClBr$, and activators are Mn and Eu) is bound by AlOOH in the luminescent layer 109. A luminescent layer 108 is formed on the luminescent layer 109. A YAG group phosphor is bound by AlOOH, YOOH, or the like, in the luminescent layer 108. With reference to drawings, constituent members according to the embodiment of the present invention is described.

(Luminescent Layers 108 and 109)

Figure 5:
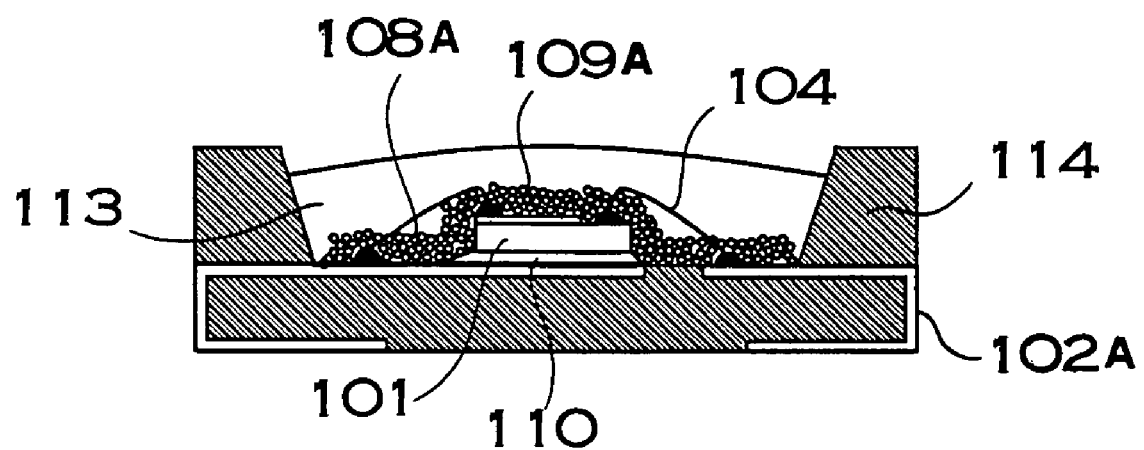
FIG. 5 is a schematic cross-sectional view showing a light emitting apparatus according to another embodiment of the present invention.

The luminescent layer is provided separately from the mold member in the cup of the mount lead, an opening of the package, and so on. The luminescent layer is a layer containing a phosphor which converts light emitted from the LED chip 101 and a material for binding the phosphor. As shown in FIG. 5, in the luminescent layer according to this embodiment of the present invention, the thickness of luminescent layer 109A located on the upper surface, the side surfaces, and the corners of the LED chip 101 is substantially equal to the thickness of the luminescent layer 108A located on the support member other than the LED chip 101. The luminescent layer does not break even at the corner parts of the LED chip 101. The luminescent layer is a continuous layer.

Reflection by the package, and so on, increases high-energy light emitted from the LED chip to high density in the luminescent layer. When light is reflected and is scattered by the phosphor, the luminescent layer may be exposed to high-energy light with high density. Accordingly, in the case where a nitride group semiconductor, which can provide high luminescence intensity and can emit high-energy light, is used as an LED chip, it is preferable that a hydroxide oxide containing at least one metallic element selected from the group consisting of Al, Y, Gd, Lu, Sc, Ga, In, and B with resistance for high-energy light is used one as a binding agent or a binder.

Specifically, a material with a phosphor contained in a transparent inorganic member of Al(OH)$_3$, Y(OH)$_3$, and so on, is preferably used as one of main materials of the luminescent layer. These transparent inorganic members bind the phosphor. The phosphor is deposited and bound on the LED chip or the support member in a film shape. In this embodiment, a hydroxide oxide is formed from a compound consisting principally of a hydroxide oxide which is produced from an organometallic compound of any of Al, Y, Gd, Lu, Sc, Ga, In, and B. The organometallic compound refers to a compound including an alkyl group or an aryl group which are bonded with metal through an oxygen atom. For example, metal alkyl, metal alkoxide, metal diketonate, metal diketonate complex, metal carboxylate, and so on, can be given as this type of organometallic compound. Among these organometallic compounds, particularly, when an organometallic compound of liquid in room temperature is employed, adding the organic solvent can easily provide viscosity adjustment in consideration of the workability, or prevent appearance of congelation of organometallic compound, or the like. Accordingly, workability can be improved. Since this type of organometallic compound have high reactivity of hydrolysis, or the like, it easily disperses. Thus, it is possible to form a luminescent layer with a phosphor bound therein. For this reason, in a method which employs an organometallic compound, dissimilarly to other method which forms a luminescent layer on the LED in the state of high temperature of 350° C. or more, or electrostatic application, it is possible to form a luminescent layer on the LED without reducing the performance as a light emitting element of LED. Accordingly, the producing yield is improved.

The luminescent layer consists principally of an inorganic substance, however, it may partially contain an organic substance consisting principally of carboxylic acid. It is preferable that the content of organic substance is not more than 1% by weight. In addition, it is preferable that the luminescent layer has transmittance 50% or more at least in the wavelength range 250 nm to 800 nm.

Specifically, AlOOH is described as an example of main material included in the luminescent layer.

(Luminescent Layer 109 with Phosphor Bound by AlOOH)

The luminescent layer with a phosphor bound by AlOOH can be formed as follows. Aluminoxane sol or alumina sol solution is obtained by hydrolyzing aluminum alcoholate or aluminum alkoxide in organic solvent at a predetermined rate. Application liquid is prepared by uniformly dispersing a phosphor (particles) in the solution. Spray coating, dispensing, or the like, of the alumina sol solution with the dispersed phosphor is performed so as to cover the whole surface of the light emitting element. After that, it is heated and cured. The particles of phosphor are bound by the AlOOH component. It is bound on the surface of the light emitting element.

Aluminum alcoholate or aluminum alkoxide is an organic aluminum compound used as a thickener of paint, a gelling agent, a hardener, a polymerizing catalyst, and a dispersing agent of pigment.

Aluminium isopropoxide, aluminum ethoxide, and the aluminum butoxide, which are kinds of aluminum alcoholate or aluminum alkoxide, have very high reactivity. They produces an aluminum hydroxide or an alkyl aluminate with moisture in the air, and produce aluminum hydroxide oxide with boehmite structure. For example, as shown by the following Chemical Formulas 7, aluminium isopropoxide easily reacts with water, and thus becomes mixture, which consists principally of an aluminum hydroxide oxide and has bridge structure with an aluminum hydroxide or an aluminum oxide (alumina).

[Chemical Formula 7]

After aluminium isopropoxide reacts with moisture in the air, AlOOH is produced by heating. Thus, binding a phosphor with this AlOOH can form the luminescent layer with a phosphor bound by AlOOH containing a phosphor on the surfaces of the light emitting element, and on the support member other than the surfaces of the light emitting element as a luminescent layer.

The aforementioned luminescent layer with a phosphor bound by AlOOH may composed of two or more layers, which include combined a luminescent layer with a phosphor bound by a hydroxide oxide of other element, such as Y, Gd, Lu, Sc, Ga, In, and B, and a luminescent layer with a phosphor bound by AlOOH, on the same light emitting element. According to a method for forming a luminescent layer by spray in this embodiment, since the thicknesses of two layers can be controlled, it is possible to easily form luminescent layers with the same shape. For example, on the same light emitting element, first, a luminescent layer of Y$_2$O$_3$ is formed, and a luminescent layer of Al$_2$O$_3$ is formed thereon. In this case, phosphor may be included in both two layers, may be included in only one layer, or may not be included in both two layers. In this construction, there are effects such as improvement of light-outgoing efficiency depending on the difference of refractive indices of the luminescent layers. In the case where a luminescent layer consisting of one layer is formed, the refractive indices between the luminescent layer and the air or a nitride semiconductor light emitting element sharply vary at the interface. Since a part of light outgoing from the light emitting element may reflect at this interface, the light-outgoing efficiency is prone to decrease. In addition, for example, the coefficient of linear expansion or the refractive index may be adjusted by forming a luminescent layer with mixed AlOOH, YOOH, and so on.

Since the luminescent layer with a phosphor bound by AlOOH formed as above is inorganic substance dissimilarly to conventional resin, its deterioration due to ultraviolet rays is very small as compared with the resin. Accordingly, the luminescent layer with a phosphor bound by AlOOH can be used together with a light emitting element which emit ultraviolet light, or a high-power LED.

(LED Chip 101)

An LED chip, which can excite a phosphor, is used as the LED chip 101 as a light emitting element in this embodiment. In the LED chip 101 which is a light emitting element, a semiconductor, such as GaAs, InP, GaAlAs, InGaAlP, InN, AlN and GaN, InGaN, AlGaN, and InGaAlN, is formed as a light emitting layer on a substrate by a MOCVD method, and so on. Homo structure, hetero structure, or double-hetero structure with MIS junction, PIN junction, PN junction, or the like, can be used as the structure of the semiconductor layer. Various light-emission wavelength can be selected depending on the material and the mixed crystal ratio of the semiconductor layer. The semiconductor layer can have a single- or multi-quantum-well structure provided with thin layer(s) for quantum effect. It is preferably a nitride group compound semiconductor (general formula $In_iAl_jGa_{1-i-j}N$, where $0 \leq i$, $0 \leq j$, $i \leq j \leq 1$), which can efficiently emit light with relatively short wavelength capable of efficiently exciting a phosphor.

When a gallium-nitride group compound semiconductor is used, a material, such as sapphire, spinel, SiC, Si, ZnO, and GaN, is preferably used as the substrate for semiconductor. In order to form a gallium nitride with good crystallinity, it is more preferable to use a sapphire substrate. When semiconductor layers are grown on the sapphire substrate, it is preferable that a buffer layer, such as GaN and AlN, is formed to grow gallium-nitride semiconductor with PN junction thereon. GaN single crystal, which is selectively grown on the sapphire substrate by using $SiO_2$ as a mask, can also be used as the substrate. In this case, after semiconductor layers are formed, the light emitting element and the sapphire substrate can be separated by etching and removing $SiO_2$. A gallium-nitride group compound semiconductor has n-type conductivity in the state where an impurity is not doped. In order to improve luminous efficiency, or to achieve other purpose, when a desired n-type gallium-nitride semiconductor is formed, it is preferable that Si, Ge, Se, Te, C, or the like, are doped, if necessary. On the other hand, when a p-type gallium-nitride semiconductor is formed, Zn, Mg, Be, Ca, Sr, Ba, or the like, which are p-type dopants, are doped.

Even if a gallium-nitride group compound semiconductor is doped with a p-type dopant, this can hardly provide p-type conductivity. Accordingly, after a p-type dopant is doped, it is preferable to anneal the semiconductor by heating with a furnace, low-speed electron beam irradiation, plasma irradiation, and so on. Specifically, exemplary layer structure of light emitting element can be given as follows. An n-type contact layer of gallium nitride semiconductor, an type cladding layer of aluminum-gallium nitride semiconductor, an active layer of indium-gallium nitride semiconductor with Zn and Si doped thereto, a p-type cladding layer of aluminum-gallium nitride semiconductor, and a p-type contact layer of gallium nitride semiconductor are laminated on the sapphire substrate with the buffer layer of gallium nitride, aluminum nitride, and so on, grown at low temperature, or on silicon carbide. In order to form the LED chip 101, in the case of the LED chip 101 with the sapphire substrate, after exposed surfaces of the p-type semiconductor and the n-type semiconductor are by etching or other process, electrodes with desired shapes are formed on the semiconductor layers by using a sputtering process, a vacuum deposition process, and so on. In the case of SiC substrate, a pair of electrodes can be formed so as to use the conductivity of substrate itself.

Subsequently, the formed semiconductor wafer, or the like, is directly and fully cut by dicing saw having a rotating blade with a cutting edge of diamond, or is separated by external force after the wafer is cut so as to have a groove of width larger than the cutting edge (half cut). Alternatively, after very thin scribing lines (longitude lines) are drawn in a grid pattern on the semiconductor wafer by a scriber, in which the top of diamond stylus rectilinearly reciprocates, the wafer is separated by external force into chips. As discussed above, it is possible to form the LED chip 101 of nitride group compound semiconductor.

In the case of light emission in the light emitting apparatus of this embodiment, in consideration of the complementary color to a phosphor, or other relationship with a phosphor, it is preferable that the main light-emission wavelength of the LED chip 101 is not less than 350 nm and not more than 530 nm.

(Metal Package 105)

The metal package 105 used in the light emitting apparatus according to one embodiment of the present invention is composed of the recessed portion a which contains the light emitting element, and the base portion b in which the lead terminals are located, and serves as a support member of light emitting element. The bottom of said recessed portion and the bottom of said lead terminal lie on the substantially same surface.

In the light emitting apparatus, it is preferable that the package is formed of a thin film in consideration of the heat diffusion characteristics and miniaturization. On the other hand, in order to reduce the difference of the thermal expansion coefficients with the insulating member located at the interface with the lead terminal, and so on, and to improve reliability, it is necessary to make their contact surfaces large. Therefore, in the metal package, the inventors of the present invention specify the respective shapes and thicknesses depending on the areas which are considered as separated parts of a part in which the light emitting element is located, and a part the lead terminal is secured, and thus improve reliability.

(Lead Electrode 102)

The light emitting apparatus according to this embodiment of the present invention has the positive and negative lead terminal 102. They are inserted into the through holes provided in the base portion of the metal package so as to interpose the insulating member between each electrode and each hole. The fore end of said lead terminal protrudes from the surface of said base portion. The bottom of said lead terminal lies on the substantially same plane as the bottom in the mount-side of said recessed portion.

(Lid 106)

The lid 106 according to one embodiment of the present invention has the transparent window portion 107 and the metal portion in the principal plane side of the metal package 105. It is preferable that the window portion 107 located in the light emission surface of the light emitting apparatus, and in the center thereof.

In this embodiment, said window portion is located above the upper surface of the light emitting element located in the recessed portion of said metal package, and has intersection with the extension of the inner wall of said recessed portion. Light emitted from the end of said light emitting element is reflected and scattered on the side surface of said recessed portion, and thus outgoes frontward. It is considered that the reflected and scattered light travels substantially in the range of defined by the extension of the surface of said recessed portion. Accordingly, as discussed above, the area of the window portion which is the light emission surface is adjusted, thus, said reflected scattered light is efficiently collected toward said window portion. Therefore, it is possible to provide a light emitting apparatus which can emit light of high luminance.

(Package 114)

As shown in FIG. 5, the package 114 used in another embodiment of the present invention serves as a support member which secures and protects the LED chip 101 in the recessed portion. The package 114 has an external terminal 102A which can be electrically and externally connected. The package 114 may also have a plurality of openings depending on the number and size of the LED chips 101. Preferably, in order to achieve light shield effect, the package 114 is colored in dark color, such as black and gray, or its light-outgoing front side is colored in dark color. The package 114 may also have a molding member 113, which is a transparent protective member, in addition to the coating layers 111 and 112, in order to protect the LED chip 101 from the environmental influence. The package 114 is preferably made of a material having bonding characteristics with the coating layers 111 and 112, and the molding member 113, and high rigidity. It is preferable that the LED chip 101 has insulating characteristics to be electrically insulated from the outside. In addition, the package 114 is preferably made of a material with low thermal expansion coefficient when subjected to thermal influence from the LED chip 101, and so on, in consideration of bonding with the molding member 113.

The LED chip 101 and the package 114 may be bonded together with a thermosetting resin, or the like. Specifically, epoxy resin, acrylic resin or imide resin can be used. When the light emitting apparatus employing an LED chip, which emits light including ultraviolet rays, is operated at high output power, since the ultraviolet rays, and so on, emitted from the LED chip are reflected by the resin as the molding member, the phosphor contained therein, and so on, the ultraviolet rays, and so on exist in the bonding part between the LED chip 101 and the package 114 at high density. This causes deterioration of resin in the adhesion part due to ultraviolet rays, and may result in problems such as the reduction of light-emitting efficiency due to yellowing discoloration of the resin, and short lifetime of the light emitting apparatus due to reduction of adhesion strength. In order to prevent such deterioration of the resin in the adhesion part due to ultraviolet rays, resin including an ultraviolet absorbing agent, more preferably an inorganic material according to this embodiment of the present invention, or the like, is used. Particularly when the package is made of a metallic material, the inorganic material according to this embodiment of the present invention or eutectic solder such as Au—Sn is used for adhesion between LED chip 101 and the package 114. As a result, the adhesion part does not deteriorate dissimilarly to the case where resin is used for adhesion, even when the light emitting apparatus employing an LED chip that emits light including ultraviolet rays is operated at high output power.

Ag paste, carbon paste, ITO paste, metal bump or the like is preferably used for securing the LED chip 101 and electrically connecting the external terminals 102A provided in the package 114.

(External Terminal 102A)

The external terminals 102 shown in FIG. 5 are provided for supplying power, which is provided external of the package 114, to the LED chip 101 disposed therein. The terminals may be provided in various forms such as an electrical conductive pattern or lead frame formed on the package 114. The external terminals 102 may also be formed in various sizes in consideration of the heat diffusion, electrical conductivity and the characteristics of the LED chip 101. The external terminals 102A preferably have high heat conductivity for externally dissipating the heat generated from the LED chip 101. Electrical resistance of the external terminal 102A is preferably 300 $\mu\Omega\cdot$cm or less, and more preferably 3 $\mu\Omega\cdot$cm or less. Specifically, heat conductivity is preferably 0.01 cal/(s)(cm$^2$)(° C./cm) or more, and more preferably 0.5 cal/(s)(cm$^2$)(° C./cm) or more.

The external terminals 102 can be made of copper or phosphor bronze sheet coated with metal plating of silver, palladium, gold or the like, or solder, applied thereon. In the case where the external terminals 102 are formed in the form of lead frame, the thickness of terminal is preferably in the range from 0.1 mm to 2 mm for the convenience of processing, but various types of frames can be used depending on the electrical conductivity and heat conductivity. In the case where the external terminals 102A are formed on the supporting member made of glass epoxy resin, ceramics, or the like, the terminals may be formed of copper foil or tungsten films. When a metal foil is formed on a printed circuit board, the thickness of foil such as copper foil is preferably in the range 18 $\mu$m to 70 $\mu$m. Gold or solder plating may be formed on the copper foil.

(Conductive Wire 104)

The conductive wire 104 is required to provide good ohmic contact and mechanical connection with the electrode of the LED chip 101 and high electrical conductivity and heat conductivity. The heat conductivity is preferably 0.01 cal/(s)(cm$^2$)(° C./cm) or more, and more preferably 0.5 cal/(s)(cm$^2$)(° C./cm) or more. The diameter of the conductive wire 104 is preferably not more than 10 $\mu$m and not less than 70 $\mu$m, when the light emitting apparatus is operated at high output, or in consideration of workability. Specifically, the conductive wire 104 can be made of a metal such as gold, copper, platinum or aluminum, or an alloy thereof. The conductive wire 104 made of such a material can be used to easily connect between the electrode of the LED chip 101 and an inner lead, a mount lead, or the like, by means of a wire bonding apparatus.

(Molding Member 113)

The molding member 113 can be provided to protect the LED chip 101, the conductive wires 104, and the coating layers 111 and 112 containing the phosphor, and so on, from the outside, or for the purpose of improving the light-outgoing efficiency depending on the application of the light emitting apparatus. The molding member 113 can be formed preferably of various kinds of resin or glass. Specifically, a transparent resin having high weather resistance such as epoxy resin, urea resin, silicone resin or fluorocarbon resin, or glass can be employed as a material of the molding member 113. A diffusion agent may also be contained in the molding member in order to mitigate the directivity of light emitted from the LED chip 101 and to increase the viewing angle. The molding member 113 can be made of a material that is the same as or different from that of the binder of the coating layer.

In the case where a metal package is used to airtightly seal the LED chip 101 together with nitrogen gas, and so on, the molding member 113 is not an indispensable member in the present invention.

(Spray Apparatus 300).

Figure 6:
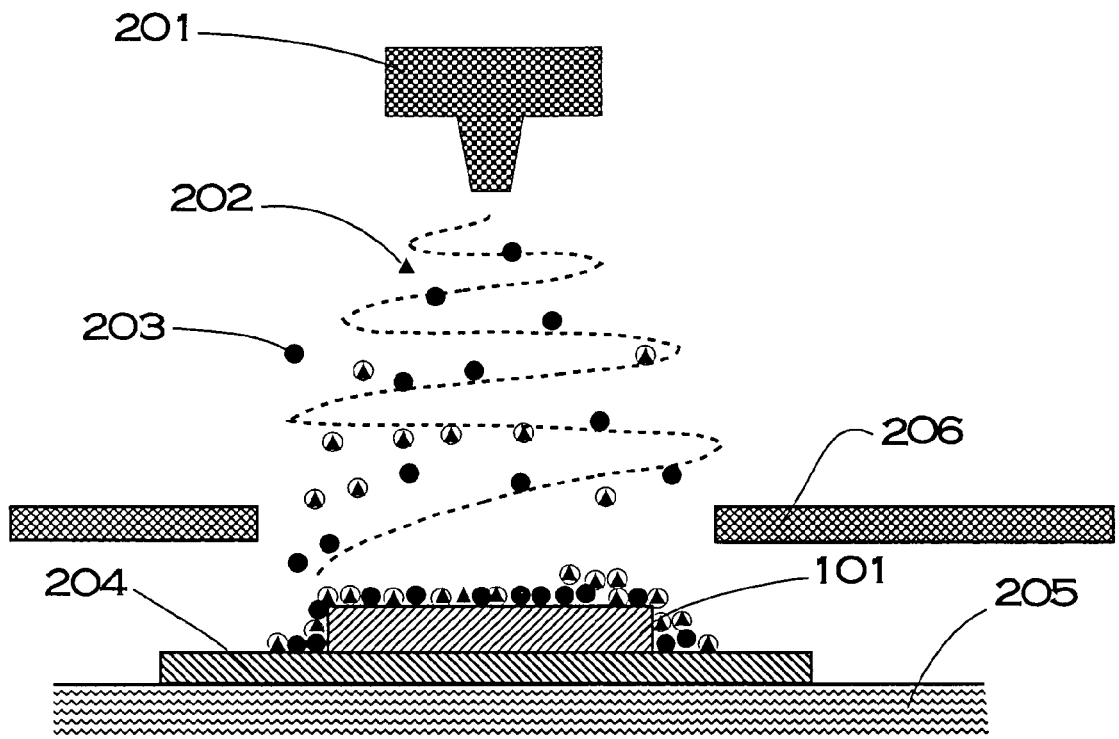
FIG. 6 is a schematic view showing a process for forming a light emitting apparatus according to the embodiment of the present invention.
Figure 7:
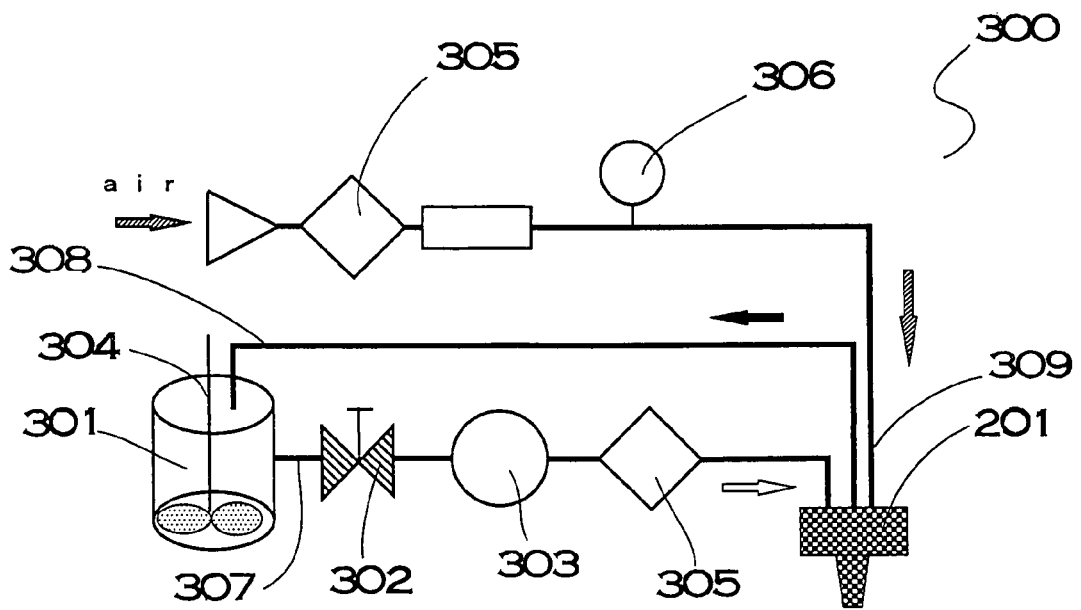
FIG. 7 is a schematic view showing an apparatus for forming a light emitting apparatus according to the embodiment of the present invention.

In this embodiment, a spray apparatus 300 is used. As shown in FIGS. 6 and 7, the spray apparatus 300 is used comprises a container 301 that contains the coating solution, a valve 302 for regulating the flow rate of the coating solution, a circulation pump 303 that sends the coating solution to the nozzle 201 and then from the nozzle 201 to the container 301, and the nozzle 201 for discharging the coating solution 203 in spiral stream, which are connected to each other through transport tubes 307, 308 and 309.

(Container 301)

The container 301 that contains the coating solution is equipped with a mixer 304 that constantly stirs the coating solution during the coating operation. The coating solution contained in the container 301 is constantly stirred by the mixer 304, so that the phosphor 202 contained in the coating solution 203 is always uniformly dispersed in the coating solution 203.

(Valve 302)

The valve 302 opens and closes so as to regulate the flow rate of the coating solution that is sent from the container 301 through the transport tube 309.

(Circulation Pump 303)

The circulation pump 303 sends the coating solution from the container 301 via the valve 302 and the compressor 305 through the transport tube 309 to the distal end of the nozzle 201 and then sends the remaining coating solution that has not been discharged from the nozzle 201 through the transport tube 308 to the container 301. Since the coating solution is sent by the circulation pump 303 from the container 301 via the valve 302 through the transport tube 309 to the distal end of the nozzle 201 and is then sent through the transport tube 308 to the container 301, the coating solution is always circulating in the spray apparatus. As a result, since the coating solution is always stirred or circulating in the spray apparatus, the phosphor contained in the coating solution is always uniformly dispersed in the coating solution during the coating operation.

(Compressor 305)

The compressor 305 is installed in the apparatus via the transport tube 307 or 309, and compresses air that is transported through the transport tube 307 and regulates the pressure of the coating solution being sent through the transport tube 309. Air that is compressed and the coating solution of which pressure is controlled by the compressor 305 are sent to the nozzle 201. The pressure of the compressed air is monitored with a pressure gage 306. The coating solution is sprayed with the high-pressured gas at high speed by means of the aforementioned spray apparatus 300, and thus is applied on the upper surface, the side surfaces, and the corners of the light emitting element.

(Nozzle 201)

In this embodiment, an apparatus which sprays the coating solution and a gas (air in this case) in a spiral stream from the nozzle 201 is used. The apparatus has several gas vents disposed around the nozzle. The gas discharged from these vents is directed at a certain angle relative to the surface to be coated. As a result, as the gas is supplied through the vents that rotate around the coating solution nozzle, the gas stream formed by all the gas discharged from the vents becomes an eddy stream, a spiral stream, or a air stream in an inverted tornado. The nozzle of this apparatus has the vent for the coating solution located at the center thereof. The coating solution is discharged simultaneously as the gas is discharged. As a result, the coating solution in the form of mist is carried by the gas stream, which is an eddy stream, a spiral stream, or a air stream in an inverted tornado, and thus diffuses.

Diameter of the spray stream diffusing in a spiral shape increases from the start position of the spray above the light emitting element as the stream is closer to the surface of the light emitting element. Rotation speed of the spray stream of the coating solution decreases from the start position of the spray above the light emitting element as the stream is closer to the surface of the light emitting element. That is, the coating solution spreads in a conical shape in the vicinity of the nozzle, which is the start position of the spray, as the spray of the coating solution is discharged from the nozzle and diffuses in the air, on the other hand, the spray expands in a cylindrical shape at a position away from the nozzle. In this embodiment, for this reason, it is preferable to adjust the distance between the bottom end of the nozzle and the upper surface of the light emitting element, so that the surface of the light emitting device is located at a position where the spray expands in a cylindrical shape. At this position, since the spray is rotating in a spiral manner at a decreased speed, the coating solution spray sufficiently covers not only the entire upper surface of the light emitting element but also the side surfaces thereof, while reaching portions of the upper surface that is hidden by the conductive wire. Accordingly, the light emitting element or the nozzle can be applied with the coating solution in the state they are secured. Since velocity of the spray has decreased at the position where the spray expands in a cylindrical shape, the surface of the light emitting element does not receive impact from the phosphor particles contained in the solution when the surface of the light emitting element is exposed to the spray. In addition, the conductive wire is not deformed nor broken, therefore, the yield and workability are improved.

(Heater 205)

As shown in FIG. 6, the light emitting element applied with the coating solution in this embodiment is heated on a heater 205 at temperature of not less than 50° C. and not more than 500° C. The light emitting element may be heated in an oven or the like, as another manner of heating a light emitting element. As ethanol and a small amount of moisture and solvent contained in the hydrolysate solution in the form of sol are evaporated by heating, mainly amorphous $Al(OH)_3$ or AlOOH is obtained from the sol of coating solution 203. Since the coating solution 203 in this embodiment has a controlled level of viscosity, the solution does not flow out of the upper surface, side surfaces and corners of the light emitting element and the surface of the supporting member 204 where it has been sprayed, and is heated at the place immediately after being sprayed. As a result, the upper surface, the side surfaces and corners of the light emitting element can be covered with the coating layer with the phosphor 202 bound by AlOOH.

In this embodiment, the light emitting element is die-bonded onto the supporting member 204 by heating the adhesive solution at temperature of not less than 50° C. and not more than 500° C. The heating may be carried out by placing the light emitting element on a heater or in an oven or the like. As ethanol and a small amount of moisture and solvent contained in the hydrolysate solution in the form of sol are evaporated by heating, the adhesive solution in the state of gel is turned into an adhesion layer formed of particles, which consists principally of AlOOH having particle with of several nanometers and are highly aggregate. The adhesion layer is formed of aggregate of particles consisting principally of the inorganic material with size of several nanometers. Voids exist between the particles. When the temperature sharply varies, the particles of the adhesion layer expand or contract. As a result, dissimilarly to the case where the light emitting element is bonded by means of molten glass or a resin having a thermal expansion coefficient significantly different from that of the supporting body without the aforementioned particles, the adhesion layer of this embodiment of the present invention as a whole is not subject to substantial thermal stress. Accordingly, peel-off or crack does not appear. As a result, the light emitting apparatus according to this embodiment of the present invention can maintain high reliability even when used in a situation subject to significant temperature variation.

Furthermore, since the adhesive solution of this embodiment is controlled so as to have a high viscosity, it is interposed between the bottom surface of the light emitting element and the surface of the supporting member, and does not flow away from the side surfaces of the light emitting element where it extends. The adhesive solution is solidified in the place after die bonding and heating. Thus, it is possible to provide a light emitting apparatus having the light emitting element is die-bonded onto the surface of the supporting member by AlOOH and does not dislocate from the position where it is initially disposed.

(Mask 206)

In this embodiment, in the state where a plurality of packages are disposed, the light emitting elements are die-bonded onto the packages, and the electrodes of the light emitting element are connected to the external terminals by wire-bonding. After that, the coating solution 203 is sprayed onto the light emitting elements from the upper side. However, in the case where the side surfaces of the recessed portion of the package 204 are tapered and are used as reflecting surfaces for improving the light-outgoing efficiency frontward of the package, when the coating solution adheres on the side surfaces of the recessed portion, light emitted from the light emitting element is diffused on the side surfaces. Thus, the light-outgoing efficiency frontward of the package cannot be improved. According to this embodiment, in order to prevent the coating solution 203 from adhering on the side surfaces of the recessed portion of the package and on the external terminals, the coating solution 203 is sprayed onto the surface of the light emitting device from the upper side of a mask 206. The mask 206 is a sheet that completely covers the side surfaces of the recessed portion of the package and the external terminals, and has openings of such a size that allows the coating solution 203 to coat on the upper surface, side surfaces and corners of the light emitting element. The mask can be made of a metal, a reinforced plastic, or the like.

(Adhesion Layer 110)

The adhesion layer 110 used in this embodiment is an amorphous inorganic material layer formed by heating and drying an organic material in the state of sol interposed between the light emitting element and the supporting member in intimate contact with each other. The adhesion layer according to this embodiment of the present invention is a colorless transparent layer that continuously exists between the upper surface of the supporting member and the bottom surface of the light emitting element and extends over the side surfaces of the light emitting element.

Reflection by the package, or the like, increases high-energy light emitted from the LED chip to high density in the adhesion layer. Accordingly, in the case where a nitride group semiconductor, which can provide high luminescence intensity and can emit high-energy light, is used as an LED chip, it is preferable that a hydroxide oxide containing at least one metallic element selected from the group consisting of Si, Al, Ga, Ti, Ge, P, B, Zr, Y, Sn, Pb and alkali earth metals with resistance for high-energy light is used as the adhesion solution for the light emitting element and the supporting member. In addition, the aforementioned hydroxide oxide may be used as the adhesion layer.

Specifically, a transparent inorganic member $SiO_2$, $Al_2O_3$, $ZrO_2$, $Y_2O_3$, and $MSiO_3$ (where, M is Zn, Ca, Mg, Ba, Sr, or the like) can be preferably used as the main material of the adhesion layer. The bottom surface of the light emitting element and the upper surface of the supporting member are opposed to each other so as to interpose the transparent inorganic member between them, thus, the light emitting element is secured on the supporting member. In this embodiment, the oxide containing at least one element selected from the group consisting of Si, Al, Ga, Ti, Ge, P, B, Zr, Y, Sn, Pb and alkali earth metals is produced from an organometallic compound similarly to the material used to form the coating layer. When an organometallic compound of liquid in room temperature is employed, adding the organic solvent can easily provide viscosity adjustment in consideration of the workability, or prevent appearance of congelation of organometallic compound, or the like. Accordingly, workability can be improved. Since such an organometallic compound can easily undergo chemical reaction such as hydrolysis and produce inorganic substances such as oxide and hydroxide, the adhesion layer can be easily formed without reduction of the performance of the LED to emit light by the oxide containing at least one element selected from the group consisting of Si, Al, Ga, Ti, Ge, P, B, Zr, Y, Sn, Pb and alkali earth metals. However, since some elements that tends to be colored is included in these elements, it is necessary to select suitably depending on the applications. In addition, since the binder of the hydroxide oxide according to this embodiment also has light resistance and heat resistance, it may be used as the adhesion layer.

Furthermore, in the case where the adhesion layer extends over the side surfaces of the light emitting element, when metallic solder is die-bonded, a metal that absorbs light emitted from the light emitting element in the region from near ultraviolet to blue may be contained in the metal solder. When the light emitting element is die-bonded by Au—Sn eutectic solder, for example, Au absorbs light emitted from the light emitting element in the region from near ultraviolet to blue. This causes a problem that decreases the output power of the light emitting apparatus. The adhesion layer according to this embodiment does not absorb light emitted from the light emitting element in the region from near ultraviolet to blue. Therefore, it is possible to provide a light emitting apparatus with high efficiency of light emission.

Third Embodiment

Figure 8:
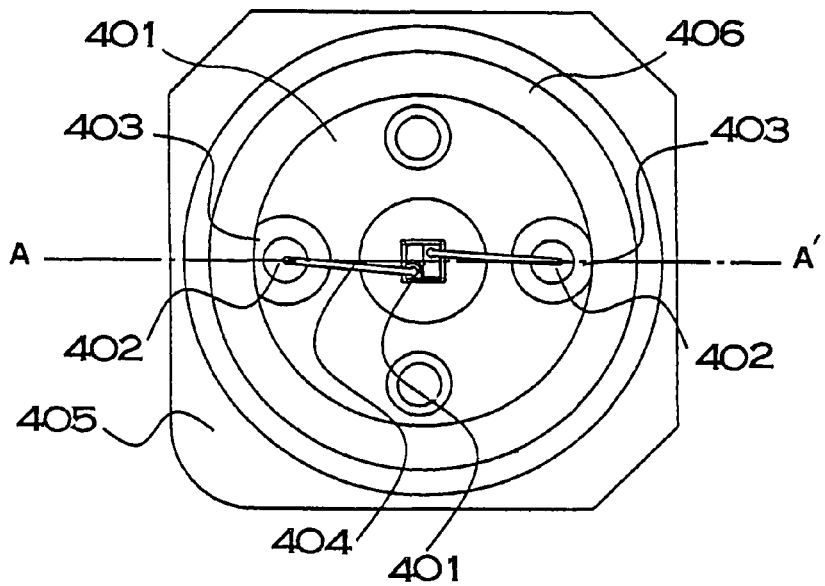
FIG. 8 is a plan view schematically showing a light emitting apparatus according to a third embodiment of the present invention.
Figure 9:
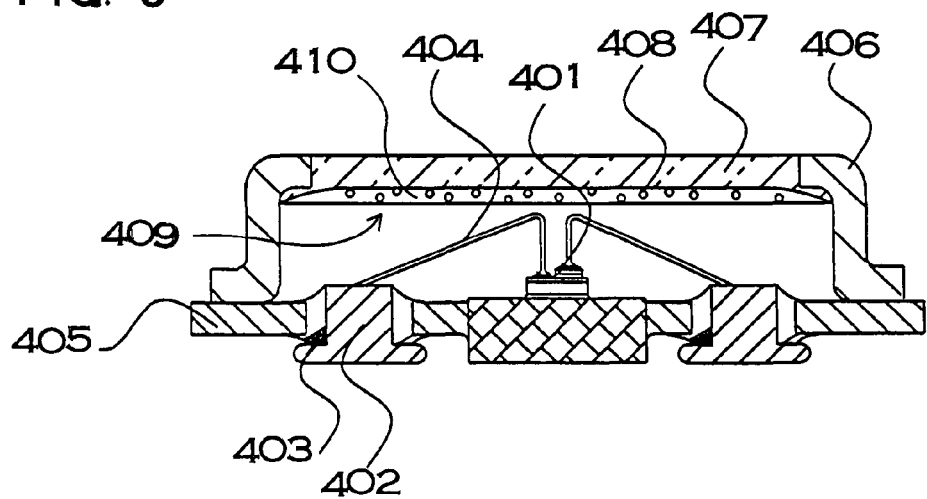
FIG. 9 is a cross-sectional view of the light emitting apparatus of FIG. 8 as seen along the line A-A'.

With reference to FIGS. 8 and 9, a light emitting apparatus according to a third embodiment of the present invention is described. FIG. 8 is a plan view of the light-emitting apparatus. FIG. 9 is a cross-sectional view of the light emitting apparatus of FIG. 8 as seen along the line A-A'. A phosphor member used in the light emitting apparatus according to the third embodiment can be used the phosphor member same as in the first embodiment. A light emitting element 401, which has an InGaN group semiconductor layer with light emission peak of 460 nm in the blue range as a light emitting layer, is used. A p-type semiconductor layer and an n-type semiconductor layer (not shown) are formed in the light emitting element 401. The conductive wires 404 connected to lead terminals 402 are formed on the p-type semiconductor layer and the n-type semiconductor layer. An insulating mold material 402 is formed so as to cover the peripheral of the lead terminal 403, and prevents a short circuit. A transparent window portion 407 is disposed above the light emitting element 401 so as to extend from a lid 406 on the upper part of a package 405. A binder 410 uniformly including a phosphor 408 is applied to substantially the whole interior surface of the transparent window portion 407 as a luminescent film 409.

As discussed above, in the light emitting apparatus of FIGS. 8 and 9, the luminescent film 409 containing the phosphor is spaced upwardly away of the LED chip. Although, in this respect, the apparatus of this embodiment is different from the structure of the aforementioned light emitting apparatus of FIGS. 3 and 4, the other parts are substantially same, and similar phosphor and binder can be used. The luminescent film may have multi-layer structure. In this case, the luminescent film may include layers each of which contains different phosphors, or a layer without a phosphor combined therein. The luminescent film of FIGS. 8 and 9 may be replaceable to separate from the light emitting apparatus. In this case, it is possible to change the luminescent color or to replace a deteriorated luminescent film.

Fourth Embodiment

Figure 10:
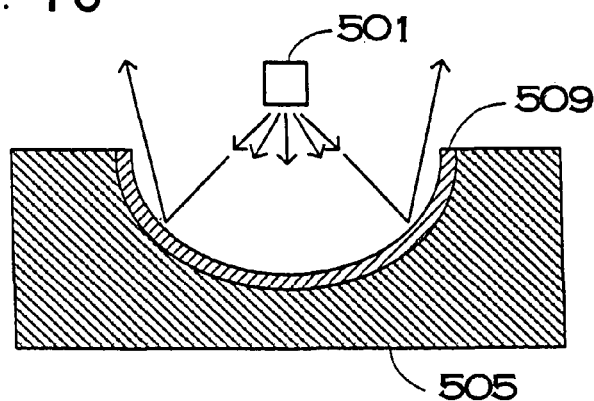
FIG. 10 is a cross-sectional view schematically showing a light emitting apparatus according to a fourth embodiment of the present invention.

FIG. 10 shows a light emitting apparatus according to a fourth embodiment of the present invention. In the light emitting apparatus shown in this Figure, on the contrary to the foregoing embodiment, an LED is located upward of a package 505 as a light emitting element 501. A recessed portion, which is curved downward of the package 505, is formed. A luminescent layer 509 is formed on this surface. In this construction, the aforementioned multi-layer structure composed of a phosphor and a binder can be also used. In addition, its layer structure can have multi-layer structure similarly to the foregoing embodiment.

Fifth Embodiment

Figure 17:
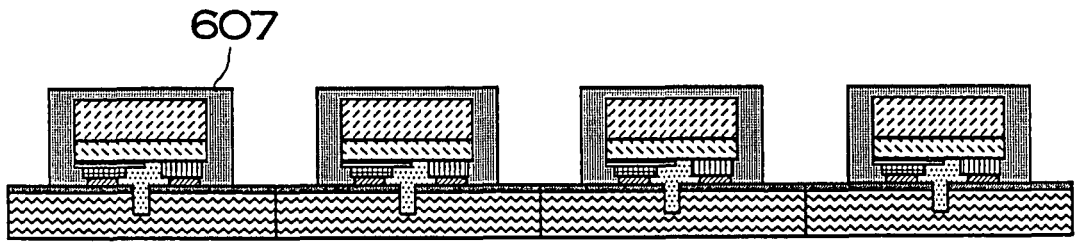
FIG. 17 is a cross-sectional view schematically showing a process for producing a light emitting apparatus according to the fifth embodiment of the present invention.
Figure 18:
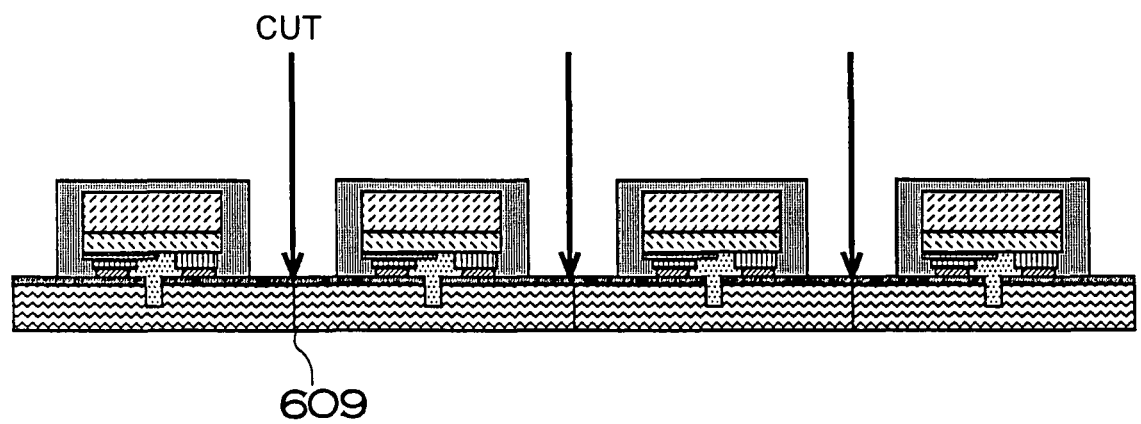
FIG. 18 is a cross-sectional view schematically showing a process for producing a light emitting apparatus according to the fifth embodiment of the present invention.
Figure 19:
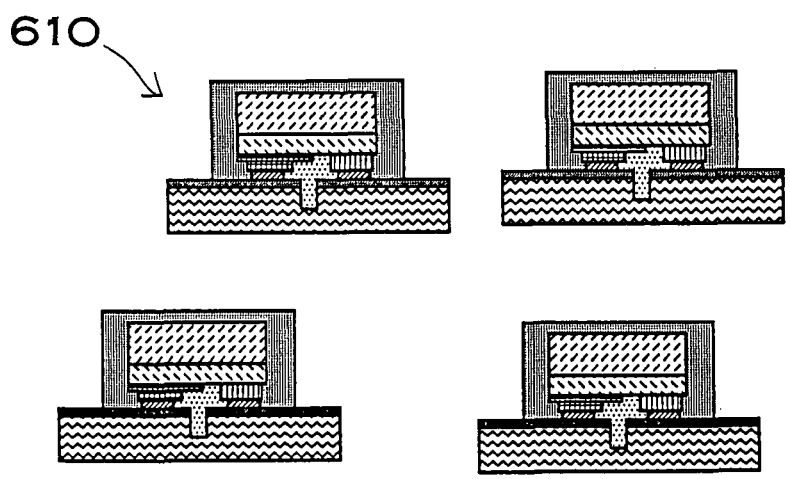
FIG. 19 is a cross-sectional view schematically showing a light emitting apparatus according to the fifth embodiment of the present invention.

FIGS. 11 to 22 show a light emitting apparatus according to a fifth embodiment of the present invention. In the light emitting apparatus shown in these Figures, as shown in FIG. 19, a light emitting element is disposed so that the side where electrodes thereof provided is opposed to a base plate. A method for forming a light emitting apparatus shown in FIG. 19 is described with reference to FIGS. 11 to 18.

Figure 11:
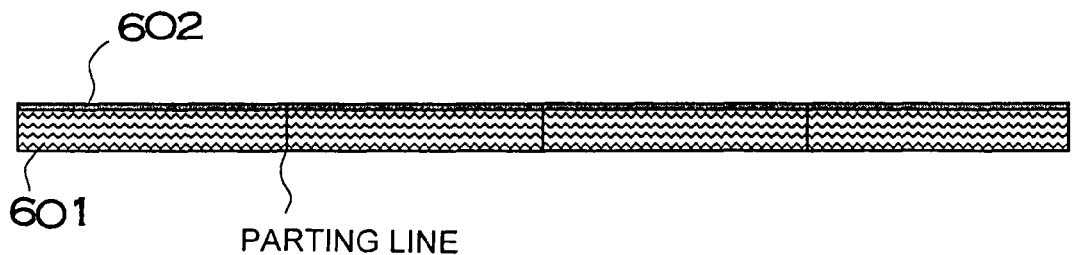
FIG. 11 is a cross-sectional view schematically showing a process for producing a light emitting apparatus according to a fifth embodiment of the present invention.
Figure 12:
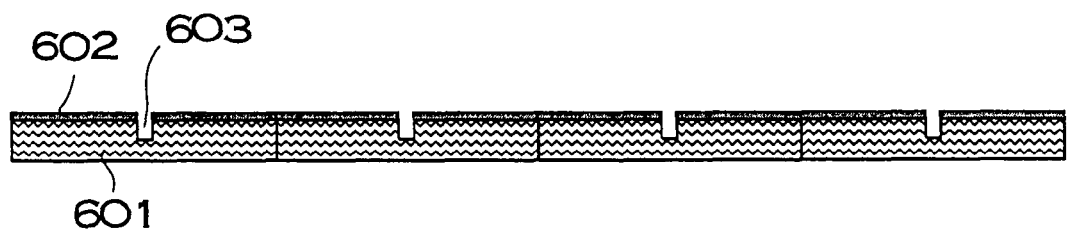
FIG. 12 is a cross-sectional view schematically showing a process for producing a light emitting apparatus according to the fifth embodiment of the present invention.

First, as shown in FIG. 11, a conductive member 602 is provided on the surface of a submount base plate 601. As shown in FIG. 12, conductive patterns are formed to provide insulating portions 603, each of which separate the conductive members 602 to be connected to positive electrode and negative electrode of a light emitting element 600.

It is preferable that the material of the submount base plate 601 is a material with coefficient of thermal expansion substantially equal to a semiconductor light emitting element, for example, aluminium nitride. The thermal stress generated between the submount base plate 601 and the light emitting element 600 can be mitigated by employing such a material. Alternatively, the material of the submount base plate 601 is preferably silicon, which protection element can be formed on and is inexpensive. It is preferable to use silver or gold with high reflectivity as the conductive member 602.

Figure 13:
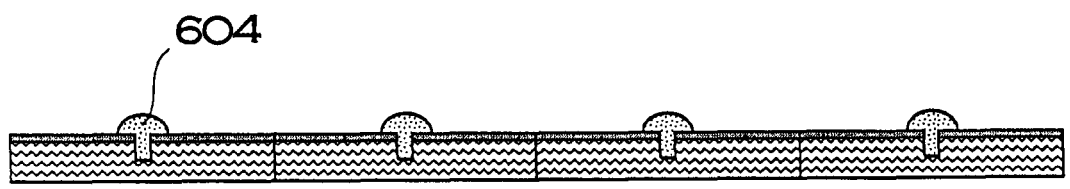
FIG. 13 is a cross-sectional view schematically showing a process for producing a light emitting apparatus according to the fifth embodiment of the present invention.

In order to improve the reliability of the light emitting apparatus, the space defined by positive and negative electrodes of the light emitting element 600 and the insulating portion 603 is filled with an under fill 604. As shown in FIG. 13, the under fill 604 is provide in the periphery of the insulating portion 603 of the aforementioned submount base plate 601. The material of the under fill 604 is a thermosetting resin, such as an epoxy resin. In addition, in order to mitigate the thermal stress of the under fill 604, aluminum nitride, aluminum oxide, a mixture compound of them, and so on, may be mixed in the epoxy resin. The amount of the under fill 604 is the extent to fill the space defined by the positive and negative electrodes of the light emitting element 600 and the submount base plate 601 where the insulating portion 603 extends.

Figure 14:
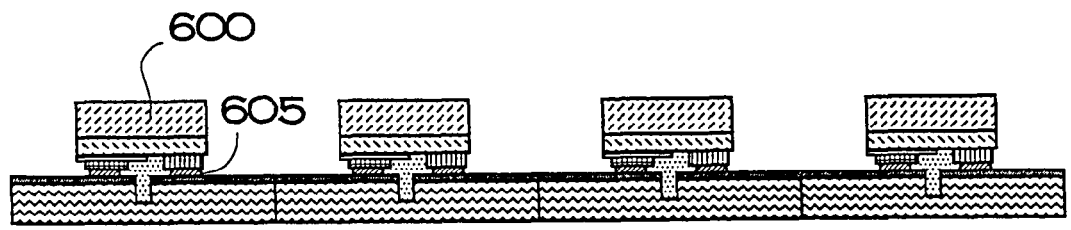
FIG. 14 is a cross-sectional view schematically showing a process for producing a light emitting apparatus according to the fifth embodiment of the present invention.

Subsequently, as shown in FIG. 14, the positive and negative electrodes of the light emitting element 600, such as an LED chip produced separately, is fastened so as to oppose the positive and negative terminals of the aforementioned conductive pattern, respectively. The conductive material 605 is adhered to the positive and negative electrodes of the light emitting element 600. For example, the material of the conductive material 605 is Au, eutectic solder (Au—Sn), Pb—Sn, lead free solder, or the like. In the state where the under fill 604 is soft, the positive and negative electrodes of the light emitting element 600 is opposed to the positive and negative terminals of the aforementioned conductive pattern so as to interpose the conductive material 605 between the electrode and terminal. The positive and negative electrodes of the light emitting element 600, the conductive material 605, and the aforementioned conductive pattern are then bonded by thermocompression. In this thermocompression bonding, the under fill 604 between the conductive material and positive or negative terminal of the aforementioned conductive pattern is removed.

Figure 15:
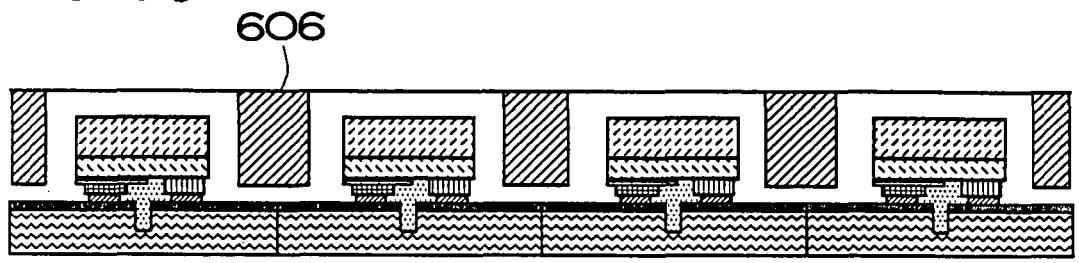
FIG. 15 is a cross-sectional view schematically showing a process for producing a light emitting apparatus according to the fifth embodiment of the present invention.

As shown in FIG. 15, a screen plate 606 is provided from the substrate side of the light emitting element 600. Instead of the screen plate, a metal mask may be provided a position where a phosphor layer should not be formed such as a ball bonding position of the conductive wire, and a parting line formation position.

Figure 16:
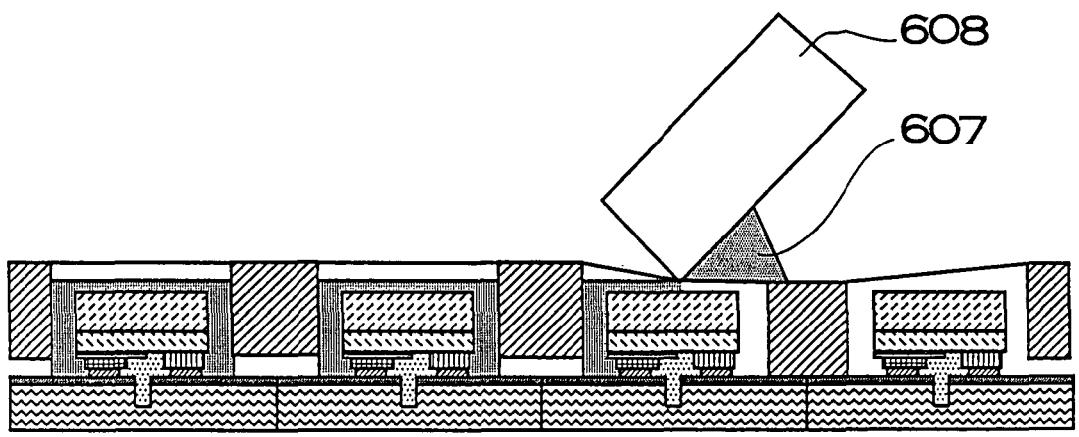
FIG. 16 is a cross-sectional view schematically showing a process for producing a light emitting apparatus according to the fifth embodiment of the present invention.

As shown in FIG. 16, a phosphor layer formation material 607 containing a phosphor in alumina sol with thixotropy is adjusted, and is provided by screen printing with a squeegee (spatula) 608.

As shown in FIG. 17, the screen plate is detached, and the phosphor layer formation material 607 is cured. As shown in FIG. 18, cutting element by element along with the parting lines 609 can provide light emitting apparatuses 610 with the phosphor layer shown in FIG. 19.

Figure 20:
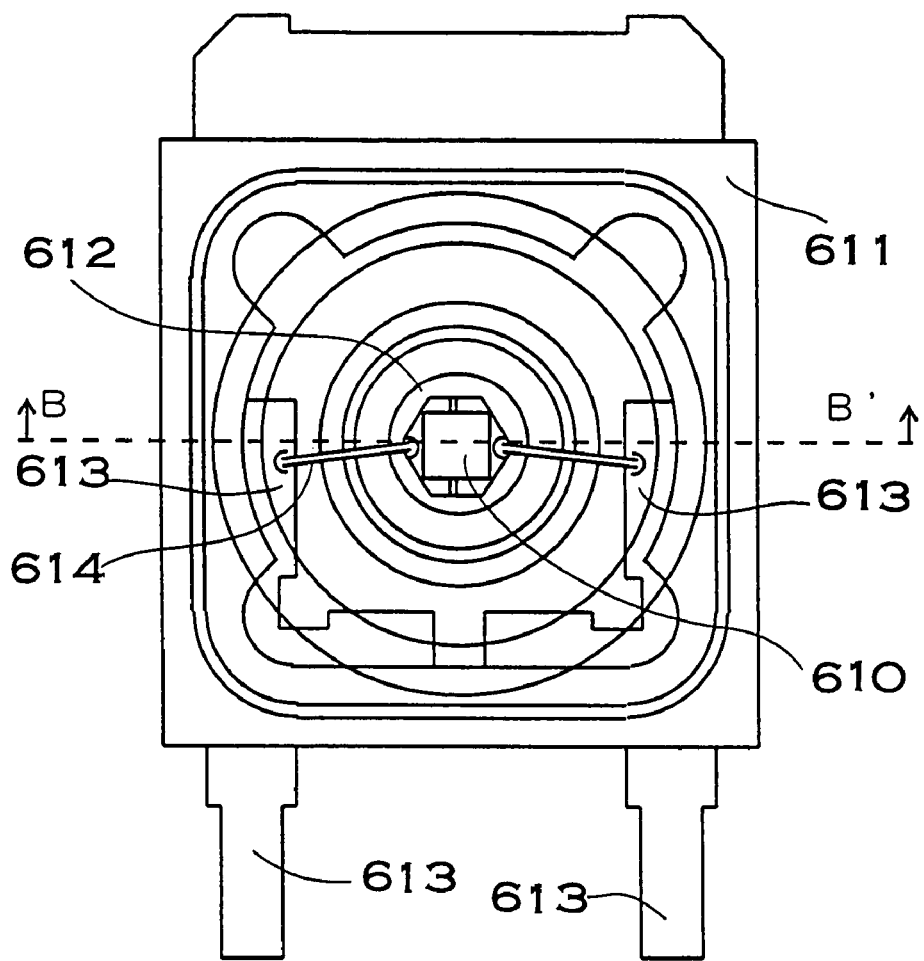
FIG. 20 is a plan view schematically showing another light emitting apparatus according to the fifth embodiment of the present invention.
Figure 21:
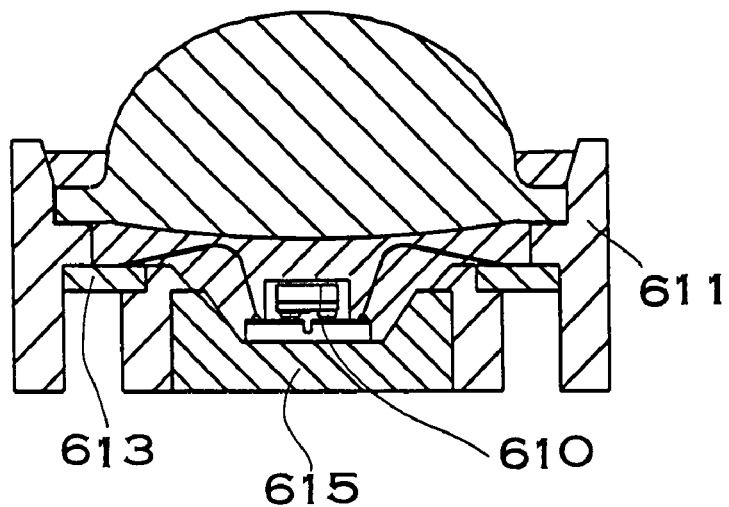
FIG. 21 is a cross-sectional view of the light emitting apparatus of FIG. 20 as seen along the line B-B'.
Figure 22:
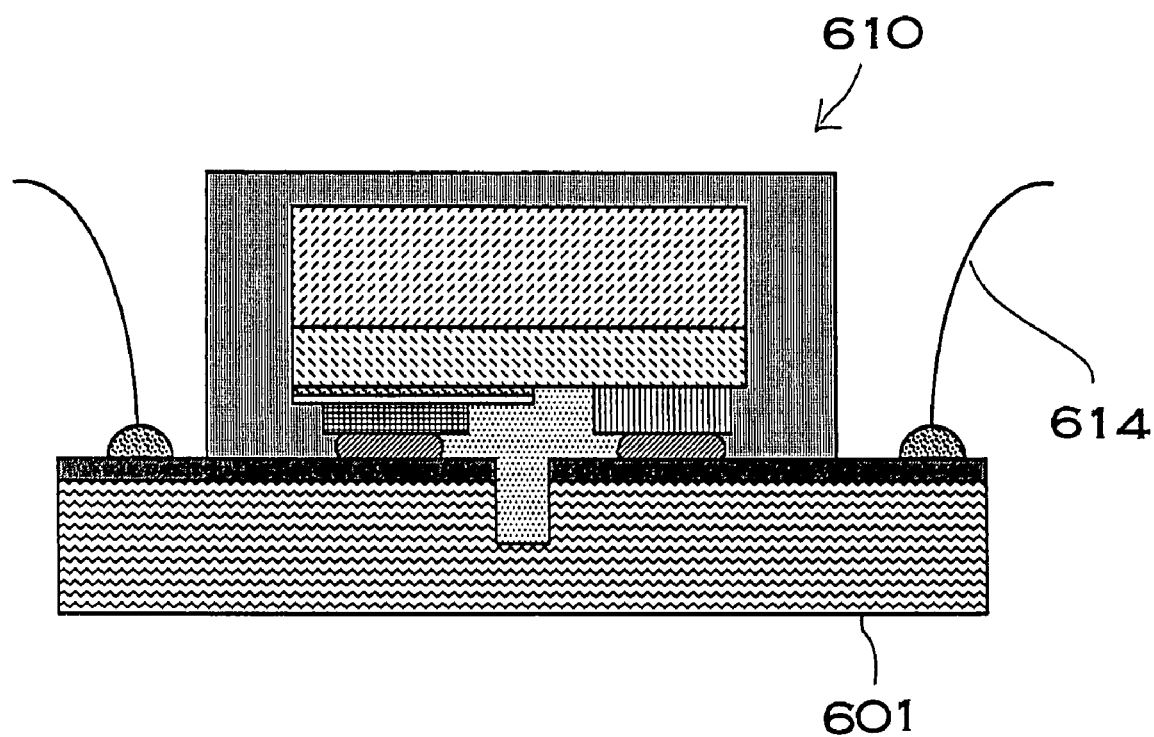
FIG. 22 is a principle part cross-sectional view of the light emitting apparatus of FIG. 21.

A light emitting apparatus composed of the light emitting apparatus 610 fastened on a support member, or the like, may be provided. FIGS. 20 to 22 show an exemplary light emitting apparatus composed of the light emitting apparatus 610 with the phosphor layer fastened to a support member 611 with a recessed portion 612. FIG. 20 is a plan view of the light emitting apparatus. FIG. 21 is a cross-sectional view as seen along the B-B' line of FIG. 20. FIG. 22 is an enlarged view of FIG. 21. In the light emitting apparatus shown in these Figures, the light emitting apparatus 610 with a phosphor layer is fastened on the bottom of the recessed portion 612 provided on a metal base member 615 of the support members 611, such as the package, with an adhesive agent, such as Ag paste. An exposed lead terminal 613 is connected to the conductive pattern provided in the submount base plate 601 by a conductive wire 614.

In the light emitting apparatus discussed above, a phosphor with coating or being coated with a coating material may be used. In the light emitting apparatus having a luminescent layer composed of the aforementioned inorganic binder consisting principally of a hydroxide oxide, and filler, its structure is not specifically limited. For example, in the case where the aforementioned light emitting element is mounted downward, a luminescent layer is formed on the sapphire substrate, or the like. A luminescent layer may be formed in the surface of a tube of a high-pressure mercury lamp.

EXAMPLES 1 to 29

Examples of the present invention is shown. First, phosphor slurry was prepared by employing alumina sol and yttrium sol, thus, phosphor/sol slurry was obtained.

EXAMPLE 1

10 g of alumina sol available on the market (Al520 of Nissan Chemical Industries, Ltd.) was provided in a 100 ml beaker, and then ethanol was added at 50% by weight relative to the alumina sol, and mixed. 10 g of phosphor material YAG was added thereto and sufficiently stirred, thus, mixed phosphor/sol slurry was obtained.

EXAMPLE 2

10 g of alumina sol available on the market (Al200 of Nissan Chemical Industries, Ltd.) was provided in a 100 ml beaker, and then ethanol was added at 70% by weight relative to the alumina sol, and mixed. 10 g of phosphor material YAG was added thereto and sufficiently stirred, thus, mixed phosphor/sol slurry was obtained.

EXAMPLE 3

10 g of alumina sol available on the market (CATALOID AS3 of Catalysts & Chemicals Industries Co., Ltd.) Was provided in a 100 ml beaker, and then ethanol was added at 50% by weight relative to the alumina sol, and mixed. 10 g of phosphor material YAG was added thereto and sufficiently stirred, thus, mixed phosphor/sol slurry was obtained.

EXAMPLE 4

10 g of yttrium oxide sol available on the market (yttrium oxide sol of Taki Chemical Co., Ltd.) was provided in a 100 ml beaker, and then ethanol was added at 50% by weight relative to the yttria sol, and mixed. 10 g of phosphor material YAG was added thereto and sufficiently stirred, thus, mixed phosphor/sol slurry was obtained.

EXAMPLE 5

10 g of alumina sol available on the market (Al520 of Nissan Chemical Industries, Ltd.) was provided in a 100 ml beaker, and then ethanol was added at 50% by weight relative to the alumina sol, and mixed. 10 g of phosphor material SAE was added thereto and sufficiently stirred, thus, mixed phosphor/sol slurry was obtained.

EXAMPLE 6

10 g of alumina sol available on the market (Al200 of Nissan Chemical Industries, Ltd.) was provided in a 100 ml beaker, and then ethanol was added at 70% by weight relative to the alumina sol, and mixed. 10 g of phosphor material SAE was added thereto and sufficiently stirred, thus, mixed phosphor/sol slurry was obtained.

EXAMPLE 7

10 g of alumina sol available on the market (CATALOID AS3 of Catalysts & Chemicals Industries Co., Ltd.) was provided in a 100 ml beaker, and then ethanol was added at 50% by weight relative to the alumina sol, and mixed. 10 g of phosphor material SAE was added thereto and sufficiently stirred, thus, mixed phosphor/sol slurry was obtained.

EXAMPLE 8

10 g of yttria sol available on the market (yttria oxide sol of Taki Chemical Co., Ltd.) was provided in a 100 ml beaker, and then ethanol was added at 70% by weight relative to the yttria sol, and mixed. 10 g of phosphor material SAE was added thereto and sufficiently stirred, thus, mixed phosphor/sol slurry was obtained.

EXAMPLE 9

10 g of alumina sol available on the market (Al200 of Nissan Chemical Industries, Ltd.) was provided in a 100 ml beaker, and then ethanol was added at 50% by weight relative to the alumina sol, and mixed. 10 g of phosphor material BAM was added thereto and sufficiently stirred, thus, mixed phosphor/sol slurry was obtained.

EXAMPLE 10

10 g of yttria sol available on the market (yttria oxide sol of Taki Chemical Co., Ltd.) was provided in a 100 ml beaker, and then ethanol was added at 50% by weight relative to the yttria sol, and mixed. 10 g of phosphor material CCA-1 was added thereto and sufficiently stirred, thus, mixed phosphor/sol slurry was obtained.

EXAMPLE 11

10 g of yttria sol available on the market (yttria oxide sol of Taki Chemical Co., Ltd.) was provided in a 100 ml beaker, and then ethanol was added at 50% by weight relative to the yttria sol, and mixed. 10 g of phosphor material CCA-2 was added thereto and sufficiently stirred, thus, mixed phosphor/sol slurry was obtained.

EXAMPLE 12

10 g of yttria sol available on the market (yttria oxide sol of Taki Chemical Co., Ltd.) was provided in a 100 ml beaker, and then ethanol was added at 50% by weight relative to the yttria sol, and mixed. 10 g of phosphor material CCBE was added thereto and sufficiently stirred, thus, mixed phosphor/sol slurry was obtained.

EXAMPLE 13

10 g of yttria sol available on the market (yttria oxide sol of Taki Chemical Co., Ltd.) was provided in a 100 ml beaker, and then ethanol was added at 50% by weight relative to the yttria sol, and mixed. 10 g of phosphor material SAE was added thereto and sufficiently stirred, thus, mixed phosphor/sol slurry was obtained.

EXAMPLE 14

10 g of yttria sol available on the market (yttria oxide sol of Taki Chemical Co., Ltd.) was provided in a 100 ml beaker, and then ethanol was added at 50% by weight relative to the yttria sol, and mixed. 10 g of phosphor material CESN was added thereto and sufficiently stirred, thus, mixed phosphor/sol slurry was obtained.

Examples 15 to 23 in which LEDs are produced in various conditions is shown.

EXAMPLE 15-1

Yttria sol available on the market (yttria oxide sol of Taki Chemical Co., Ltd.) was provided in a 100 ml beaker, and then ethanol was added at 50% by weight relative to the yttria sol, and mixed. A phosphor material YAG was added thereto at a prescribed rate and sufficiently stirred, thus, mixed phosphor/sol slurry was obtained. A semiconductor light emitting element with wavelength of 460 nm was combined with this, thus, an LED emitting white light was produced.

EXAMPLE 15-2

Alumina sol available on the market (alumina sol 200 of Nissan Chemical Industries, Ltd.) was provided in a 100 ml beaker, and then ethanol was added at 50% by weight relative to the alumina sol, and mixed. A phosphor material YAG was added thereto at a prescribed rate and sufficiently stirred, thus, mixed phosphor/sol slurry was obtained. A semiconductor light emitting element with wavelength of 460 nm was combined with this, thus, an LED emitting white light was produced.

EXAMPLE 16

Yttria sol available on the market (yttria oxide sol of Taki Chemical Co., Ltd.) was provided in a 100 ml beaker, and then ethanol was added at 50% by weight relative to the yttria sol, and mixed. Phosphor materials YAG and calcium silicon nitride activated by europium were added thereto at a prescribed rate and sufficiently stirred, thus, mixed phosphor/sol slurry was obtained. A semiconductor light emitting element with wavelength of 460 nm was combined with this, thus, an LED emitting light of electric bulb color was produced.

EXAMPLE 17-1

Alumina sol available on the market (alumina sol 200 of Nissan Chemical Industries, Ltd.) was provided in a 100 ml beaker, and then ethanol was added at 50% by weight relative to the alumina sol, and mixed. Phosphor materials YAG and calcium chloroapatite activated by europium and manganese were added thereto at a prescribed rate and sufficiently stirred, thus, mixed phosphor/sol slurry was obtained. A semiconductor light emitting element with wavelength of 400 nm was combined with this, thus, an LED emitting white light was produced.

EXAMPLE 17-2

Yttria sol available on the market (yttria oxide sol of Taki Chemical Co., Ltd.) was provided in a 100 ml beaker, and then ethanol was added at 50% by weight relative to the yttria sol, and mixed. Phosphor materials YAG and calcium chloroapatite activated by europium and manganese were added thereto at a prescribed rate and sufficiently stirred, thus, mixed phosphor/sol slurry was obtained. A semiconductor light emitting element with wavelength of 400 nm was combined with this, thus, an LED emitting white light was produced.

EXAMPLE 18

Yttria sol available on the market (yttria oxide sol of Taki Chemical Co., Ltd.) was provided in a 100 ml beaker, and then ethanol was added at 50% by weight relative to the yttria sol, and mixed. Phosphor materials YAG, calcium chloroapatite activated by europium and manganese, and calcium silicon nitride activated by europium were added thereto at a prescribed rate and sufficiently stirred, thus, mixed phosphor/sol slurry was obtained. A semiconductor light emitting element with wavelength of 400 nm was combined with this, thus, an LED emitting light of electric bulb color was produced.

EXAMPLE 19

Alumina sol available on the market (alumina sol 200 of Nissan Chemical Industries, Ltd.) was provided in a 100 ml beaker, and then ethanol was added at 50% by weight relative to the alumina sol, and mixed. Phosphor materials calcium chloroapatite activated by europium, barium magnesium aluminate activated by europium and manganese, and strontium silicon nitride activated by europium were added thereto at a prescribed rate and sufficiently stirred, thus, mixed phosphor/sol slurry was obtained. A semiconductor light emitting element with wavelength of 400 nm was combined with this, thus, an LED emitting white light was produced.

EXAMPLE 20

Alumina sol available on the market (alumina sol 200 of Nissan Chemical Industries, Ltd.) was provided in a 100 ml beaker, and then ethanol was added at 50% by weight relative to the alumina sol, and mixed. A phosphor material strontium aluminate activated by europium was added thereto at a prescribed rate and sufficiently stirred, thus, mixed phosphor/sol slurry was obtained. A semiconductor light emitting element with wavelength of 365 nm was combined with this, thus, an LED emitting bluish green light for signal light was produced.

EXAMPLE 21

Alumina sol available on the market (alumina sol 200 of Nissan Chemical Industries, Ltd.) was provided in a 100 ml beaker, and then ethanol was added at 50% by weight relative to the alumina sol, and mixed. A phosphor material barium silicon nitride activated by europium was added thereto at a prescribed rate and sufficiently stirred, thus, mixed phosphor/sol slurry was obtained. A semiconductor light emitting element with wavelength of 365 nm was combined with this, thus, an LED emitting yellow light for signal light was produced.

EXAMPLE 22

Yttria sol available on the market (yttria oxide sol of Taki Chemical Co., Ltd.) was provided in a 100 ml beaker, and then ethanol was added at 50% by weight relative to the yttria sol, and mixed. Phosphor materials YAG, barium magnesium aluminate activated by europium, and calcium strontium silicon nitride activated by europium were added thereto at a prescribed rate and sufficiently stirred, thus, mixed phosphor/sol slurry was obtained. A semiconductor light emitting element with wavelength of 365 nm was combined with this, thus, an LED emitting light of electric bulb color was produced.

EXAMPLE 23

Yttria sol available on the market (yttria oxide sol of Taki Chemical Co., Ltd.) was provided in a 100 ml beaker, and then ethanol was added at 50% by weight relative to the yttria sol, and mixed. Phosphor materials calcium chloroapatite activated by europium, barium magnesium aluminate activated by europium and manganese, and calcium silicon nitride activated by europium were added thereto at a prescribed rate and sufficiently stirred, thus, mixed phosphor/sol slurry was obtained. A semiconductor light emitting element with wavelength of 365 nm was combined with this, thus, an LED emitting white light was produced.

Figure 23:
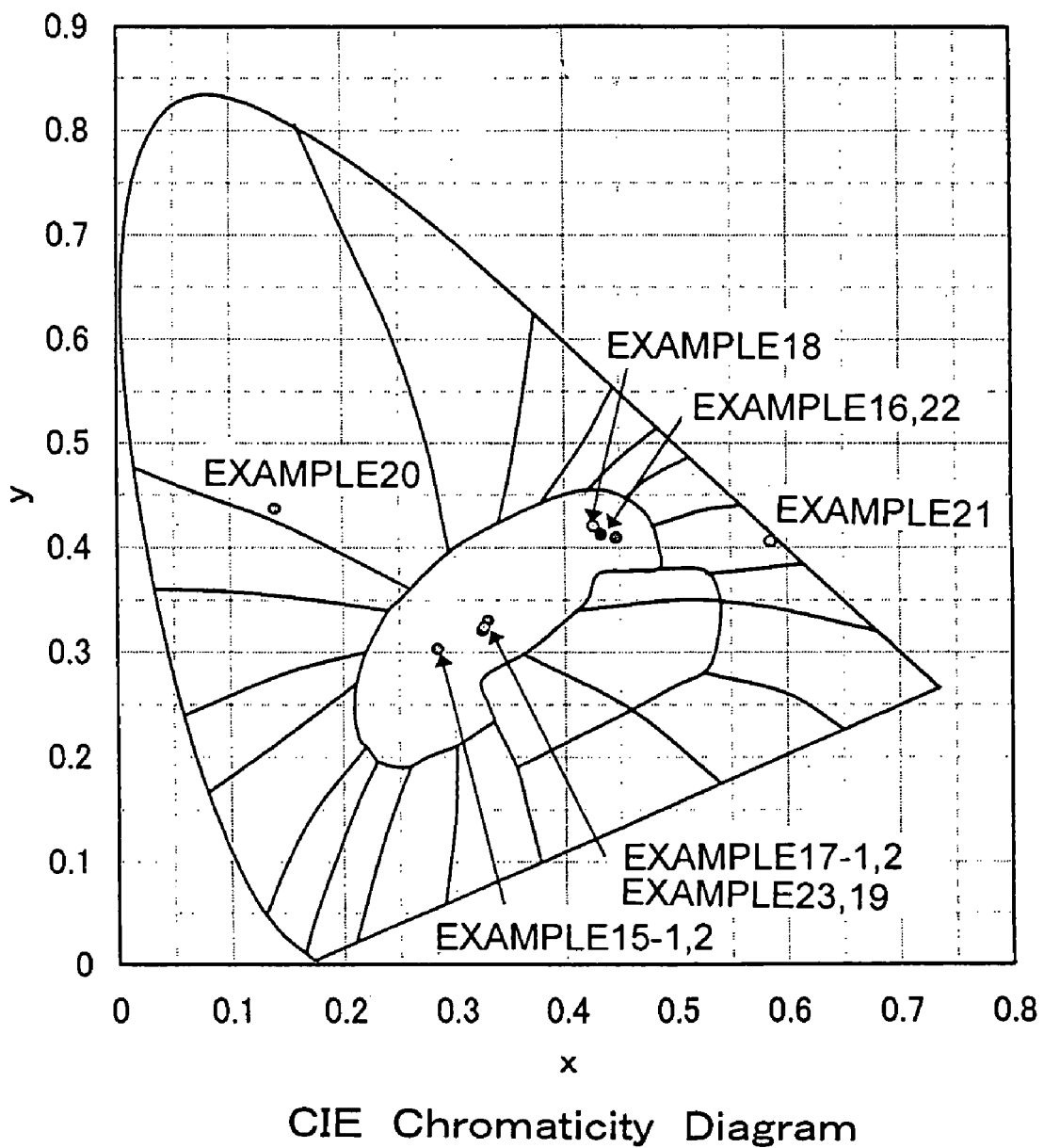
FIG. 23 is a chromaticity diagram showing the chromaticity of phosphors according to examples 15 to 23 of the present invention.

The combinations of phosphors, binders, and LEDs according to the foregoing examples 15-1 to 23 are shown in Table 1. FIG. 23 is a chromaticity diagram showing luminescent colors. The luminescent colors of the LEDs according to these examples were as follows. The example 15-1 and 15-2 were white. The example 16 was electric bulb color. The example 17-1 and 17-2 were high color rendering white. The examples 18 and 22 were electric bulb color. The examples 19 and 23 were three-wavelength type white. The example 20 was bluish green for signal light. The example 21 was yellow for signal light.

TABLE 1

| Exs. | Binder | Phosphor | LED (nm) | Color tone x | Color tone y |
|---|---|---|---|---|---|
| Ex. 15-1 | Yttria | (1) YAG | 460 | 0.283 | 0.305 |
| Ex. 15-2 | Alumina | | | | |
| Ex. 16 | Yttria | (1) YAG<br>(2) Calcium silicon nitride activated by europium | 460 | 0.439 | 0.419 |
| Ex. 17-1 | Alumina | (1) YAG<br>(2) Calcium chloroapatite activated by europium and manganese, | 400 | 0.330 | 0.328 |
| Ex. 17-2 | Yttria | | | | |
| Ex. 18 | Yttria | (1) YAG<br>(2) Calcium chloroapatite activated by europium and manganese<br>(3) Calcium silicon nitride activated by europium | 400 | 0.430 | 0.420 |
| Ex. 19 | Alumina | (1) Calcium chloroapatite activated by europium<br>(2) Barium magnesium aluminate activated by europium and manganese<br>(3) Strontium silicon nitride activated by europium | 400 | 0.330 | 0.335 |
| Ex. 20 | Alumina | (1) Strontium aluminate activated by europium | 365 | 0.150 | 0.420 |
| Ex. 21 | Alumina | (1) Barium silicon nitride activated by europium | 365 | 0.586 | 0.409 |
| Ex. 22 | Yttria | (1) YAG<br>(2) Calcium strontium silicon nitride activated by europium<br>(3) Barium magnesium aluminate activated by europium | 365 | 0.449 | 0.407 |
| Ex. 23 | Yttria | (1) Calcium chloroapatite activated by europium<br>(2) Barium magnesium aluminate activated by europium and manganese<br>(3) Calcium silicon nitride activated by europium | 365 | 0.332 | 0.331 |

In addition, a high-power light emitting element is applicable as a preferable example of the present invention. For example, a high-power light emitting element is suitable for lighting application. Combinations of phosphors, binders, and LEDs providing preferable characteristics in actual use are shown as examples 24 to 29 in Table 2. The luminescent colors (color tones) of the LEDs according to these examples were as follows. The example 24 was white. The examples 25, 26, and 27 were electric bulb color. The examples 28 and 29 were three-wavelength type white.

Figure 24:
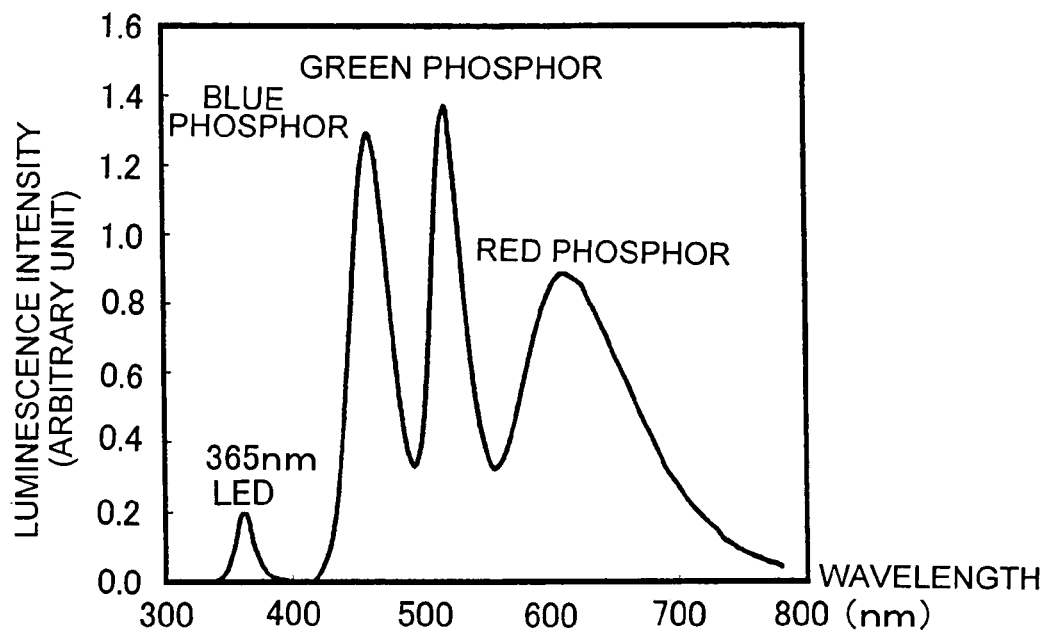
FIG. 24 is a graph showing an excitation spectrum of white phosphor with three wavelengths according to the example 23 of the present invention excited by LED with wavelength of 365 nm.
Figure 25:
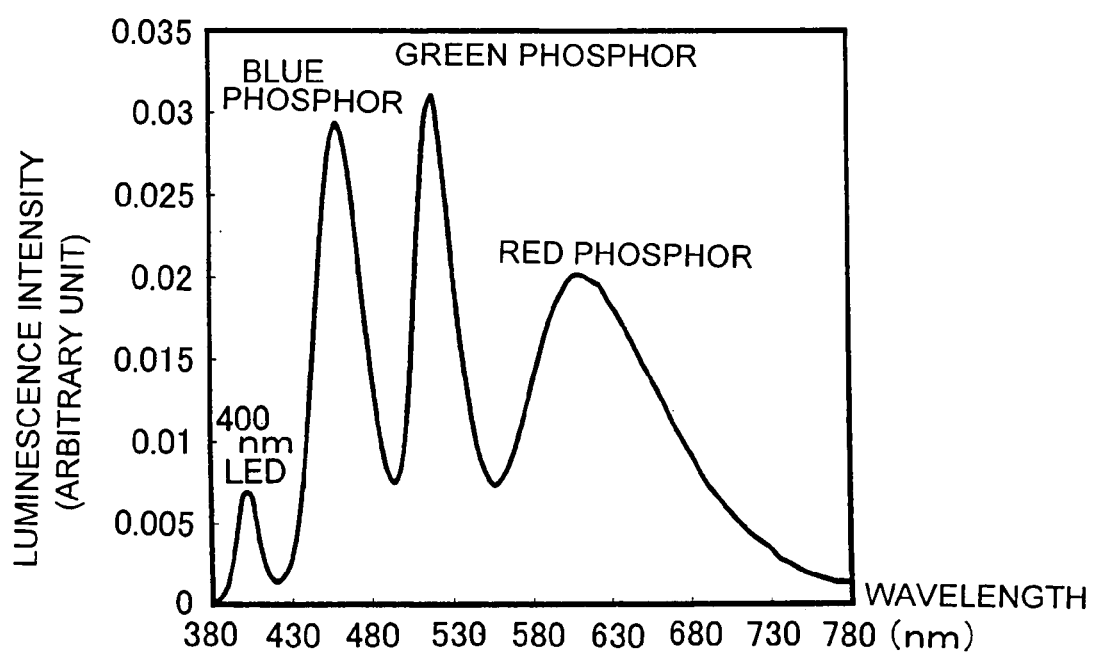
FIG. 25 is a graph showing a spectrum of white phosphor with three wavelengths according to the example 19 of the present invention excited by LED with wavelength of 400 nm.

FIGS. 24 and 25 show the spectrum data of three-wavelength type white phosphor used in the examples 19 and 23. FIG. 24 shows the spectrum excited by an LED with wavelength of 365 nm used in the example 23. FIG. 25 shows the spectrum excited by an LED with wavelength of 400 nm used in the example 19.

TABLE 2

| Exs. | Binder | Phosphor | LED (nm) | Color tone x | Color tone y |
|---|---|---|---|---|---|
| Ex. 24 | Comb. of yttria/alumina | (1) Yttrium aluminum garnet activated by cerium | 460 | 0.283 | 0.305 |
| Ex. 25 | Yttria | (1) Yttrium aluminum gallium garnet activated by cerium<br>(2) Calcium silicon nitride activated by europium | 460 | 0.439 | 0.419 |
| Ex. 26 | Comb. of yttria/alumina | (1) Yttrium gadolinium aluminum garnet activated by cerium<br>(2) Strontium silicon nitride activated by europium | 460 | 0.440 | 0.420 |
| Ex. 27 | Yttria | (1) Yttrium aluminum garnet activated by cerium<br>(2) Calcium chloroborate activated by europium<br>(3) Strontium silicon nitride activated by europium | 400 | 0.430 | 0.420 |
| Ex. 28 | Yttria | (1) Calcium chloroapatite activated by europium<br>(2) Barium magnesium aluminate activated by europium and manganese<br>(3) Strontium silicon nitride activated by europium | 365 | 0.335 | 0.325 |
| Ex. 29 | Yttria | (1) Calcium bromoapatite activated by europium<br>(2) Barium magnesium aluminate activated by europium and manganese<br>(3) Calcium silicon nitride activated by europium | 365 | 0.331 | 0.332 |

COMPARATIVE EXAMPLE 1

A sample employing silica sol was obtained as a comparative example 1, and comparative data were obtained. 10 g of silica sol available on the market (HAS10 of Colcote Co., Ltd.) was provided in a 100 ml beaker, and 10 g of CESN was added thereto as a phosphor material and sufficiently stirred, thus, mixed phosphor/sol slurry was obtained.

COMPARATIVE EXAMPLE 2

A sample without phosphor was obtained as a comparative example 2, and comparative data were obtained. In this case, only LED of 400 nm was used.
(Formation of Phosphor Film)
A method for forming a phosphor film with the phosphor/sol slurry of the examples 1 to 14 obtained as discussed above is shown. First, the phosphor/sol slurry according to each of the examples 1 to 5 was filled in a cylinder of a spray apparatus (Nordson Corp.). An LED (9φ stem package, 0.35 mm chip) with a wavelength of 400 nm as a light emitting element was set downward of a spray nozzle. A mask was previously provided on the LED chip to apply only the LED chip with the phosphor/sol slurry. The LED chip was heated at about 90° C. by a hot plate located under the LED chip. After spray formation, the phosphor were adhered on the LED chip by the sol containing the phosphor, thus, a luminescent film was formed.

Subsequently, in order to achieve sufficient curing, the film was cured at 240° C. for 30 minutes in a nitrogen atmosphere. Finally, the LED chip was airtightly capped together with nitrogen in a glove box, thus, the LED with the luminescent film containing the phosphor was obtained.

The list of the phosphors used as the examples is shown in Table 3.

TABLE 3

| Short Name | Long Name | Composition | Ave. Particle Size (μm) | Cent. Particle Size (μm) | Luminous Color (400 nm Excitation) |
|---|---|---|---|---|---|
| YAG | Yttrium aluminum garnet activated by cerium | $(Y_{0.79}Gd_{0.2}Ce_{0.01})_3Al_5O_{12}$ | 3.8 | 6.4 | Yellow |
| SAE | Strontium aluminate activated by europium | $(Sr_{0.9}Eu_{0.1})_4Al_{14}O_{25}$ | 9 | 14 | Bluish Green |
| CCA-1 | Calcium chloroapatite activated by europium | $(Ca_{0.95}Eu_{0.05})(PO_4)_3Cl$ | 15.9 | 18 | Blue |
| CCA-2 | Calcium chloroapatite activated by europium and manganese, | $(Ca_{0.94}Eu_{0.05}Mn_{0.01})(PO_4)_3Cl$ | 22 | 25 | Blue |
| CCBE | Calcium chloroborate activated by europium | $(Ca_{0.9}E_{0.1})_2B_5O_9Cl$ | 12 | 19.1 | Blue |
| BAM | Barium magnesium aluminate activated by europium | $(Ba_{0.45}Eu_{0.25}Sr_{0.3}) \cdot MgO_5Al_2O_3$ | 3.9 | 8.7 | Blue |
| CESN | Calcium silicon nitride activated by europium | $(Ca_{0.97}Eu_{0.03})_2Si_5N_8$ | 4.7 | 7.5 | Red to Orange |

(Endurance Test)

Figure 26:
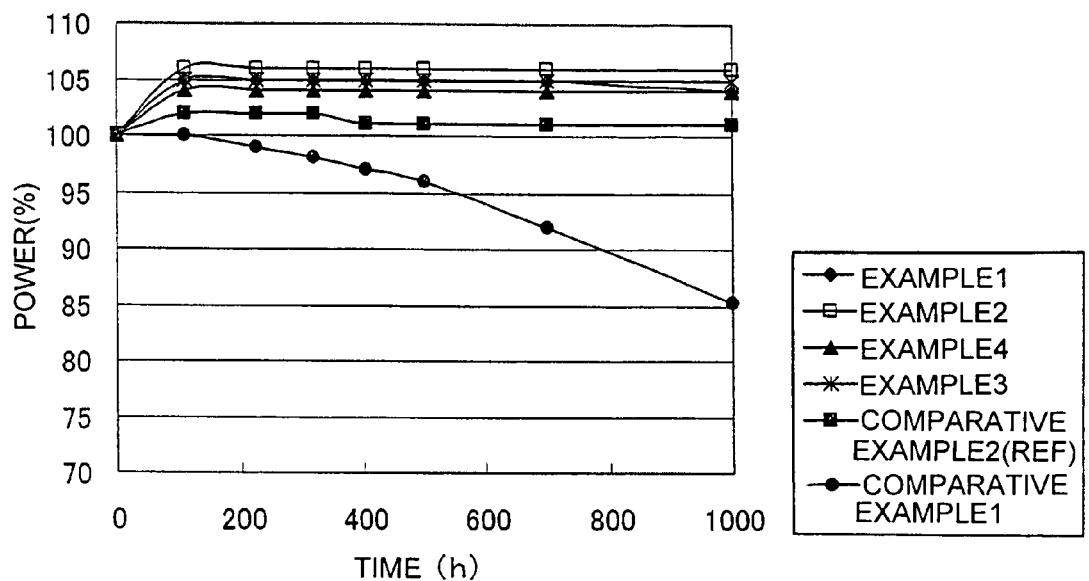
FIG. 26 is a graph showing a result of a reliability test of the phosphors according to the examples of the present invention.
Figure 27:
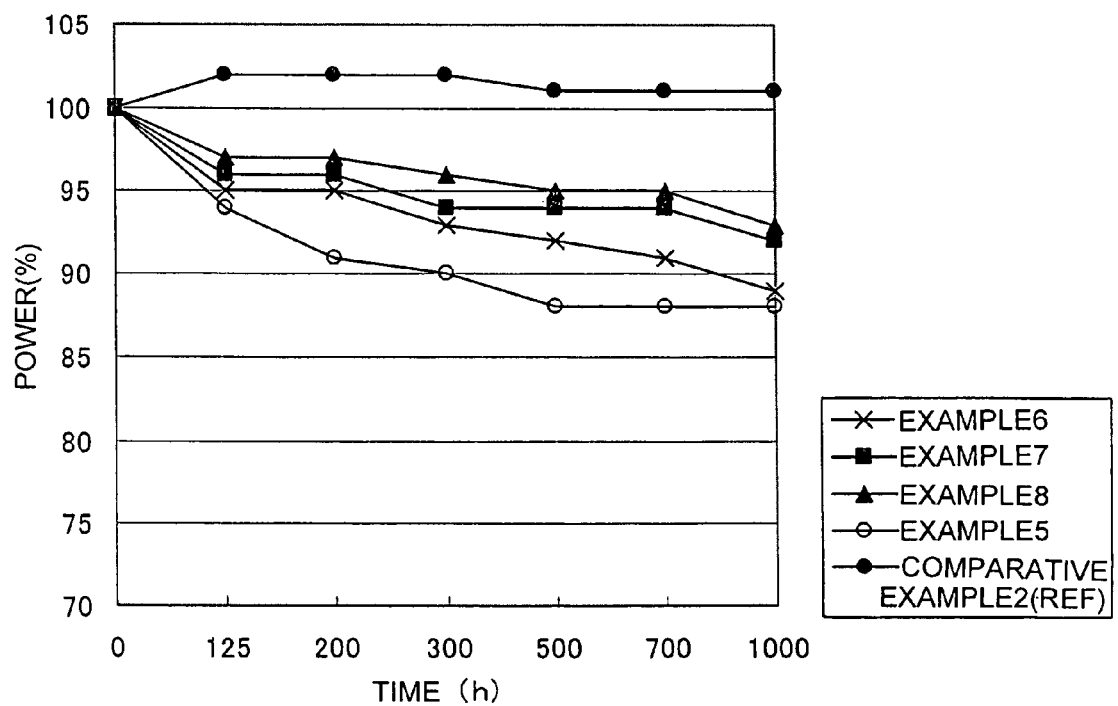
FIG. 27 is a graph showing a result of a reliability test of the phosphors according to the examples of the present invention.
Figure 28:
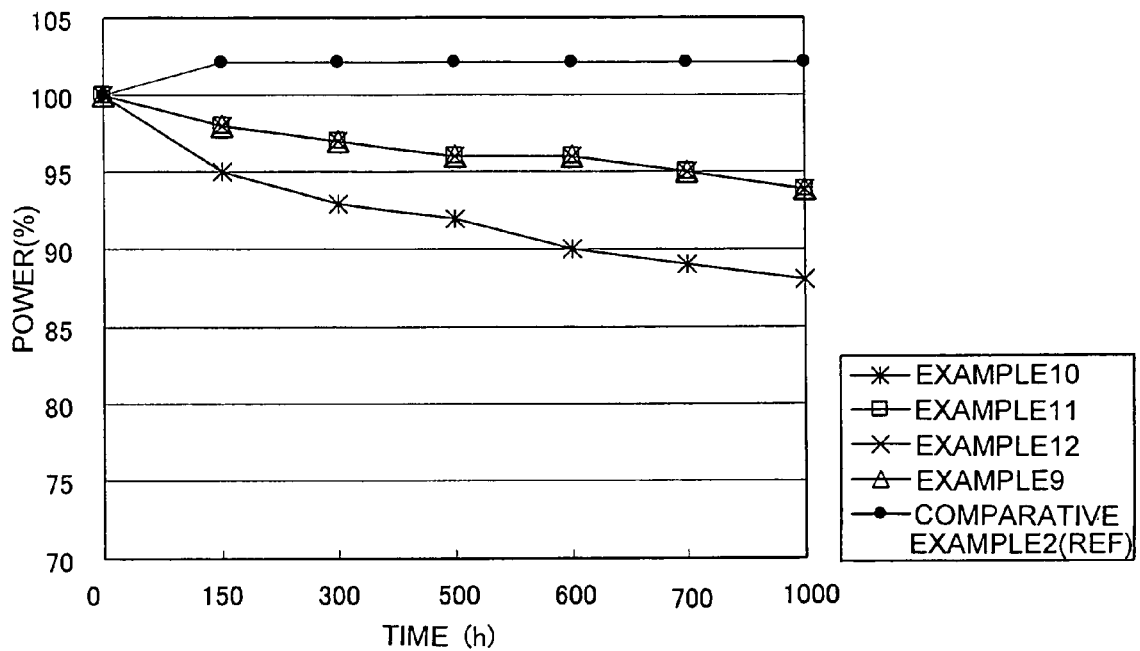
FIG. 28 is a graph showing a result of a reliability test of the phosphors according to the examples of the present invention.

The endurance test was conducted for reliability of the produced light emitting apparatus. In the endurance test, an LED chip with wavelength of 400 nm, output of 14.5 mW, and side of 350 μm was used, and was operated at 60 mA at room temperature. On the assumption that a half amount of light emitted by the chip outgoes from its side surfaces, the density of light entering the luminescent film of the light emitting apparatus was about 86.3 W/cm$^{-2}$. The junction temperature was about 80° C. The thermal resistance value of the whole package was 230° C./W. Since the density of sunlight in Tokyo at 14 o'clock is about 0.1 W/cm$^{-2}$, it is calculated that the density of light entering the luminescent film is about 863 times the energy density of the sunlight. FIGS. 26 to 28 show the result of this endurance test.

FIG. 26 shows the result of the endurance test of the examples 1 to 4 using the YAG group phosphor. Among samples of the phosphor/sol as adjusted above, in the phosphor films obtained by application of the phosphor/sol adjusted in the examples 1 to 4, output deterioration was not observed at all based on the comparison between before operation test and after 1000-hours operation. On the other hand, in the LED with the phosphor using silica sol as the comparative example 1, its output gradually decreased, and the output after 1000-hour operation decreased to 85%. Since only LED of 400 nm without phosphor was used as the comparative example 2, needless to say, deterioration was not observed.

FIG. 27 shows the result of the endurance test of the examples 5 to 8 using the Strontium aluminate phosphor. As for the output of the phosphor/LED obtained by application of the phosphor/sol adjusted in each of the examples 5 to 8 after 1000-hour operation, as shown in FIG. 27, the examples 5, 6, 7, and 6 were 88%, 89%, 92%, and 93%, respectively. Among them, in the phosphor/LED obtained by application of the phosphor/sol adjusted in the example 5, as shown in FIG. 27, its output decreased until 300-hour operation to 88% due to deterioration of the phosphor film. But, after that, further deterioration was not observed, and its output kept at 88% even after 1000-hour operation.

Figure 29:
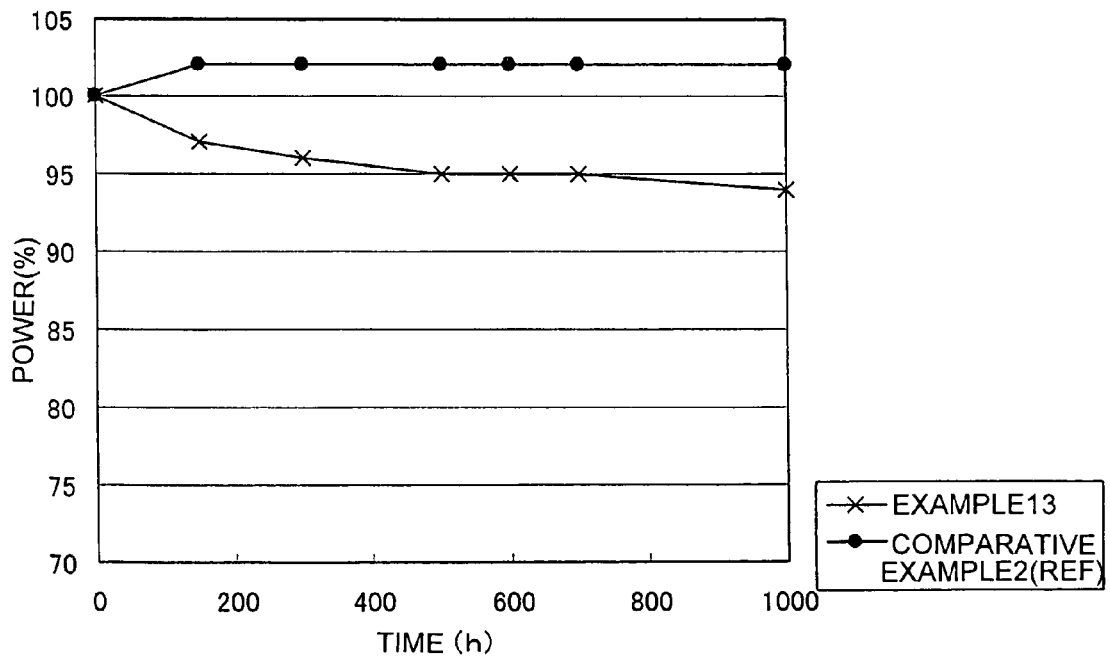
FIG. 29 is a graph showing a result of a reliability test of the phosphor according to the example of the present invention.
Figure 30:
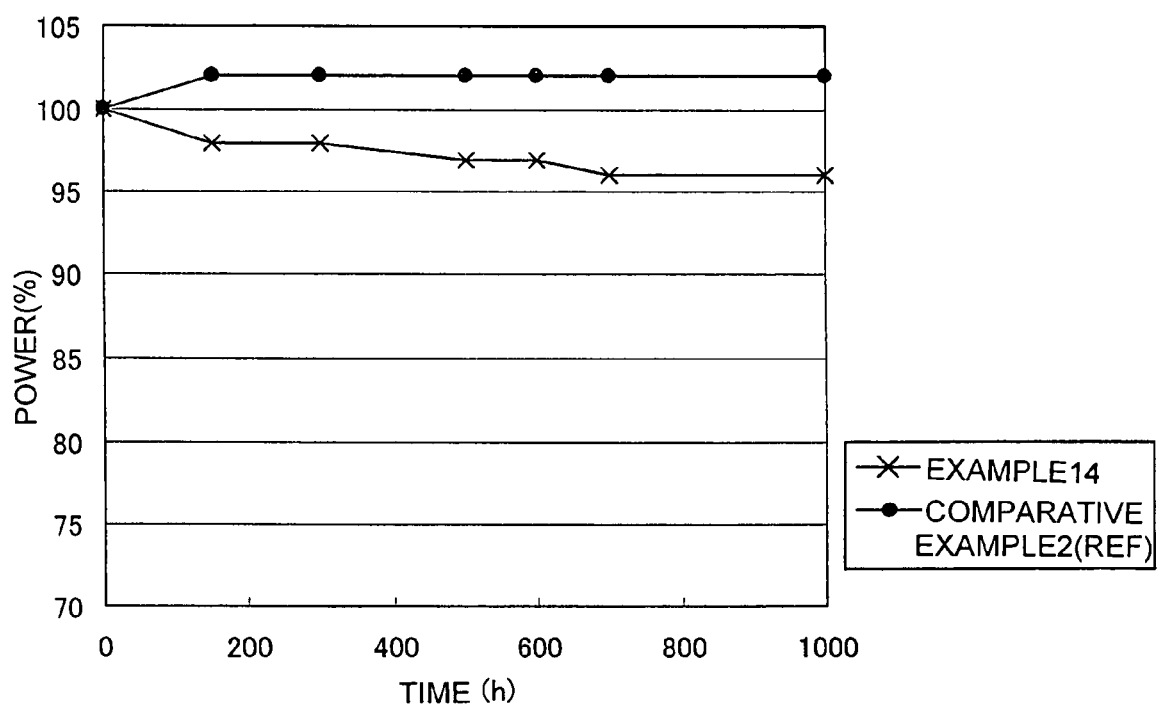
FIG. 30 is a graph showing a result of a reliability test of the phosphor according to the example of the present invention.

FIG. 28 shows the result of the endurance test of each of the examples 9 to 12 in accordance with three-wavelength type white apparatus of the luminescent film, which is obtained by employing the yttria sol and contains RGB phosphors, combined with an LED. FIG. 29 shows the result of the endurance test of the example 13. FIG. 30 shows the result of the endurance test of the example 14. As for the output of the phosphor/LED obtained by application of the phosphor/sol adjusted in each of these examples after 1000-hour operation, as shown in FIG. 28, the examples 9, 10, and 12 were 88%, 94%, and 94%, respectively. As shown in FIG. 29, the example 13 was 94%. As shown in FIG. 30, the example 14 was 96%. As for the output of the phosphor/LED obtained by application of the phosphor/sol adjusted in the example 13 of FIG. 29 after 1000-hour operation, it was 94%.

As discussed above, it was found that very high durability was obtained in the phosphor/sol adjusted the foregoing examples as compared with a conventional phosphor using silica sol, and so on. Particularly, it was found that they were effective as a luminescent film or luminescent layer to be used in the wavelength range of 410 nm or less. In the case where a semiconductor light emitting element emitting ultraviolet rays is used as a light emitting element, since the conditions become more severe, the inorganic binder used in the foregoing embodiment are effective. A conventional LED employing resin in its luminescent film, or a conventional phosphor employing silica gel deteriorates even in the relatively long wavelength of about 520 nm. On the other hands, employing the inorganic binder according to the foregoing embodiment can provide a light emitting apparatus stable even in use for a long time, and having high reliability. In combination of a semiconductor light emitting element and a phosphor formed to be in intimate contact with the element, or in a light emitting element with high applied electric power, the foregoing embodiments are effective. particularly, in a light emitting apparatus with high applied electric power, since energy such as heat generation, and light density added to a luminescent film is large, a conventional resin binder or silica gel deteriorates for a short time. In contrast to this, as discussed above, in this embodiment, deterioration was hardly observed, therefore, it is possible to provide a light emitting apparatus, which keeps its output high and has high reliability.

Sixth Embodiment

Figure 31:
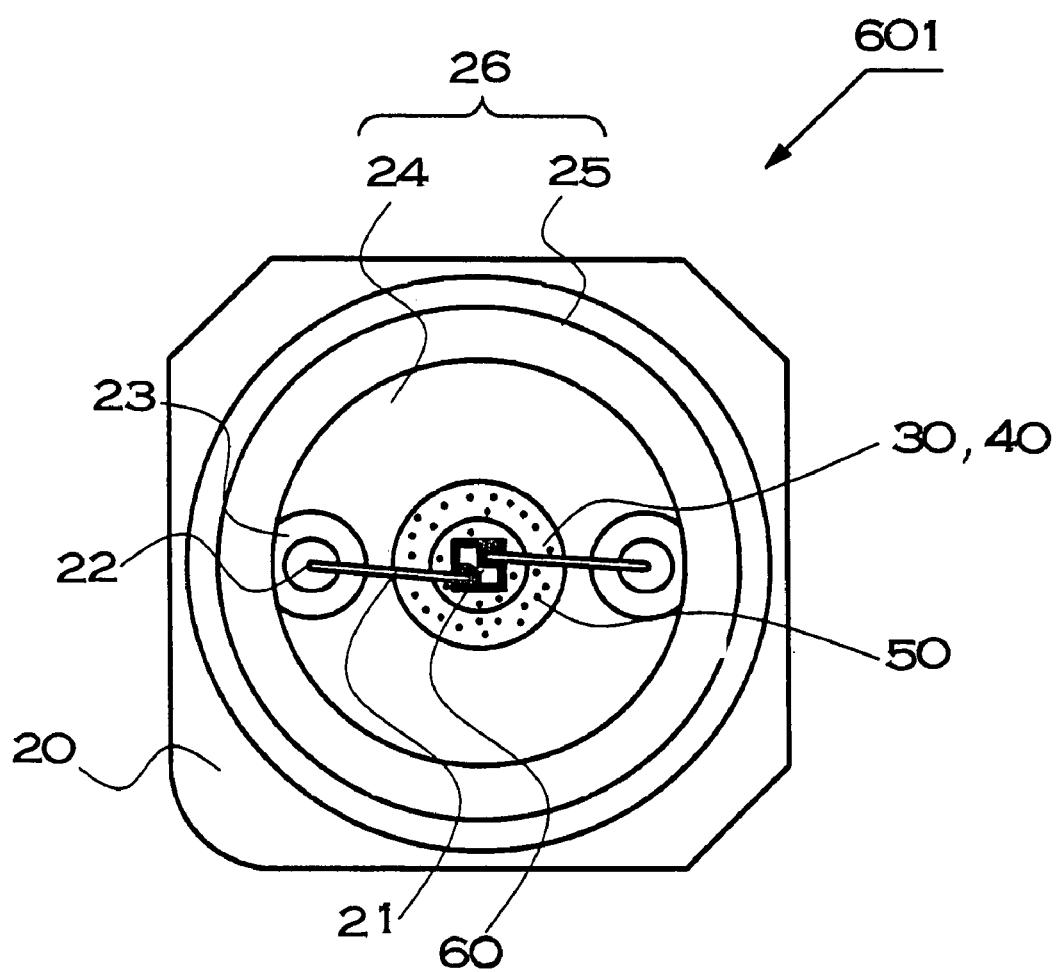
FIG. 31 is a schematic plan view showing a light emitting apparatus according to a sixth embodiment of the present invention.
Figure 32:
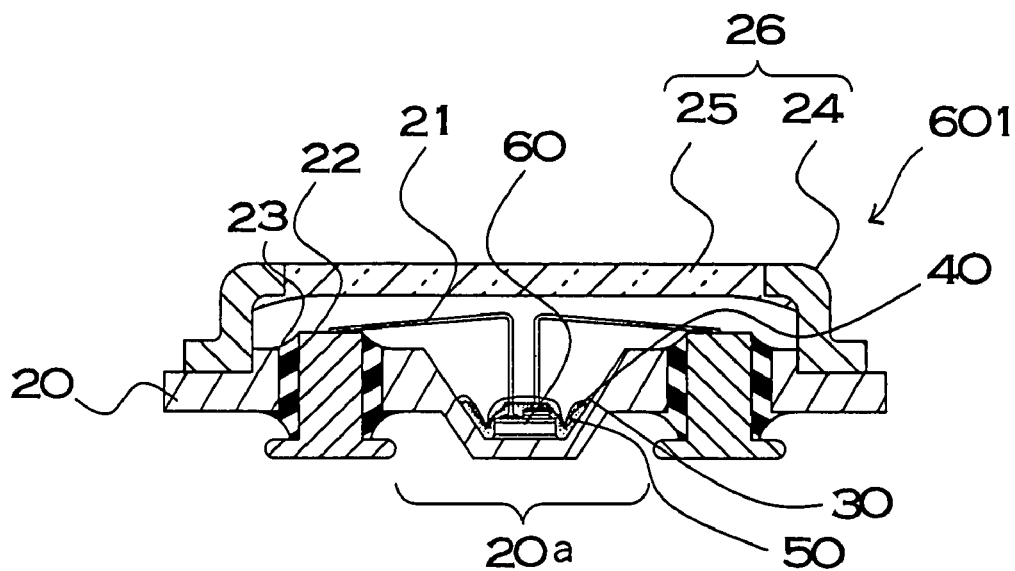
FIG. 32($a$) is a schematic cross-sectional view of a light emitting apparatus according to an embodiment of the present invention, and FIG. 32($b$) is an enlarged schematic cross-sectional view of a recessed portion of a base member.
Figure 32:
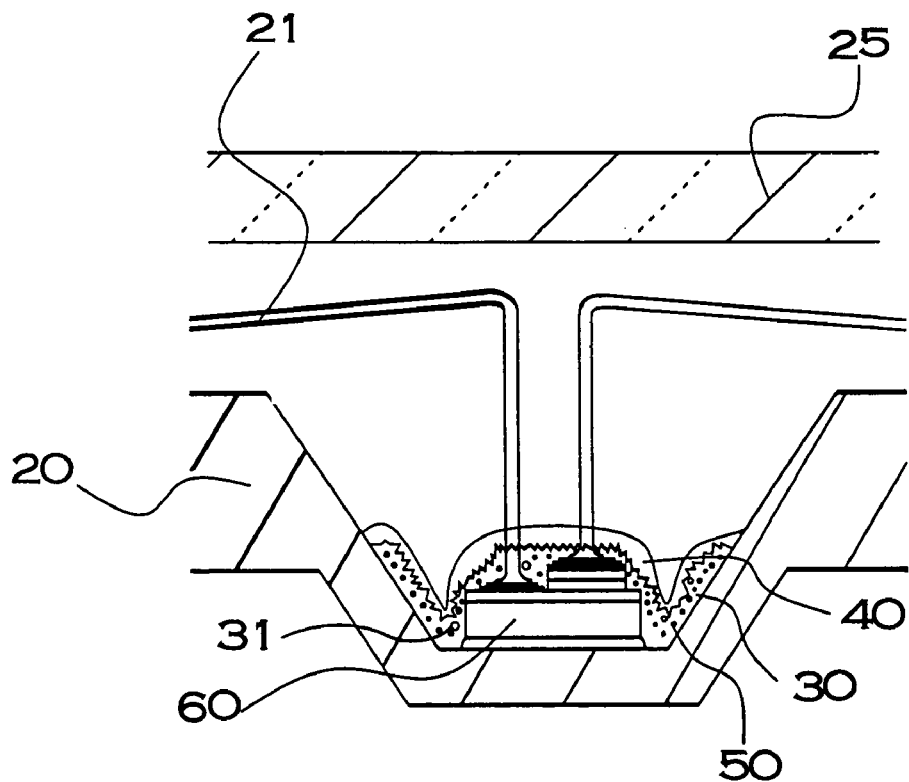

With reference to FIGS. 31 and 32, a light emitting apparatus according to a sixth embodiment of the present invention is described. FIG. 31 shows a schematic plan view showing the light emitting apparatus according to the sixth embodiment. FIG. 32(*a*) shows a schematic cross-sectional view showing the light emitting apparatus according to the sixth embodiment. FIG. 32(*b*) shows an enlarged schematic cross-sectional view showing a recessed portion of a base member. The light emitting apparatus 1 according to the sixth embodiment comprises a light emitting element 60, a base member 20 on which the light emitting element 60 is mounted, a lid member 26 which is formed on the base member 20. The side where the light emitting element 60 is mounted refers to as a "principal plane", and the back side refers to as a "back plane".

The base member 20 is formed of metal and has a recessed portion 20*a* in the center. A base portion is located around the recessed portion 20*a*. The base portion has the two through holes penetrating in the thickness direction. The through holes are opposed to each other so as to sandwich said recessed portion 20*a*. The positive and negative metal lead terminals 22 are inserted into the through holes, respectively, so as to interpose hard glass, which is an insulating member 23, between each lead terminal and the through hole. The base member 20 is provided with lid member 26, has a transparent window portion 25 and a lid 24 consisting of a metal portion, in the principal plane side. The contact surface between the metal lid 24 and the metal base member 20 is welded. Welding the base member 20 and the lid member 26 provides airtight sealing of the light emitting element 60. Inert gas, such as nitrogen gas, is used in the airtight sealing. The light emitting element 60 accommodated in the recessed portion 20*a* is a light emitting element which emits blue light or ultraviolet rays. The light emitting element 60 is adhered in the recessed portion 20*a* of the base member 20. An adhesive agent obtained by drying and burning hydrolysis solution of ethyl silicate can be used as an example of adhesive agent. The light emitting element 60 mounted in the recessed portion 20*a* of the base member 20 is coated with the inorganic binder 30 containing a phosphor. The surface of the inorganic binder 30 is coated with resin 40.

In the light emitting apparatus 601, the light-outgoing efficiency does not decrease even in a gel state without improving crystallinity in the case of particular metallic elements. The inorganic binder 30 is impregnated with the resin 40, thus, it is possible to provide a light emitting apparatus with high light-outgoing efficiency. Particularly, in the case where a hydroxide oxide, the valence number of which does not vary in the sol-gel reaction process, with stable oxidation state such as Al and Y elements is used, even when coating contains a gel state part, it is possible to easily obtain a luminescent film with high light-outgoing efficiency for a short time at low energy without proceeding of the sol-gel reaction.

In addition, the inorganic binder 30 is composed of gel of hydroxide oxide, thus, it is possible to improve the quality of formed coating. As for the inorganic binder member containing a hydroxide oxide, particles aggregate by the sol-gel process, thus, the binder member becomes a porous material with bridge structure, network structure or polymer structure. When the skeleton structure of the particle aggregation of hydroxide oxide is the network structure, the binder member becomes have porous structure. Accordingly, the flexibility of coating is improved. Additionally, in the formation of the inorganic binder 30, the binder member binds a filler member such as phosphor particles. Even if the object to be coated has a complicated shape, the film can be formed corresponding to the shape. Therefore, it is possible to provide coating with high bonding characteristics. Furthermore, since the binder member contains hydroxide oxide, it is possible to provide a film which is stable toward and does not deteriorates due to heat or light.

Coating formed in a conventional light emitting apparatus deteriorates due to exposure to light from light emitting elements in use of light emitting apparatuses. The reason of this deterioration is assumed that reaction occurs due to the light output or heat generation from the light emitting elements, or both of them. Accordingly, the deterioration tends to occur when ultraviolet rays with high light energy is used for a large element with high heat generation and thermal resistance value. On other hand, as discussed later, as a result of the endurance test of examples of the present invention which were produced, we found that they have very high resistance. The light emitting apparatus according to the sixth embodiment of the present invention has the following structure. With reference to Figures, constituent members according to the embodiment is described.

(Inorganic Binder)

The inorganic binder 30 coats the light emitting element 60 provided in the base member 20. The inorganic binder 30 of the sol state is filled in the recessed portion 20*a* of the base member 20 by potting, pouring, spraying, and so on, and thus coats the surface of the light emitting element 60 and the recessed portion 20*a*. The inorganic binder 30 contains a phosphor 50.

The inorganic binder 30 gelates and cured after spray coating, potting, screen printing, and so on. This curing produces voids 31 in the inorganic binder 30. The voids cause brittleness of the inorganic binder 30 and occurrence of cracks and chips.

The inorganic binder 30 is provided separately from the mold member in the cup of the mount lead, an opening of the base member, and so on. The inorganic binder 30 is a layer containing a phosphor which converts light emitted from the light emitting element chip 60 and a material for binding the phosphor. In the inorganic binder 30 layer, the thickness of the inorganic binder 30 layer provided on the upper surface and the side surfaces of the light emitting element 60 is substantially equal to the thickness of the inorganic binder film 30 provided on the interior surface of the recessed portion 20*a*. The inorganic binder 30 does not break even at the corner parts of the light emitting element 60, and is a continuous layer.

Due to reflection by the base member 20, the wire 21, and so on, the high-energy light emitted from the light emitting element 60 becomes high-density in the inorganic binder 30. When light is reflected and is scattered by the phosphor 50, the inorganic binder 30 may be exposed to high-energy light with high density. Accordingly, in the case where a nitride group semiconductor, which can provide high luminescence intensity and can emit high-energy light, is used as the light emitting element 60, it is preferable that a hydroxide oxide containing at least one metallic element selected from the group consisting of Al, Y, Gd, Lu, Sc, Ga, In, and B with resistance for high-energy light is used one as the inorganic binder 30.

Specifically, a material with a phosphor contained in a transparent inorganic member of $Al(OH)_3$, $Y(OH)_3$, and so on, is preferably used as one of main materials of the inorganic binder 30. These transparent inorganic members bind the phosphor 50. The phosphor 50 is deposited and bound on the light emitting element 60 or the support member in a film shape. In this embodiment, a hydroxide oxide, which can be used as the inorganic binder 30, is formed from a compound consisting principally of a hydroxide oxide which is produced from an organometallic compound of any of Al, Y, Gd, Lu, Sc, Ga, In, and B. The organometallic compound refers to a compound including an alkyl group or an aryl group which are bonded with metal through an oxygen atom. For example, metal alkyl, metal alkoxide, metal diketonate, metal carboxylate, and so on, can be given as this type of organometallic compound. Among these organometallic compounds, a compound with high solubility in organic solvent tends to be uniform sol solution after hydrolysis. Since this type of organometallic compound have high reactivity of hydrolysis, or the like, it easily disperses. Thus, it is possible to form the inorganic binder 30 with the phosphor 50 bound therein. For this reason, in a method which employs an organometallic compound, dissimilarly to other method which forms the inorganic binder 30 on the light emitting element 60 in the state of high temperature of 350° C. or more, or electrostatic application, it is possible to form the inorganic binder 30 on the light emitting element 60 without reducing the performance as the light emitting element 60. Accordingly, the producing yield is improved.

It is preferable that the inorganic binder 30 has the film structure in a thin film state. The reason is that the layer structure allows the phosphor 50 contained in the inorganic binder 30 to uniformly emit light. In the case of thin film, the resin 40 can easily permeate the inorganic binder 30. Potting means, spray means, or the like, can be used as means for forming the inorganic binder 30 layer. However, the inorganic binder 30 can be formed in shapes other thin film state.

Alumina, yttria, silica, complex of them, and so on, can be used as the inorganic binder 30. These materials are dispersed in water, or the like, and become in a sol-gel state rather than the solid state, thus, various shape can be formed. The phosphor can be uniformly dispersed in the inorganic binder 30. Alumina and yttria are described as examples of the inorganic binder 30, however, the inorganic binder 30 is not limited to these materials.

Conventionally, an inorganic group binder is used for coating. In the case where a cured film which employs this inorganic group binder, in particular silica gel ($SiO_2$), is used, there is a problem that the film is colored and deteriorates, and then turns to black in exposure to high power or ultraviolet rays. Particularly in a high-power light emitting apparatus, the silica binder layer deteriorates by the light with high density and the heat, and thus is colored black or dark brown. As a result of the research by the inventors of the present invention, this reason is considered that $SiO_x$ ($x<2$), which should be $SiO_2$ as silica, is produced by oxygen omission. Under heat-curing temperature of 250° C., the silica binder is in the silica gel state where hydroxyl group and organic group partly remain in the $SiO_2$ skeleton. When light with high density is incident from LED in a silica gel state, oxygen omission occurs, thus, $SiO_2$ produces $SiO_x$ ($x<2$). As mentioned above, since Si is prone to be oxidized and reduced, that reason is considered that oxygen omission which occurs in the silica gel causes color deterioration. When color deterioration occurs, the problem that the light output from the light emitting element reduces arises. Since an inorganic group binder has voids, there are problems that cracks and chips easily appear, and that it has poor shock resistance. The reason is assumed that an inorganic group binder has poor shock resistance dissimilarly to resin.

(Alumina)

In the case where alumina sol consisting of amorphous alumina or very small particles of aluminum hydroxide oxide uniformly dispersed in water is used as a binder, it changes into pseudoboehmite structure until aluminum hydroxide oxide of stable boehmite structure is formed by heating and curing the alumina sol. The boehmite crystal structure of aluminum hydroxide oxide can be represented by chemical formulas such as AlOOH, $Al_2O_3.H_2O$, and so on, while the pseudoboehmite structure of the aluminum hydroxide oxide can be represented by chemical formulas such as (AlOOH). x $H_2O$, $Al_2O_3.2H_2O$, and so on. Specifically, an intermediate has forms of $Al_2O_3.2H_2O$, $Al_2O_3.xCH_3COOH.yH_2O$, $Al_2O_3.xCl.yH_2O$, $Al_2O_3.xHNO_3.yH_2O$, and so on, and the stable boehmite structure is formed. The crystallinity of boehmite structure further increases, thus, γ-alumina ($Al_2O_3$) or α-alumina ($Al_2O_3$) is formed. A luminescent film is formed by employing alumina sol with such characteristics as a binder.

Specifically, main materials for an inorganic binder 30 film included in sol solution to be used are shown as follows. In the sol solution, an amorphous metal oxide and ultrafine particles of metal hydroxide oxide, ultrafine particles of oxide, and so on, are uniformly dispersed with small amount of inorganic acid, organic acid, and alkali as stabilizers in water or organic solvent. Metal alcoholate, metal diketonate, metal halide, hydrolysate from metal carboxylate or metal alkyl compound, or hydrolysate from mixture of them can be employed as original materials of amorphous metal oxide, ultrafine particles of metal hydroxide oxide, ultrafine particles of oxide, and so on. In addition, colloid (sol) solution, in which metal hydroxide, metal chloride, metal nitrate, or very small particles of metal oxide is uniformly dispersed in water, organic solvent, or mixed solvent of water and water-soluble organic solvent, can also be used. These are generically called as aluminoxane. Aluminoxane is a skeleton containing a repeat of $[AlO]_x$.

Aluminum methoxide, aluminum ethoxide, aluminum-n-propoxide, aluminium isopropoxide, aluminum-n-butoxide, aluminum-sec-butoxide, aluminum-iso-propoxide, aluminum-tert-butoxide, yttrium methoxide, yttrium ethoxide, yttrium-n-propoxide, yttrium iso propoxide, yttrium-n-butoxide, yttrium-sec-butoxide, yttrium-iso-propoxide, yttrium-tert-butoxide, and so on, can be used as metal alcoholate.

Aluminum tris-ethyl-acetacetate, alkyl acetacetate aluminum isopropylate, ethyl acetacetate aluminum isopropylate, aluminum monoacetyl acetnate-bis-ethyl acetacetate, aluminum tris-acetyl acetnate, yttrium tris-acetyl acetnate, yttrium tris-ethyl-acetacetate, and so on, can be employed as metal diketonate.

Aluminum acetate, propionic-acid aluminum, 2-ethylhexanoic acid aluminum, acetic-acid yttrium, propionic-acid yttrium, 2-ethyl hexanoic-acid yttrium, etc. can be employed as metal carboxylate.

Aluminum chloride, ammonium bromide, aluminum iodide, yttrium chloride, yttrium bromide, yttrium iodide, and so on, can be employed as metal halide.

Methanol, ethanol, n-propanol, iso-propanol, n-butanol, sec-butanol, tert-butanol, tetrahydrofuran, dioxane, acetone, ethylene glycol, methyl ethyl ketone, N,N dimethylformamide, N,N dimethylacetamide, and so on, can be employed as organic solvent.

A filler or diffusion particles may be mixed in the inorganic binder 30 instead of or in addition to the phosphor 50. In addition, they may be mixed to form a mixed material to adjust its coefficient of linear expansion to an application base member or a light emitting element. As for the filler, needless to say, mixture of phosphor 50 provides luminescent radiation, but it also serves to form a path for moisture evaporation in cure, and thus provide an effect that accelerate curing and drying of binder. In addition, the filler serves to scatter luminescent radiation of phosphor 50, and to increase the adhesion strength and physical strength of the inorganic binder 30. The inorganic binder 30 layer or inorganic binder 30 film can be used as a diffusion layer which does not contain a phosphor. In the case of mixture to be used as a binder, a small amount of element with a plurality of ionic charge numbers other than a trivalent metallic element may be included. In this embodiment, the binder is only required to contain a hydroxide oxide as principle compound, and provides operation even when partially containing a metal oxide, a metal hydroxide, or combination of them.

Specifically, AlOOH of alumina is described as an example of main material included in the inorganic binder 30.
(AlOOH)

The inorganic binder 30 with the phosphor 50 bound with AlOOH can be formed as follows. Aluminoxane sol or alumina sol solution is obtained by hydrolyzing aluminum alcoholate or the aluminum alkoxide at a prescribed rate in organic solvent. The phosphor 50 (fine particles) uniformly dispersed therein, thus, coating solution is adjusted. Potting, spray coating, dispensing, or the like, is performed so as to cover the whole surface of the light emitting element 60 with the alumina sol solution with phosphor 50 uniformly dispersed therein. After that, it is heated and cured. The particles of phosphor are bound by the AlOOH component. It is bound on the surface of the light emitting element 60.

Aluminum alcoholate or aluminum alkoxide is an organic aluminum compound used as a thickener of paint, a gelling agent, a hardener, a polymerizing catalyst, and a dispersing agent of pigment.

Aluminium isopropoxide, aluminum ethoxide, and the aluminum butoxide, which are kinds of aluminum alcoholate or aluminum alkoxide, have very high reactivity. They produces an aluminum hydroxide or an alkyl aluminate with moisture in the air, and produce aluminum hydroxide oxide with boehmite structure. For example, as shown by the following Chemical Formulas 8, aluminium isopropoxide easily reacts with water, and thus becomes mixture, which consists principally of an aluminum hydroxide oxide and has bridge structure with an aluminum hydroxide or an aluminum oxide (alumina).

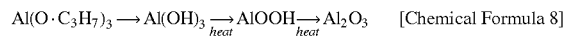

Al(O·C$_3$H$_7$)$_3$ ⟶ Al(OH)$_3$ $\underset{heat}{\longrightarrow}$ AlOOH $\underset{heat}{\longrightarrow}$ Al$_2$O$_3$    [Chemical Formula 8]

After aluminium isopropoxide reacts with moisture in the air, AlOOH is produced by heating. Thus, binding the phosphor 50 with this AlOOH can form the inorganic binder 30 with the phosphor 50 bound by AlOOH containing the phosphor 50 on the surfaces of the light emitting element 60, and on the support member other than the surfaces of the light emitting element 60 as the inorganic binder 30.

The aforementioned the inorganic binder 30 with the phosphor 50 bound by AlOOH may composed of two or more layers, which include combined the inorganic binder 30 film with the phosphor 50 bound by a hydroxide oxide of other element, such as Y, Gd, Lu, Sc, Ga, In, and B, and the inorganic binder 30 film with the phosphor 50 bound by AlOOH, on the same light emitting element 60. According to a method for forming the inorganic binder by spray means in this embodiment, since the thicknesses of two layers can be controlled, it is possible to easily form inorganic binder 30 layers with the same shape. For example, on the same light emitting element 60, first, a layer of Y$_2$O$_3$ as the inorganic binder 30 is formed, and a layer of Al$_2$O$_3$ as the inorganic binder 30 is formed thereon. The phosphor 50 may be included in both two layers, may be included in only one layer, or may not be included in both two layers. In this construction, there are effects such as improvement of light-outgoing efficiency depending on the difference of refractive indices of the layers of inorganic binder 30. In the case where the inorganic binder 30 consisting of one layer is formed, the refractive indices between the inorganic binder 30 and the air or a nitride semiconductor light emitting element sharply vary at the interface. Since a part of light outgoing from the light emitting element 60 may reflect at this interface, the light-outgoing efficiency is prone to decrease. In addition, for example, the coefficient of linear expansion or the refractive index may be adjusted by forming the inorganic binder 30 with mixed AlOOH, YOOH, and so on.

Since the inorganic binder 30 with the phosphor 50 bound by AlOOH formed as above is inorganic substance dissimilarly to the conventional case where sealing is performed only by an epoxy resin, its deterioration due to ultraviolet rays is very small as compared with an epoxy resin. Accordingly, the luminescent layer with a phosphor bound by AlOOH can be used together with a light emitting element which emit ultraviolet light, or a high-power light emitting element.
(Yttria)

When yttria sol, in which amorphous yttria or very small particles of yttria is uniformly dispersed in water, is used as the inorganic binder 30, even when the yttria sol is heated and cured, the principle component of crystal structure is amorphous. An yttrium hydroxide oxide can be represented by the chemical formula YOOH.xH$_2$O, while an yttrium oxide can be represented by the chemical formula Y$_2$O$_3$.xH$_2$O, or the like. Specifically, an yttrium hydroxide oxide or an yttrium oxide is partly included through the process in the form of YOOH.xCH$_3$COOH.yH$_2$O, or Y$_2$O$_3$.xCH$_3$COOH.xH$_2$O as an intermediate. Yttria forms a stable film even in this gel state. The reason is assumed that each component has bridge structure and thus is stable.

Yttria has a characteristic that is less prone to form crystal structure as compared with alumina. Although yttria has amorphous structure without crystallinity, it is a stable compound, and the ionic charge number of Y does not vary from the trivalent state. That is, oxidation-reduction reaction is less prone to occur, thus, it has a feature that color deterioration does not occur.

As for the rest, the inorganic binder 30 is formed similar to the aforementioned alumina. A commercially available inorganic group adhesive agent, ceramic binder, and so on, can be also employed as the sol used as a binder for a phosphor as mentioned above. In addition, materials which can be used as a binder are not limited to hydroxide oxides containing Al or Y element such as alumina and yttria, but a hydroxide oxide, oxide, hydroxide of other IIIA group elements or IIIB group elements, and so on, can be employed. It is preferable to select metallic elements the ionic charge numbers of which do not vary. Particularly, stable trivalent metallic elements are preferable. Additionally, it is preferable that they are colorlessness or transparent. For example, metallic compounds containing metallic elements, such as Gd, Lu, Sc, Ga, and In, in addition to Al or Y can be employed, preferably, Sc and Lu can be employed. Alternatively, a mixed oxide or mixed hydroxide oxide, which mixes two or more of these elements, may be employed. It contains not only aluminum or yttrium but also hydroxide oxide, and so on, of other III group elements, thus, it is possible to adjust various characteristics such as optical functions including the refractive index of the inorganic binder 30 layer or the like, and film quality including flexibility, bonding property of film or the like, to desired values. The inorganic binder 30 containing gel of hydroxide oxide, the ionic charge number of which is constant, preferably trivalent, obtained as mentioned above in this embodiment of the present invention can be a stable and have good light-outgoing efficiency. Additionally, it is composed of inorganic materials, and thus can be a stable inorganic binder layer or inorganic binder film with less variation from aging.

(Resin)

The resin 40 coats the surface of the inorganic binder 30. This coating composes the resin 40 layer formed on the inorganic binder 30 layer. However, the inorganic binder 30 may be coated by filling the base member 20 having the recessed portion 20a with the resin 40. Various coating methods can be used as long as the inorganic binder 30 is impregnated with the resin 40. Impregnating refers to as forcing the resin 40 into the inorganic binder 30 by immersing the inorganic binder 30 in the resin 40.

When the viscosity of the resin 40 before cured is too high, the resin does not have good flowability, thus, the coating cannot be formed uniformly. On the other hand, when the viscosity of the resin 40 before cured is too low, the resin stays in a concave part and does not stays in a convex part, thus, the coating cannot be formed uniformly. For this reason, it is preferable to use the resin with a prescribed viscosity.

It is preferable that the resin 40 has layer structure. The layer structure can provide improvement of the light-outgoing efficiency from the light emitting element 60, and control of the directivity. In addition, the heat generated from the light emitting element 60 does not stored in the resin 40, thus, it is possible to easily dissipate heat.

It is preferable that the resin 40 is in a gel state. Gel can mitigate stress produced due to thermal expansion, thus, it is possible to prevent the wire 21. which extends from the light emitting element 60, from being cut. The resin 40 may be in an oil state.

The surface of the resin 40 coating the inorganic binder 30 is smooth. When only the inorganic binder 30 is cured, numbers of asperities in a granular shape are observed on its surface under an electron microscope. Accordingly, the light from the light emitting element 60 is reflected on the asperities in a granular shape and is diffused, thus, the light-outgoing efficiency is reduced. When the resin 40 coats the surface of the inorganic binder 30, the surface of the resin 40 becomes smooth. Accordingly, the light from the light emitting element 60 can efficiently outgoes, thus, the light-outgoing efficiency can be improved. Since the asperities with a granular shape are formed on the surface of the inorganic binder 30, the surface area between the inorganic binder 30 and the resin 40 is large. As a result, there is an advantage that adhesive strength in the interface between the resin 40 and the inorganic binder 30 increases.

The resin 40 has the gas content 3% or less by volume at normal atmospheric pressure. It is preferable that it is 1% or less by volume, and more preferably 0.01% or less by volume. Gas, such as the air, is included in the voids 31 existing in the inorganic binder 30. This gas is released externally when impregnation of the resin 40. In this case, since the resin 40 coats the surface of the inorganic binder 30, the gas in the voids 31 may dissolve in the resin 40. When the gas dissolves in the resin 40, the resin 40 contains the gas. The gas contained in the resin 40 thermally expands by the heat generation due to the drive of the light emitting element 60. Air bubbles may appear in the resin 40 due to the thermal expansion. The light emitted from the light emitting element 60 is reflected by these air bubbles, thus, this may causes reduction of light-outgoing efficiency. For this reason, it is preferable that the amount of the gas contained in the resin 40 is small as possible.

It is preferable that a material of the resin 40 permeates the inorganic binder 30, and has excellent heat resistance, light resistance, and weather resistance. Since the resin 40 becomes very high temperature of 120° C. or more due to heat generated from the light emitting element 60, the resin 40 is required to have heat resistant resin that can endure the temperature. In addition, since the resin 40 is irradiated with light of high intensity, such as blue light, ultraviolet rays, and the light passes through the resin 40, the resin 40 is required to have light resistance. On the other hand, the resin preferably has low water absorbency and moisture absorbency. When resin with high water absorbency and moisture absorbency is used, moisture in the resin explosively expands due to heat generated from the light emitting element 60. This causes peel-off in the interface between the light emitting element 60 and the inorganic binder 30, or the resin 40, and reduction of light-outgoing efficiency. Accordingly, it is preferable that resin with low water absorbency and moisture absorbency is used as the resin 40 so as to not contain moisture.

A silicone resin, an acrylic resin, and an epoxy resin, or the like, can be given as an organic group resin material with which the inorganic binder 30 layer with the phosphor 50 bound therein is impregnated. It is preferable that a silicone resin is used as a material of the resin 40.

Silicone resin has stable chemical characteristics, such as, heat resistance, weather resistance, light resistance. The composition of silicone resin has a Si—O—Si skeleton. Since the siloxane bonding of Si—O has high binding energy, it is stable. In addition, it has excellent transparency for light of visible to ultraviolet region. Accordingly, it is considered that, since the resin 40 does not absorb this type of light, the resin 40 is less prone to deteriorate. Silicone resins have low surfacetension and some of them have low viscosity. In this case, the resins have good permeability, and permeate the inorganic binder 30 even in small voids. Although there are addition cure type, UV cure type, condensation-reaction type, and UV cationic polymerization type of silicone resins, the addition cure type is preferable. The reason is that this type of resin contains little volatilization component, and its volume hardly contracts after heat curing. Since its volume hardly contracts, cracks due to the volume contraction do not appear. The peel-off in the interface between the resin 40 and the inorganic binder 30 does occur. Since the resin 40 contains little volatilization component, even when used for an airtightly-sealed base member, the base member is not broken by rise of internal pressure due to heat generated from the light emitting element 60. As for the resin 40, it is preferable that the resin after curing is in the state of soft gel or hard rubber rather than hard state. The resin 40 is in a soft state, thus, the stress of the resin 40, and the external pressure due to heat, shock, and so on. Accordingly, the flexibility of the resin 40 increases. For example, a silicone resin having a dialkylsiloxane skeleton before or after molding can be used as the resin 40. Silicone resin is cross-linked, and thus has structure, such as gel, and rubber. Particularly, It is preferable that the resin 40 has dimethylsiloxane as a principal chain before molding. However, the resin is not limited to dimethylsiloxane, but phenyl methyl siloxane can be used.

The inorganic binder 30 should not completely become oxide crystal nor polycrystal, but remains in a porous gel state. Particularly, since the stress is applied to the inorganic binder 30 due to thermal shock in a reflow process, and so on, in impregnation of the silicone resin 40, and so on, the difference of the coefficients of thermal expansion between the silicone 40 and the inorganic binder 30 causes cracks and peel-off.

Since porous gel has bridge structure, network structure or polymer structure, its coefficient of thermal expansion is large as compared with the crystal or polycrystal state. Accordingly, its coefficient of thermal expansion set to be closer to that of silicone resin, thus, cracks do not appear, and peel-off does not occur.

When the condensed type resin 40 is employed, and cured, a low-molecular component is eliminated. In this case, the volume of the resin 40 contracts, and cracks appear in the inorganic binder 30. In addition, the contact surface between the inorganic binder 30 and the phosphor 50 is peeled off.

Since the UV cure type resin 40 includes an organic functional group that absorbs UV, the resin 40 absorbs excitation light and emitted light. Accordingly, light-outgoing efficiency decreases.

(Filler)

The filler (not shown) is a filler material. Barium titanate, titanium oxide, aluminum oxide (alumina), yttrium oxide (yttria), silicon dioxide, calcium carbonate, hydroxide oxide, and so on, can be employed as a filler. For example, a filler having the thermal conductivity higher than a colorless hydroxide oxide containing at least one element selected from the group consisting of Al, Ga, Ti, Ge, P, B, Zr, Y, and alkaline earth metal, or an oxide containing at least one element selected from the group consisting of Si, Al, Ga, Ti, Ge, P, B, Zr, Y, and alkaline earth metal may be included. Addition of this type of filler improves the heat diffusion effect of the light emitting apparatus 601. Metal powders, such as alumina, Ag, and so on can be given as this type of filler in the case of die-bonding of the light emitting element 60 onto an adhesion layer formed of the aforementioned inorganic binder 30.

In addition to the phosphor 50 and lower alcohol, dispersing agent is mixed with sol of the inorganic binder 30, thus, it is possible to form fine coating at low temperature by azeotropic dehydration with the lower alcohol in curing. In addition, a light stabilizing material, a coloring agent, an ultraviolet absorption agent, and so on, may be included in the inorganic binder 30.

The inorganic binder 30 is formed from slurry solution. The slurry solution is prepared by mixing the phosphor 50 and the filler with the sol solution. The sol solution contains an amorphous metal hydroxide oxide, very small particles of metal hydroxide oxide or metal hydroxide as a principal component, and an amorphous metal oxide or very small particles of metal oxide, which are uniformly dispersed in water. It is preferable that weight ratio between the effective solid component and the phosphor 50 in the sol solution, or the weight ratio between the effective solid component and the mixture of the phosphor 50 and the filler in the sol solution is 0.05 to 30. For example, the adjustment ranges between the ratio of 90 g of phosphor to 20 g of sol solution with effective solid component concentration of 15%, and the ration of 4.5 g of phosphor to 600 g of sol solution with effective solid component concentration of 15%.

(Light Emitting Element)

The light emitting element 60 is not limited to an element which can emit visible light, but an element which can emit ultraviolet light can be used. The light emitting element 60 can be used together with the phosphor 50 to be combined. That is, the light emitted from the light emitting element 60 is irradiated to the phosphor 50, thus, the phosphor 50 can be excited to emit light different from the light emitting element 60. In the light emitting element 60, a semiconductor, such as GaAs, InP, GaAlAs, InGaAlP, InN, AlN and GaN, InGaN, AlGaN, and InGaAlN, is formed as a light emitting layer on a substrate by a MOCVD method, and so on. Homo structure, hetero structure, or double-hetero structure with MIS junction, PIN junction, PN junction, or the like, can be used as the structure of the semiconductor layer. Various light-emission wavelength can be selected depending on the material and the mixed crystal ratio of the semiconductor layer. The semiconductor layer can have a single- or multi-quantum-well structure provided with thin layer(s) for quantum effect. It is preferably a nitride group compound semiconductor (general formula $In_iAl_jGa_{1-i-j}N$, where $0 \leq i$, $0 \leq j$, $i+j \leq 1$), which can efficiently emit light with relatively short wavelength capable of efficiently exciting a phosphor.

When a gallium-nitride group compound semiconductor is used as the light emitting element 60, a material, such as sapphire, spinel, SiC, Si, ZnO, and GaN, is preferably used as the substrate for semiconductor. In order to form a gallium nitride with good crystallinity, it is more preferable to use a sapphire substrate. When semiconductor layers are grown on the sapphire substrate, it is preferable that a buffer layer, such as GaN and AlN, is formed to grow gallium-nitride semiconductor with PN junction thereon. GaN single crystal, which is selectively grown on the sapphire substrate by using $SiO_2$ as a mask, can also be used as the substrate. In this case, after semiconductor layers are formed, the light emitting element and the sapphire substrate can be separated by etching and removing $SiO_2$. A gallium-nitride group compound semiconductor has n-type conductivity in the state where an impurity is not doped. In order to improve luminous efficiency, or to achieve other purpose, when a desired n-type gallium-nitride semiconductor is formed, it is preferable that Si, Ge, Se, Te, C, or the like, is doped, if necessary. On the other hand, when a p-type gallium-nitride semiconductor is formed, Zn, Mg, Be, Ca, Sr, Ba, or the like, which are p-type dopants, are doped.

Even if a gallium-nitride group compound semiconductor is doped with a p-type dopant, this can hardly provide p-type conductivity. Accordingly, after a p-type dopant is doped, it is preferable to anneal the semiconductor by heating with a furnace, low-speed electron beam irradiation, plasma irradiation, and so on. Specifically, exemplary layer structure of light emitting element can be given as follows. An n-type contact layer of gallium nitride semiconductor, an type cladding layer of aluminum-gallium nitride semiconductor, an active layer of indium-gallium nitride semiconductor with Zn and Si doped thereto, a p-type cladding layer of aluminum-gallium nitride semiconductor, and a p-type contact layer of gallium nitride semiconductor are laminated on the sapphire substrate with the buffer layer of gallium nitride, aluminum nitride, and so on, grown at low temperature, or on silicon carbide. In order to form the light emitting element 60, in the case of the light emitting element 60 with the sapphire substrate, after exposed surfaces of the p-type semiconductor and the n-type semiconductor are by etching or other process, electrodes with desired shapes are formed on the semiconductor layers by using a sputtering process, a vacuum deposition process, and so on. In the case of SiC substrate, a pair of electrodes can be formed so as to use the conductivity of substrate itself.

Subsequently, the formed semiconductor wafer, or the like, is directly and fully cut by dicing saw having a rotating blade with a cutting edge of diamond, or separated by external force after the wafer is cut so as to have a groove of width larger than the cutting edge (half cut). Alternatively, after very thin scribing lines (longitude lines) are drawn in a grid pattern on the semiconductor wafer by a scriber, in which the top of diamond stylus rectilinearly reciprocates, the wafer is separated by external force into chips. As discussed above, it is possible to form the light emitting element 60 of nitride group compound semiconductor.

In the case of light emission in the light emitting apparatus 601 of this embodiment, in consideration of the complementary color to a phosphor, or other relationship with a phosphor, it is preferable that the main light-emission wavelength of the light emitting element 60 is not less than 350 nm and not more than 530 nm.

The light emitting element 60 is an element including a semiconductor light emitting element, and an element for emitting light by vacuum discharge or calorescence. For example, ultraviolet rays by vacuum discharge or the like can be used as a light emitting element. In this embodiment of the present invention, a light emitting element with wavelength 550 nm or less, preferably 460 nm or less, and more preferably 410 nm or less is used, however it is not limited to this. Particularly, as discussed later, in this embodiment, since the durability is high, there is the advantage that a high-power light emitting element can be used.

A group III nitride semiconductor light emitting element is described as the light emitting element 60. For example, the light emitting element 60 has a laminated structure formed above the sapphire substrate so as to interpose a GaN buffer layer between them. In the laminated structure, a first n-type GaN layer, an n-type contact layer, a second GaN layer, a light emitting layer, a p-cladding layer, and a p-type contact layer are successively laminated. The first n-type GaN layer is undoped, or has a low concentration of Si. The n-type contact layer is formed of n-type GaN doped with Si, or n-type GaN which has an Si concentration higher than the first n-type GaN layer. The second GaN layer is undoped, or has an Si concentration lower than the n-type contact layer. The light emitting layer has a multi-quantum-well structure (quantum-well structure with sets of GaN barrier layer/InGaN well layer). The p-cladding layer is formed of p-type GaN doped with Mg. The p-type contact layer is formed of p-type GaN doped with Mg. Electrodes are formed as follows. However, a light emitting element different from this construction can be used.

A p-ohmic electrode is formed on the substantially whole surface of the p-type contact layer. A p-pad electrode is formed on a part of the p-ohmic electrode.

A part of n-type contact layer is exposed by removing the first GaN layer from the p-type contact layer by etching. An n-electrode is formed on the exposed part.

Although the light emitting layer of multi-quantum-well structure is used in this embodiment, the present invention is not limited to this construction. For example, a single-quantum-well structure or multi-quantum-well structure with InGaN may be used. In addition, GaN doped with Si, or Zn may be used.

Varying content of In can vary the main peak wavelength of light emission by the light emitting layer of the light emitting element 60 within a range between 420 and 490 nm. The wavelength of light emission is not limited to the above range, but a light emitting layer with wavelength between 360 nm and 550 nm can be used. Particularly, when the light emitting apparatus of the present invention is applied to an ultraviolet LED light emitting apparatus, the absorption-and-conversion efficiency of excitation light can be improved. Accordingly, it is possible to reduce penetrating ultraviolet light.

(Phosphor)

The phosphor 50 converts visible light or ultraviolet light, which is emitted from the light emitting element 60, into light with wavelength different from the light emitting element 60. For example, it is excited by the light emitted from the semiconductor light emitting layer in the light emitting element 60, and emits luminescent radiation. Phosphors of rare earth garnet group phosphor activated by at least Ce, such as yttrium aluminum garnet (hereinafter, referred to as "YAG") group phosphor, nitride group phosphor such as alkaline-earth silicon-nitride phosphor, and oxynitride group phosphor such as alkaline-earth silicon oxynitride phosphor can be used as a preferable phosphor. In this embodiment, the phosphor 50, which is excited by ultraviolet light and emits light of a desired color, is used as the phosphor. Specifically, the following substance can be used.

(1) $Ca_{10}(PO_4)_6FCl:Sb, Mn$
(2) $M_5(PO_4)_3Cl:Eu$ (where M is at least one alkali earth metal selected from the group consisting of Sr, Ca, Ba, and Mg))
(3) $BaMg_2Al_{16}O_{27}:Eu$
(4) $BaMg_2Al_{16}O_{27}:Eu, Mn$
(5) $3.5MgO.0.5MgF_2.GeO_2:Mn$
(6) $Y_2O_2S:Eu$
(7) $Mg_6As_2O_{11}:Mn$
(8) $Sr_4Al_{14}O_{25}:Eu$
(9) $(Zn, Cd)S:Cu$
(10) $SrAl_2O_4:Eu$
(11) $Ca_{10}(PO_4)_6ClBr:Mn, Eu$
(12) $Zn_2GeO_4:Mn$
(13) $Gd_2O_2S:Eu$
(14) $La_2O_2S:Eu$
(15) $Ca_2Si_5N_8:Eu$
(16) $Sr_2Si_5N_8:Eu$
(17) $SrSi_2O_2N_2:Eu$
(18) $BaSi_2O_2N_2:Eu$
(19) $M_2SiO_4:Eu$ (where M is at least one alkali earth metal selected from the group consisting of Sr, Ca, Ba, and Mg)

A YAG group phosphor which is a rare-earth aluminate phosphor represented by $(Y, Gd)_3(Al, Ga)_5O_{12}:Ce$ emits luminescent radiation of the yellow region can be used additionally to the above substance.

When the light emitted by the light emitting element 60 and the light of luminescent radiation emitted by the phosphor 50 have a complementary color relationship, mixing them can provide white light emission. As the combination of the light emitting element 60 and phosphor 50 which emits white light, specifically, for example, three primary colors (red group, green group, and blue group) of light are given by light from the light emitting element 60 and light emitted by the phosphors 50 excited by the light emitting element 60, or the combination between blue light emitted from the light emitting element 60 and yellow light emitted by the phosphor 50 which is excited by the light emitting element 60. Particularly, in the case where the light emitting element 60 emitting ultraviolet light is used, the total luminescent color is determined only by the luminescent color of the phosphor 50. Accordingly, it is possible to provide a light emitting apparatus with various neutral colors, such as bluish green, yellowish red, red, and so on, for signal light, and pastel color.

Arbitrary white group color tone, such as electric bulb color, can be provided as the light-emission color of light emitting apparatus 601 by adjusting the ratio among the phosphor 50, the inorganic binder, such as various kinds of resin and glass, which serves as a binding agent, the filler, etc., the sedimentation time of phosphor 50, the shape of phosphor 50, or the like, or by selecting the light-emission wavelength of the LED chip. It is preferable that light from the light emitting element 60 and light from the phosphor 50 efficiently pass through the mold member outwardly of the light emitting apparatus 601.

Zinc cadmium sulfide activated by copper, and a YAG group phosphor cerium activated can be given as a typical type of the phosphor 50. Particularly, in use for high luminance and for a long time, it is preferable that $(Re_{1-x}Sm_x)_3(Al_{1-y}Ga_y)_5O_{12}$:Ce (where, $0 \leq x \leq 1$, $0 \leq y \leq 1$, and Re is at least one element selected from the group consisting of Y, Gd, La, Lu, Tb, and Pr), or the like, is employed.

Since the phosphor of $(Re_{1-x}Sm_x)_3(Al_{1-y}Ga_y)_5O_{12}$:Ce has garnet structure, it has heat, light, and moisture resistance, and its peak of excitation spectrum can be near 470 nm. In addition, the light emission peak is near 530 nm, and it is possible to provide broad emission spectrum with foot extending to 720 nm.

In the light emitting apparatus 601 according to this embodiment, as for the phosphor 50, two or more kinds of phosphors may be mixed. That is, the wavelength components of RGB can be increased by mixing two or more kinds of phosphors of $(Re_{1-x}Sm_x)_3(Al_{1-y}Ga_y)_5O_{12}$:Ce with different Al, Ga, Y, La, Lu, Gd, Tb, and Pr, or different content of Sm. In addition, the reddish component can be increased by using a nitride phosphor with yellow to red light emission, thus, it is possible to provide lighting with high general color rendering index Ra, or a light emitting apparatus with electric bulb color. Specifically, adjusting the amount of phosphor with a different chromaticity point on the chromaticity diagram of CIE depending on the light-emission wavelength of light emitting element can provide light emission of arbitrary point on the chromaticity diagram on the line connected between the phosphor and the light emitting element.

This phosphor 50 can be dispersed and uniformly released in the inorganic binder 30. The phosphor 50 in the inorganic binder 30 sediments, or floats depending on its weight.

As for the phosphor 50 formed as mentioned above, the inorganic binder 30 consisting of one layer on the surface of the light emitting device 601 may includes two or more kinds of the phosphors, or the inorganic binder 30 consisting of two layers may include one or two kind(s) in each layer. In addition, the resin 40 may include one or more kind of phosphor(s) 50. Thus, white light can be obtained by color mixture of the light from different the phosphor 50. In this case, in order to provide more preferable color mixture of light emitted from each of the phosphors 50, and to reduce color unevenness, it is preferable that the respective average particle sizes and shapes of the phosphors 50 are similar. In addition, the inorganic binder 30 can be formed in consideration of the sedimentation characteristics depending on the shape. A spray process, a screen printing process, a potting process, and so on, can be given as a formation process of the inorganic binder 30 which is less prone to have the influenced of sedimentation characteristics. In this embodiment, the inorganic binder has the effective solid component of 1 to 80%, and the viscosity can be adjusted in a wide range of 1 cps to 5000 cps, and additionally, the thixotropy characteristics can be adjusted. Accordingly, the inorganic binder is available for these formation processes of inorganic binder 30. As mentioned above, it is preferable that the weight ratio between the filler and the inorganic binder is in the range 0.05 to 30. In addition, adjustment of the amounts of combination, and the particle size of filler can increase the binding force.

The combination of a YAG group phosphor and a phosphor capable of emitting luminescent radiation of red group light, particularly, a nitride phosphor, such as an alkaline-earth silicon-nitride phosphor, can be used as the phosphor used in this embodiment. These YAG group phosphor and phosphor can be mixed and included in the inorganic binder, or may be separately included in a plurality of layers which compose the inorganic binder.

Hereinafter, each phosphor is described.
(YAG Group Phosphor)

The YAG group phosphor used in this embodiment is a phosphor, which contains Y and Al, at least one element selected from the group consisting of Lu, Sc, La, Gd, Tb, Pr, Eu, and Sm, and least one element selected from the group consisting of Ga and In, and is activated by a rare earth element, such as cerium or Pr, and emits luminescent radiation due to excitation by visible light or ultraviolet rays emitted from an LED chip. Particularly, in this embodiment, two or more kinds of yttrium aluminum oxide group phosphors with different compositions activated by cerium, Tb or Pr can be also used. When blue group light emitted from the light emitting element using a nitride group compound semiconductor as a light emitting layer is mixed with green group light and red group light emitted from a phosphor with yellow body color for absorption of the blue light, or yellow group light, which is closer to green group light and red group light, it is possible to provide desired white group light-emission color display. In the light emitting apparatus, in order to provide this color mixture, particles or bulk of the phosphor may be included in various resins, such as epoxy resin, acrylic resin and silicone resin, or transparent inorganic substance such as an inorganic binder according to this embodiment. The resin or the substance including the phosphor can be formed in a dot shape or a film shape to be thin to the extent that light from the light emitting element passes depending on various applications. Arbitrary color tone such as electric bulb color including white can be provided by adjusting the ratio between the phosphor and the transparent inorganic substance, or by selecting the light-emission wavelength of light emitting element.

In addition, when two or more kinds of phosphors are disposed in a certain order in the direction of light incident from the light emitting element, it is possible to provide a light emitting apparatus capable of efficiently emitting light. That is, for example, when layers are laminated on a light emitting element with a reflective member, it is possible to effectively use the reflected light; one layer is a color converting member containing a phosphor capable of absorbing light in long wavelength side and emitting light with long wavelength, i.e., an inorganic binder containing a phosphor as a filler, and other layer is a color converting member capable of absorbing light in the wavelength side longer than that and emitting light with longer wavelength.

Since a YAG group phosphor, which is an yttrium aluminum oxide group phosphor activated by cerium and can emit luminescent radiation of green group light, used in this embodiment, has garnet structure, it has heat, light, and moisture resistance, and its peak of excitation spectrum can be near 420 nm to 470 nm. In addition, the light emission peak wavelength $\lambda p$ is near 510 nm, and provides broad emission spectrum with foot extending to near 700 nm. On the other hand, since a YAG group phosphor, which is an yttrium aluminum oxide group phosphor activated by cerium and can emit luminescent radiation of red group light, used in this embodiment, also has garnet structure, it has heat, light, and moisture resistance, and its peak of excitation spectrum can be near 420 nm to 470 nm. In addition, the light emission peak wavelength $\lambda p$ is near 600 nm, and provides broad emission spectrum with foot extending to near 750 nm.

In the composition of YAG group phosphor with garnet structure, substituting Ga for a part of Al shifts the emission spectrum toward the short wavelength side. Substituting Gd and/or La for a part of Y in the composition shifts the emission spectrum toward the long wavelength side. Thus, varying composition can continuously adjust the luminescent color. Accordingly, the ideal condition of conversion into white group light emission by using blue group light emission of nitride semiconductor is provided by continuous variation of intensity in the long wavelength side by composition ratio of Gd, and so on. When the substitution of Y is less than twenty percent, the green component increases and the red component reduces. On the other hand, when it is not less than eighty percent, the red component increases but luminance sharply reduces. In addition, similarly to the excitation absorption spectrum, in the composition of YAG group phosphor with garnet structure, substituting Ga for a part of Al shifts the excitation absorption spectrum toward the short wavelength side. Substituting Gd and/or La for a part of Y in the composition shifts the excitation absorption spectrum toward the long wavelength side. It is preferable that the peak wavelength of the excitation absorption spectrum of YAG group phosphor is in the short wavelength side relative to the peak wavelength of the emission spectrum of light emitting element. In this construction, when a current supplied to a light emitting element increases, the peak wavelength of the excitation absorption spectrum substantially agrees with the peak wavelength of the emission spectrum of light emitting element. Accordingly, it is possible to provide a light emitting apparatus in which occurrence of chromaticity deviation is kept in check without reduction of excitation efficiency of phosphor.

As for this type of phosphor, an oxide or a compound, which easily becomes into an oxide at high temperature, is employed as a material of Y, Gd, Tb, Pr, Ce, La, Lu, Al, Sm, and Ga, thus, the material is obtained by sufficiently mixing them at the stoichiometric ratio. Alternatively, a mixed material is obtained by mixing a coprecipitated oxide with an aluminum oxide and a gallium oxide; the coprecipitated oxide is obtained by burning a material obtained by coprecipitating solution, in which a rare earth element of Y, Gd, Ce, La, Lu, Al, and Sm are dissolved in acid, with an oxalic acid at the stoichiometric ratio. After mixing the mixed material and an appropriate amount of fluoride such as ammonium fluoride as flux, inserting them in to a crucible, then burning them at temperature 1350° C. to 1450° C. in air for 2 hours to 5 hours, as a result, a burned material can be obtained. Next, the burned material is crushed in water by a ball mill. Then washing, separating, drying it, finally sifting it through a sieve, the photo-luminescent fluorescent material can be obtained. Additionally, a method for producing a phosphor according to another embodiment includes two steps for burning. In a first burning step, mixture composed of mixed material, in which a material of phosphor is mixed, and flux is burned in the air or a weak reducing atmosphere. In a second burning step, the mixture is burned in a reducing atmosphere. The weak reducing atmosphere refers to a reducing atmosphere with low effect including at least a necessary amount of oxygen to form a desired phosphor from a mixed material in the reaction process. The first burning process is performed in this weak reducing atmosphere until desired structure formation of the phosphor is completed, thus, it is possible to prevent a phosphor from turning to black, and light-absorption efficiency from reducing. The reducing atmosphere in the second burning process refers to a reducing atmosphere with high effect stronger than the weak reducing atmosphere. In the case of two steps for burning as discussed above, a phosphor with high absorption efficiency of excitation wavelength is obtained. Accordingly, when a light emitting apparatus is formed by using the phosphor formed as discussed above, the amount of phosphor necessary for obtaining desired color tone can be reduced. Therefore, it is possible to provide a light emitting apparatus with high light-outgoing efficiency.

Two or more kinds of yttrium aluminum oxide group phosphors activated by cerium with different compositions may be mixed or be independently located for use. In the case where the phosphors are independently located, it is preferable that they are located in the order from a light emitting element of a phosphor, which absorbs the light and emits luminescent radiation in the shorter wavelength side, and a phosphor, which absorbs the light and emits luminescent radiation in the wavelength side longer than that. This allows them to efficiently absorb the light and emits luminescent radiation.

(Nitride Phosphor)

An alkaline-earth nitride group phosphor activated by Eu or a rare earth element with yellowish red to red luminescent radiation is preferably employed as a phosphor used in this embodiment other than the aforementioned yttrium aluminum oxide group phosphor activated by cerium. This phosphor absorbs visible light or ultraviolet rays emitted from an LED chip, or light emitted from a YAG group phosphor, and is excited and thus emits luminescent radiation. The phosphor according to this embodiment of the present invention is a silicon nitride such as Sr—Ca—Si—N:R; Ca—Si—N:R; Sr—Si—N:R; Sr—Ca—Si—O—N:R; Ca—Si—O—N:R; and Sr—Si—O—N:R group silicon nitrides. The basic component elements of this phosphor is represented by general formulas $L_X Si_Y N_{(2/3X+4/3Y)}$:R or $L_X Si_Y O_Z N_{(2/3X+4/3Y-2/3Z)}$:R (where L is any element of Sr, Ca, Sr, or Ca). It is preferable that X and Y in the general formulas are X=2, Y=5, or X=1, Y=7, however, arbitrary values can be used. R represents rare earth elements necessary to include Eu. N is nitrogen. O is oxygen. Specifically, as basic component elements, it is preferable that phosphors represented by $(Sr_X Ca_{1-X})_2 Si_5 N_8$:Eu; $Sr_2 Si_5 N_8$:Eu; $Ca_2 Si_5 N_8$:Eu; $Sr_X Ca_{1-X} Si_7 N_{10}$:Eu; $SrSi_7 N_{10}$:Eu; and $CaSi_7 N_{10}$:Eu are employed. However, the phosphor may include at least one element selected from the group consisting of Mg, B, Al, Cu, Mn, Cr, and Ni. However, the present invention is not limited in these embodiments and examples.

L is any element of Sr, Ca, Sr, and Ca. The composition ratio of Sr and Ca can be varied, if desired.

Europium Eu, which is a rare-earth element, is mainly employed as center of luminescent radiation. Europium mainly has a divalent or trivalent energy level. In the phosphor of this embodiment, $Eu^{2+}$ is used as an activation agent for an alkaline-earth-metal group silicon nitride as a base material. In addition, Mn may be used as an additive.

Next, a process for producing the phosphor $((Sr_X Ca_{1-X})_2 Si_5 N_8$:Eu) used in this embodiment of the present invention is described as follows. However, this process is not for the purpose of limiting the invention. The aforementioned phosphor contains Mn, and O.

In the example of the present invention, the nitride group phosphor is particularly used as the phosphor which emits reddish luminescent radiation. However, in this embodiment of the present invention, the light-emitting apparatus can have the above YAG group phosphor and the phosphor capable emitting red group luminescent radiation. This type of phosphor capable of emitting red group luminescent radiation is a phosphor, which is excited by the light with wavelength 250 nm to 600 nm and emit luminescent radiation. For example, $Y_2 O_2 S$:Eu, $La_2 O_2 S$:Eu, CaS:Eu, SrS:Eu, ZnS:Mn, ZnCdS:Ag, Al, ZnCdS:Cu, Al, or the like, can be given as the phosphor. Using the phosphor capable of emitting red group luminescent radiation together with the YAG group phosphor can improve the color rendering of light-emitting apparatus.

In the light emitting apparatus according to each embodiment of the present invention, various phosphors can be used as the phosphor. For example, a barium magnesium aluminate group phosphor activated by europium represented by $BaMgAl_{10} O_{17}$:Eu, a calcium halophosphate group phosphor activated by europium represented by $(Ca, Sr, Ba)_5(PO_4)_3Cl$:Eu, an alkaline-earth chloroborate group phosphor activated by europium represented by $(Ca, Sr, Ba)_2B_5O_9Cl$:Eu, an alkaline-earth aluminate group phosphor activated by europium represented by $(Sr, Ca, Ba)Al_2O_4$:Eu or $(Sr, Ca, Ba)_4Al_{14}O_{25}$:Eu, an alkaline-earth silicon oxynitride group phosphor activated by europium represented by $(Mg, Ca, Sr, Ba)Si_2O_2N_2$:Eu, an alkaline-earth magnesium silicate group phosphor activated by europium represented by $(Ba, Ca, Sr)_2SiO_4$:Eu, a YAG group phosphor which is a rare earth aluminate represented by $(Y, Gd)_3(Al, Ga)_5O_{12}$:Ce or the like, and a rare-earth oxychalcogenide group phosphor activated by europium represented by $(Y, La, Gd, Lu)_2O_2S$:Eu, and so on, can be used as the phosphor. The barium magnesium aluminate group phosphor activated by europium emits luminescent radiation of the blue range. The calcium halophosphate group phosphor activated by europium emits luminescent radiation of the blue range. The alkaline-earth chloroborate group phosphor activated by europium emits luminescent radiation of the blue range. The alkaline-earth aluminate group phosphor activated by europium emits luminescent radiation of the bluish green range. The alkaline-earth silicon oxynitride group phosphor activated by europium emits luminescent radiation of the green range. The alkaline-earth magnesium silicate group phosphor activated by europium emits luminescent radiation of the green range. The YAG group phosphor emits luminescent radiation of the yellow range. The rare-earth oxychalcogenide group phosphor activated by europium emits luminescent radiation of the red range. But, the phosphor is not limited to these materials. Additionally the aforementioned phosphor, or other phosphor can be used in the inorganic binder according to the present invention. Furthermore, a phosphor with fracture surfaces which is treated against coating deterioration may be used.

In the aforementioned phosphors, such as the alkaline-earth chloroborate group phosphor activated by the europium, the alkaline-earth aluminate group phosphor activated by the europium, the alkaline-earth silicon oxynitride group phosphor activated by the europium, the YAG group phosphor, and the alkaline-earth silicon nitride group phosphor activated by the europium, for example, it is preferable that they contain a B element, so that their crystallinity becomes excellent, their particle sizes become large, and their crystal shape is adjusted. This can improve luminance of light emission. These phosphors are also effective as a filler of phosphor according to this embodiment.

As for the crystal structure, for example, $Ca_2Si_5N_8$ has a monoclinic system, $Sr_2Si_5N_8$ and $(Sr_{0.5}Ca_{0.5})_2Sr_5N_8$ have a orthorhombic system, and $Ba_2Si_5N_8$ has a monoclinic system.

In addition, this phosphor includes 60% or more of, preferably 80% or more of crystalline substance in its composition. Typically, it is preferable that x=2, y=5 or x=1, y=7, but arbitrary values can be used.

In a very small amount of additive, B, or the like, can improve crystallinity without reducing light emission characteristics. Mn, Cu, and so on, also achieve a similar effect. In addition, La, Pr, and so on, are effective for improving light emission characteristics. In addition, Mg, Cr, Ni, and so on, have an effect that makes persistence short, thus, they are used if necessary. In addition, elements which are not shown in this specification can be added without reducing luminance remarkably, if their concentrations are within a range about 10 to 1000 ppm.

It is preferable that at least one element of Y, La, Ce, Pr, Nd, Gd, Tb, Dy, Ho, Er, and Lu is included as the rare earth element contained in R. But, R, Sc, Sm, Tm, or Yb may be included. Additionally, B, Mn, and so on, other than the above elements have an effect that improve luminance, thus, they may be included. These rare-earth elements are mixed in the material as single substance, oxide, imide, amide, or other states. Although rare earth elements mainly have a stable trivalent configuration, Yb, Sm, and so on, can also have a divalent configuration, and Ce, Pr, Tb, and so on, can also have a tetravalent configuration. When a rare earth element oxide is used, oxygen affects light emission characteristics of the phosphor. In other words, when oxygen is included, light emission luminance may reduce. But, when Mn is used, the particle size becomes larger due to the flux effect of Mn and O, thus, it is possible to improve light emission luminance.

Europium Eu, which is a rare-earth element, is preferably employed as center of fluorescent. Specifically, examples of basic composition elements are given as follows: $Ca_2Si_5O_{0.1}N_{7.9}$:Eu, $Sr_2Si_5O_{0.1}N_{7.9}$:Eu, $(Ca_xSr_{1-x})_2Si_5O_{0.1}N_{7.9}$:Eu and $CaSi_7O_{0.5}N_{9.5}$:Eu in which Mn and B are added; $Ca_2Si_5O_{0.5}N_{7.9}$:Eu, $Sr_2Si_5O_{0.5}N_{7.7}$:Eu and $(Ca_xSr_{1-x})_2Si_5O_{0.1}N_{7.9}$:Eu in which rare earth is added; or the like.

The nitride group phosphor discussed above absorbs a part of blue light emitted from the light emitting element, and emits light in the range from yellow to red. This phosphor is used for the light emitting apparatus of the aforementioned construction, thus, it is possible to provide a light emitting apparatus which radiates warm, white light by mixing colors of blue light emitted from the light emitting element and red light of the phosphor. Particularly, in a white light emitting apparatus, the apparatus preferably includes a nitride group phosphor, and an yttrium aluminum oxide phosphor material activated by cerium which is a rare-earth aluminate phosphor. Including the aforementioned yttrium aluminum oxide phosphor can adjust desired chromaticity. The yttrium aluminum oxide phosphor activated by cerium can absorb a part of blue light emitted from the light-emitting element and emit luminescent radiation of yellow region. The blue group light emitted from the light-emitting element and the light of the yttrium aluminum oxide phosphor are mixed, thus, bluish white light emission can be obtained. Accordingly, the phosphor, which has the binder mixed with the yttrium aluminum oxide phosphor and the aforementioned nitride phosphor together, blue light emitted by the light emitting element are combined, thus, it is possible to provide a warm, white light emitting apparatus. In this warm, white light emitting apparatus, the general color rendering index Ra can be 75 to 95, and the color temperature can be 2000 K to 8000 K. Especially, it is preferable that a white light emitting apparatus, which has a high general color rendering index Ra, and the color temperature of which is located on the blackbody line in the chromaticity diagram. In order to provide a light emitting apparatus with desired color temperature and general color rendering index, the amounts of combination of the yttrium aluminum oxide phosphor and the phosphor, or the composition ratio of phosphors can be changed if necessary. Particularly this warm white light emitting apparatus is aimed at improving the special color rendering index R9. In a conventional light emitting apparatus which is composed of the combination of a blue light emitting element and an yttrium aluminum oxide phosphor activated with cerium and emits white light, the special color rendering index R9 is low, and the reddish component is insufficient. Accordingly, there was a problem to be solved that the special color rendering index R9 was improved. On the other hand, an alkaline-earth silicon nitride oxide phosphor activated by Eu is included in the yttrium aluminum oxide phosphor activated by cerium, thus, the special color rendering index R9 can be increased to the range 40 to 70. In addition, it is possible to produce an LED light emitting apparatus of electric bulb color light emission.

(Base Member)

The base member 20 is composed of the recessed portion 20a which accommodates the light emitting element 60, and the base portion in which the lead terminals 22 are located, and serves as a support member of the light emitting element 60. It is preferable that the bottom of said recessed portion 20a and the bottom of said lead terminal lie on the substantially same surface.

It is preferable that the base member 20 is made of metal, but resin may be used in consideration of processing, productivity, and so on. The base member 20 can have various shapes, such as substantially square shape, the substantially rectangular shape, substantially circular shape, and substantially ellipse shape, as viewed from the light-outgoing side. It is preferable that the recessed portion 20a is formed in the part to mount the light emitting element 60. The reason is that, when the light emitting element 60 is accommodated in the recessed portion 20a, the light emitted from the light emitting element 60 can outgoes toward the opening side of the recessed portion 20a. Accordingly, it is possible to improve output of light.

In the light emitting apparatus 601, it is preferable that the base member 20 is formed of a thin shape in consideration of the heat diffusion characteristics and miniaturization.

The base member 20 may also have a plurality of openings depending on the number and size of the light emitting elements 60. Preferably, in order to achieve light shield effect, base member 20 is colored in dark color, such as black and gray, or its light-outgoing front side is colored in dark color. The base member 20 may also have a molding member, which is a transparent protective member, in addition to the coating layers, in order to protect the light emitting element 60 from the environmental influence. In addition, the base member 20 is preferably made of a material with low thermal expansion coefficient when subjected to thermal influence from the light emitting element 60 in consideration of bonding with the molding member.

The light emitting element 60 and the base member 20 may be bonded together with a thermosetting resin, or the like. Specifically, epoxy resin, acrylic resin or imide resin can be used. When the light emitting apparatus 601 employing the light emitting element 60, which emits light including ultraviolet rays, is operated at high output power, since the ultraviolet rays, and so on, emitted from the light emitting element 60 are reflected by the inorganic binder 30 as the molding member, the phosphor 50 contained therein, and so on, the ultraviolet rays, and so on exist in the bonding part between the light emitting element 60 and the base member 20 at high density. This causes deterioration of resin in the bonding part due to ultraviolet rays, and may result in problems such as the reduction of light-emitting efficiency due to yellowing discoloration of the resin, and short lifetime of the light emitting apparatus due to reduction of adhesion strength. In order to prevent such deterioration of the resin in the adhesion part due to ultraviolet rays, resin including an ultraviolet absorbing agent, more preferably an inorganic material according to the present invention, or the like, is used. Particularly when the base member is made of a metallic material, the inorganic material according to the present invention or eutectic solder such as Au—Sn is used for adhesion between the light emitting element 60 and base member 20. As a result, the adhesion part not deteriorates dissimilarly to the case where resin is used for adhesion, even when the light emitting apparatus 601 employing the light emitting element 60 that emits light including ultraviolet rays is operated at high output power.

Ag paste, carbon paste, ITO paste, metal bump or the like is preferably used for securing the light emitting element 60 and electrically connecting the external terminals provided in the base member 20.

(Lead Terminal)

The light emitting apparatus 601 has the positive and negative lead terminals 22. They are inserted into the through holes provided in the base portion of the metal base member 20 so as to interpose the insulating member 23 between each electrode and each hole. The fore end of said lead terminals 22 protrudes from the surface of said base portion. The bottom of said lead terminal 22 lies on the substantially same plane as the bottom in the mount-side of said recessed portion.

(Lid Member)

The light emitting apparatus 601 is provided with the lid member 26, which has the lid 24 composed of the transparent window portion 25 and the metal portion, in the principal plane side of the base member 20. It is preferable that the window portion 25 located in the light emission surface of the light emitting apparatus 601, and in the center thereof.

The window portion 25 is located above the upper surface of the light emitting element 60 located in the recessed portion 20a of the base member 20, and has intersection with the extension of the inner wall of the recessed portion 20a. Light emitted from the end of the light emitting element 60 is reflected and scattered on the side surface of the recessed portion 20a, and thus outgoes frontward. It is considered that the reflected and scattered light travels substantially in the range of defined by the extension of the surface of the recessed portion 20a. Accordingly, as discussed above, the area of the window portion 25 which is the light emission surface is adjusted, thus, the reflected scattered light is efficiently collected toward the window portion 25. Therefore, it is possible to the light emitting apparatus 601 which can emit light of high luminance.

The window portion 25 is transparent. The window portion 25 may includes the phosphor 50. A phosphor 50 film may be attached the window portion 25.

Although various materials, such as glass, epoxy resin, and polypropylene, can be used as the window portion 25, glass is preferably used in terms of heat resistance.

The lid member 26 is provided on the base member 20, and provides airtight sealing. airtight sealing can prevent moisture from entering the light emitting apparatus 601.

(Wire)

The wire 21 is required to provide good ohmic contact and mechanical connection with the electrode of the light emitting element 60 and high electrical conductivity and heat conductivity. Specifically, the wire 21 can be made of a metal such as gold, copper, platinum or aluminum, or an alloy thereof. The wire 21 made of such a material can be used to easily connect between the electrode of the light emitting element 60 and an inner lead, a mount lead, or the like, by means of a wire bonding apparatus.

(Method for Producing Light Emitting Apparatus)

Figure 33:
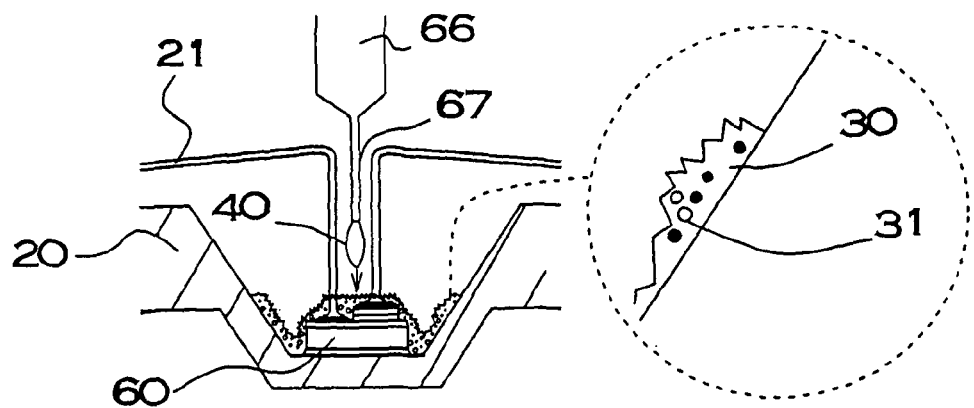
FIG. 33 is a schematic view showing a part of process for producing a light emitting apparatus according to an embodiment of the present invention.
Figure 33:
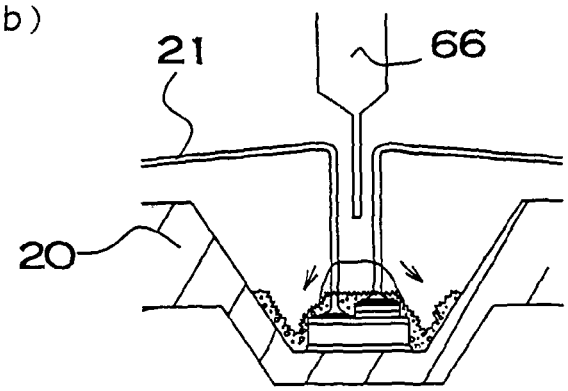
Figure 33:
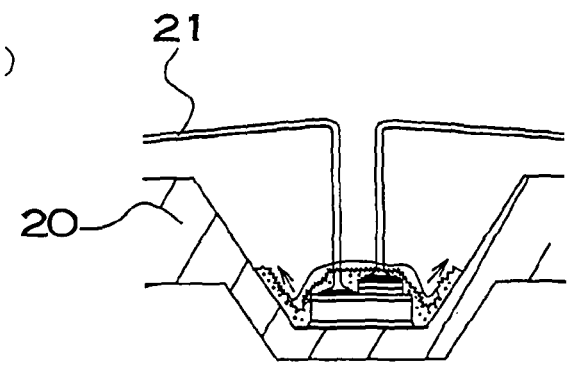
Figure 33:
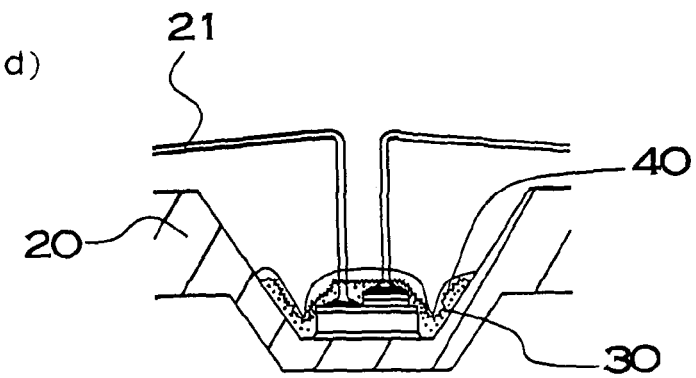
Figure 34:
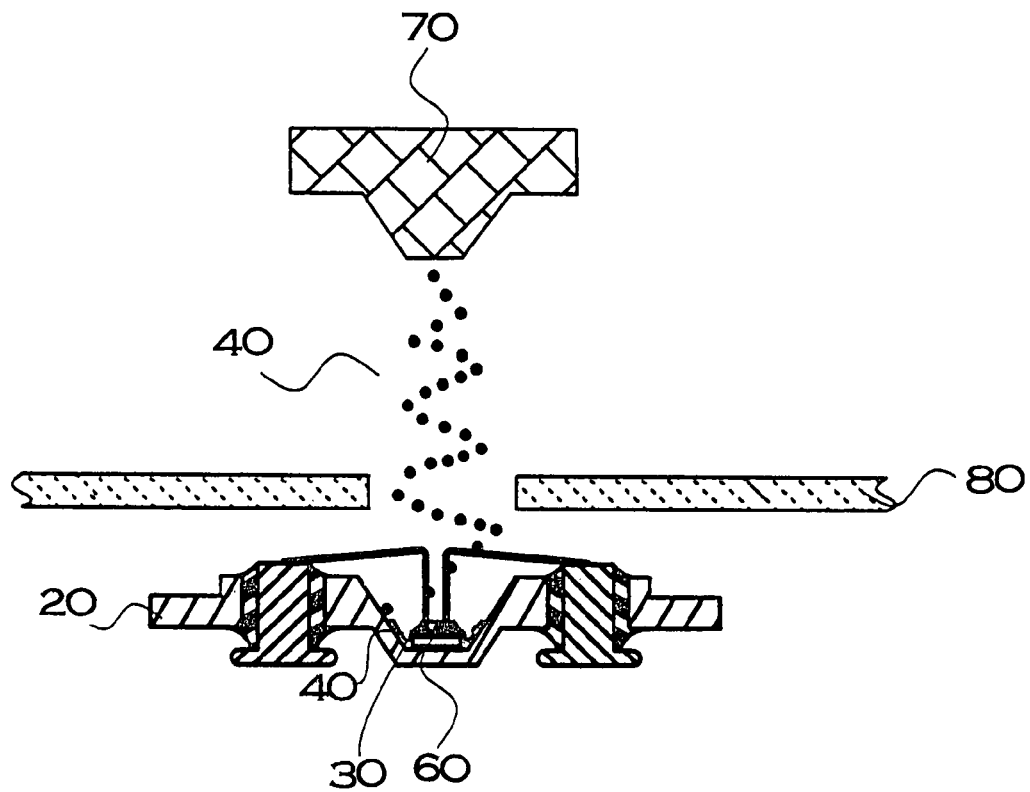
FIG. 34 is a schematic view showing a part of another process for producing a light emitting apparatus according to the embodiment of the present invention.
Figure 35:
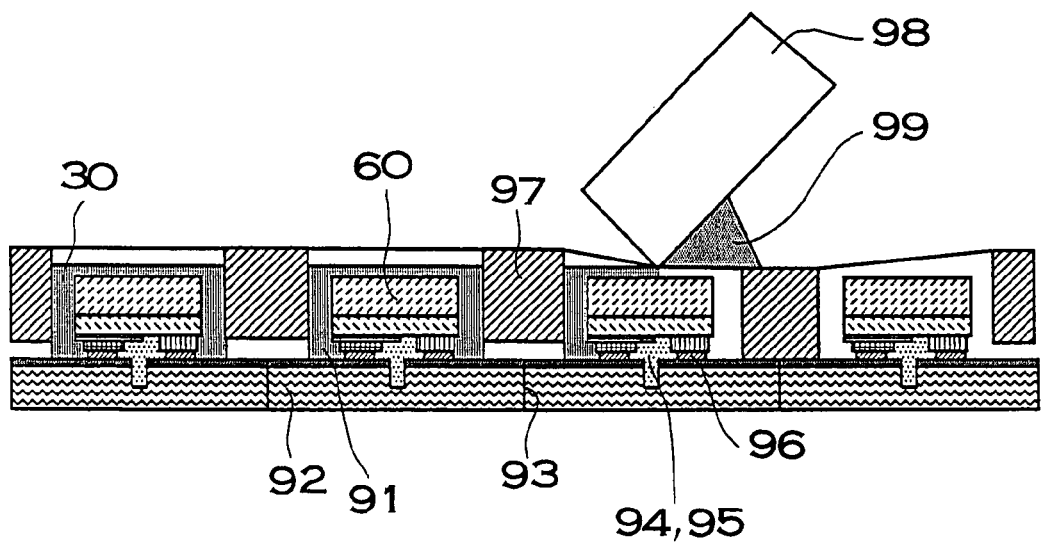
FIG. 35 is a schematic view showing a part of still another process for producing a light emitting apparatus according to the embodiment of the present invention.

With reference to FIGS. 31 to 35, a method for producing of a light emitting apparatus is described. FIG. 31 is a schematic plan view of the light emitting apparatus according to the sixth embodiment of the present invention, as discussed above. FIG. 32(a) is a schematic cross-sectional view of the light emitting apparatus. FIG. 32(a) is an enlarged schematic cross-sectional view of the recessed portion of the base member. FIG. 33 is a schematic view showing a part of producing processes of the light emitting apparatus according to this embodiment of the present invention. FIG. 34 is a schematic view showing a part of other producing processes of the light emitting apparatus according to the embodiment. FIG. 35 is a schematic view showing a part of still other producing processes of the light emitting apparatus according to the embodiment. Specifically, FIG. 34 is a schematic view showing a formation process of the inorganic binder 30 layer or the resin 40 by spray means. FIG. 35 shows a formation process of the inorganic binder 30 layer or the resin 40 by screen printing means. With reference to these Figures, the method for producing of a light emitting apparatus is described. However, the following processes show one embodiment, but are not restrictive.

(First Process)

The light emitting element 60 is mounted onto the base member 20. The base member 20 is provided with the recessed portion 20a formed therein. The light emitting element 60 is mounted onto this recessed portion 20a. The light emitting element 60 is die-bonded with an adhesive agent, such as epoxy resin. After the light emitting element 60 is mounted, the electrode of the light emitting element 60 and the lead terminal 22 are electrically connected with the wire 21.

(Second Process)

The light emitting element 60 is coated with the inorganic binder 30. It is preferable that the inorganic binder 30 previously contains the phosphor 50. This phosphor 50 is mixed and uniformly dispersed in the inorganic binder 30. Potting means, spray means, screen printing means, pouring means, or the like, can be used for the inorganic binder 30, but potting means or spray means is preferably used. The inorganic binder 30 coats the whole upper surface and side surfaces of the light emitting element 60. In addition, the inorganic binder 30 coats the bottom and the side surfaces of recessed portion 20a where the light emitting element 60 is mounted. The inorganic binder 30 has the layer structure in a thin film state. A third process is performed after the inorganic binder 30 is cured, but before curing, the resin 40 and the inorganic binder 30 can be cured at the same time by performing the third process.

For example, the light emitting element 60 is coated with the inorganic binder 30 by using screen printing means. A screen plate 97 is prepared for the light emitting element 60. The screen plate 97 has a desired shape, such as stripe shape, grid shape, a concentric circle shape, a triangular shape, and a dot shape. The light emitting element 60 is mounted on a conductive member 91 located on the upper surface of the submount substrate 92 in a facedown manner. A prescribed groove is provided in the submount substrate 92 so that the positive electrode and the negative electrode do not make a short circuit. After an insulating member 94 is previously provided between electrodes of the light emitting element 60 in the submount substrate 92 side, the light emitting element 60 is die-bonded onto the upper surface of the submount substrate 92 with a bump 96. Subsequently, the inorganic binder material 99 containing a phosphor is printed by using a squeegee 98 in a screen printing manner. Thus, the light emitting element 60 which coated with the inorganic binder 30 having uniform constant thickness can be formed. After that, the submount substrate 92 is cut along partings 93. This process preferably is performed in a vacuum, but may be performed in an inert gas atmosphere (Third Process)

The inorganic binder 30 is coated with the resin 40. The resin 40 may previously contain the phosphor 50. Potting means, spray means, screen printing means, pouring means, or the like, can be used for the resin 40, but potting means or spray means is preferably used. The resin 40 coats the surface of the inorganic binder 30. It is preferable that the resin 40 has the film structure in a thin film state. The resin 40 permeates the inorganic binder 30, thus, the voids existing in the inorganic binder 30 is filled with the resin 40. Thus, the light emitting apparatus 601 can be produced. This process preferably is performed in a vacuum, but may be performed in an inert gas atmosphere (Potting Means and Spray Means)

FIG. 33 is a schematic view showing a part of process for producing a light emitting apparatus according to an embodiment of the present invention. Known potting means can be used as the potting means. With reference to FIG. 33(a), a method for coating the inorganic binder 30 with the resin 40 by using potting means is described. The resin 40 to be applied is injected to a potting tool 66 attached to a potting apparatus (not shown). In consideration of viscosity, wettability, penetration to the inorganic binder 30, bonding characteristics, and so on, material, temperature, potting velocity, and so on, of the resin 40 are adjusted. The sol of the resin 40 is potted from the tip of a nozzle 67 of the potting tool 66 to the upper surface of the inorganic binder 30 which is the target. In this case, it is preferable that the resin 40 to be potted does not touch the wire 21.

As shown in FIG. 33(b), the resin 40 is potted from the upper surface side of the light emitting element 60, and permeates the inorganic binder 30 from the part where it is potted. In this case, the voids existing in the inorganic binder 30 are impregnated with the resin 40, thus, gas existing in the voids outgoes through the side of the resin 40 where it can easily outgoes. The resin 40 slowly flows to the periphery of the light emitting element 60. In this case, the resin 40 flows so as to extrude the gas existing in the voids of the inorganic binder 30 in the periphery of the light emitting element 60.

As shown in FIG. 33(c), the resin 40 rises from the periphery of the light emitting element 60 to the side of the recessed portion 20a. This rise is caused by capillary phenomenon. Also, in this case, the resin 40 extrude the base member in the voids 31, thus, it is possible to prevent gas from entering the resin 40.

As shown in FIG. 33(d), it is possible to form the resin 40 layer coating the inorganic binder 30 layer. The resin 40 layer has substantially uniform thickness. The surface of resin 40 layer is smooth.

A method for coating the inorganic binder 30 with the inorganic binder 30 instead of the resin 40 by using potting means is substantially similar to the method as discussed above.

FIG. 34 is a schematic view showing a part of other processes for producing a light emitting apparatus according to the present invention. Known spray means can be used as the spray means. A spray apparatus (not shown) having a vessel (not shown), a valve (not shown), a circulation pump (not shown), and a nozzle 70, which are connected with a conveyance tube (not shown), is used. The vessel contains the resin 40 which is coating solution. The valve adjusts the flow rate of the coating solution. The circulation pump conveys the coating solution from the nozzle 70 to the vessel after conveying the coating solution to the nozzle 70. The nozzle 70 spirally discharges the coating solution.

The container that contains the coating solution is equipped with a mixer (not shown) that constantly stirs the coating solution during the coating operation. The coating solution contained in the container is constantly stirred by the mixer, so that the phosphor contained in the coating solution is always uniformly distributed in the coating solution, when the phosphor is contained in the coating solution. The valve opens and closes so as to regulate the flow rate of the coating solution that is sent from the container through the transport tube. The circulation pump sends the coating solution from the container via the valve and the compressor through the transport tube to the distal end of the nozzle 70 and then sends the remaining coating solution that has not been discharged from the nozzle 70 through the transport tube 308 to the container. Since the coating solution is sent by the circulation pump from the container via the valve through the transport tube to the distal end of the nozzle and is then sent through the transport tube to the container, the coating solution is always circulating in the spray apparatus. As a result, since the coating solution is always stirred or circulating in the spray apparatus, the phosphor contained in the coating solution is always uniformly distributed in the coating solution during the coating operation. The compressor is installed in the apparatus via the transport tube, and compresses air that is transported through the transport tube and regulates the pressure of the coating solution being sent through the transport tube. Air which is compressed and the coating solution of which pressure is controlled by the compressor is sent to the nozzle 70. The pressure of the compressed air is monitored with a pressure gage. The coating solution is sprayed with the high-pressured gas at high speed by means of the aforementioned spray apparatus, and thus is applied on the upper surface, the side surfaces, and the interior surface of the light emitting element.

An apparatus which sprays the coating solution and a gas (air, in this embodiment) in a spiral stream from the nozzle 70 is used. The apparatus has several gas vents disposed around the nozzle. The gas discharged from these vents is directed at a certain angle relative to the surface to be coated. As a result, as the gas is supplied through the vents that rotate around the coating solution nozzle, the gas stream formed by all the gas discharged from the vents becomes an eddy stream, a spiral stream, or a air stream in an inverted tornado. The nozzle of this apparatus has the vent for the coating solution located at the center thereof. The coating solution is discharged simultaneously as the gas is discharged. As a result, the coating solution in the form of mist is carried by the gas stream, which is an eddy stream, a spiral stream, or a air stream in an inverted tornado, and thus diffuses.

Diameter of the spray stream diffusing in a spiral shape increases from the start position of the spray above the light emitting element as the stream is closer to the surface of the light emitting element. Rotation speed of the spray stream of the coating solution decreases from the start position of the spray above the light emitting element as the stream is closer to the surface of the light emitting element. That is, the coating solution spreads in a conical shape in the vicinity of the nozzle, which is the start position of the spray, as the spray of the coating solution is discharged from the nozzle and diffuses in the air, on the other hand, the spray expands in a cylindrical shape at a position away from the nozzle. In this embodiment, for this reason, it is preferable to adjust the distance between the bottom end of the nozzle and the upper surface of the light emitting element, so that the surface of the light emitting device is located at a position where the spray expands in a cylindrical shape. At this position, since the spray is rotating in a spiral manner at a decreased speed, the coating solution spray sufficiently covers not only the entire upper surface of the light emitting element but also the side surfaces thereof, while reaching portions of the upper surface that is hidden by the conductive wire. Accordingly, this operation can be performed in the state the light emitting element or the nozzle are secured. Since velocity of the spray has decreased at the position where the spray expands in a cylindrical shape, the surface of the light emitting element does not receive impact from the phosphor particles contained in the solution when the surface of the light emitting element is exposed to the spray. In addition, the conductive wire is not deformed nor broken, therefore, the yield and workability are improved.

The light emitting apparatus after the application is heated on a heater at the temperature of not less than 50° C. and not more than 500° C. The light emitting element may be heated in an oven or the like, as another manner of heating a light emitting element. As ethanol and a small amount of moisture and solvent contained in the hydrolysate solution in the form of sol are evaporated by heating, mainly amorphous $Al(OH)_3$ or AlOOH is obtained from the sol of coating solution. Since the coating solution in this embodiment has a controlled level of viscosity, the solution does not flow out of the upper surface, side surfaces and corners of the light emitting element and the surface of the supporting member where it has been sprayed, and is heated at the place immediately after being sprayed. As a result, the upper surface, the side surfaces and corners of the light emitting element can be covered with the coating layer with the phosphor bound by AlOOH.

In this embodiment, in the state where a plurality of base members 20 are disposed, the light emitting elements 60 are die-bonded onto the base members 20, and the electrodes of the light emitting element 60 are connected to the lead terminals 22 by wire-bonding. After that, the light emitting element 60 is coated with the inorganic binder 30, then the resin 40 is sprayed onto the inorganic binder 30 from the upper side. In order to prevent the resin from adhering on a part other than a prescribed part, for example, a part other than the recessed portion 20a, the resin 40 is sprayed onto the surface of the light emitting device from the upper side of a mask 80. The mask 80 is a sheet that completely covers the outside of the recessed portion 20a of the base member 20, and has openings of such a size that allows the resin 40. The mask can be made of a metal, a reinforced plastic, or the like.

Since when spray means is used the resin 40 is sprayed in granular shapes, the gas existing in the voids 31 outgoes through the space between the granules. The amount of gas dissolved in the resin 40 decreases. The gas content in the resin 40 can be reduced.

Seventh Embodiment

Figure 36:
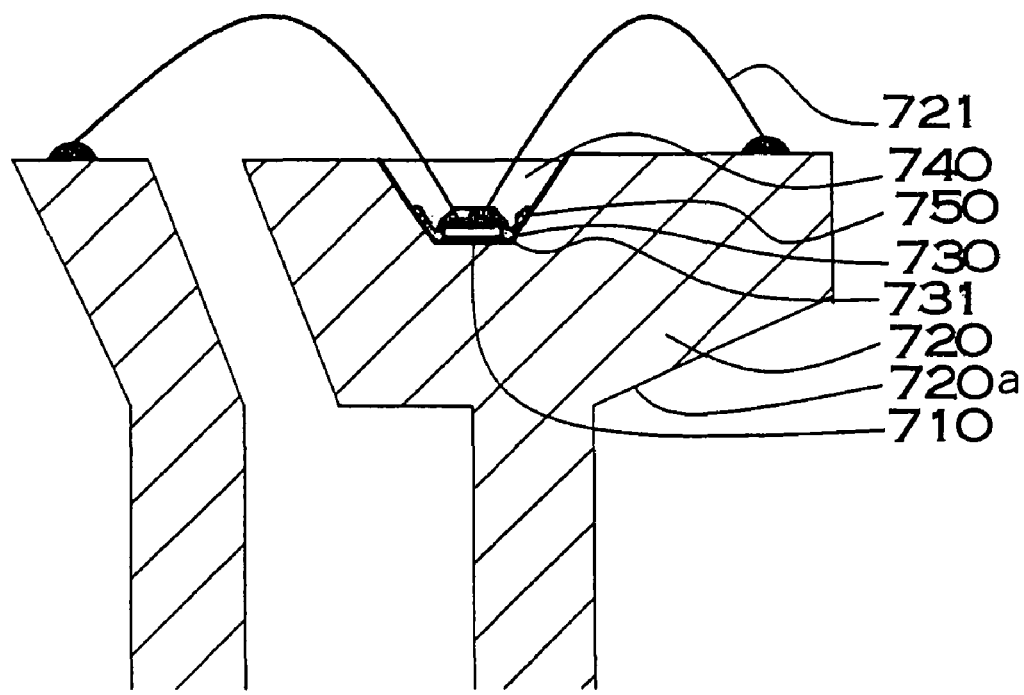
FIG. 36($a$) is an enlarged schematic cross-sectional view of a recessed portion of a base member according to a seventh embodiment of the present invention, and FIG. 36($b$) is a perspective view showing the light emitting apparatus.
Figure 36:
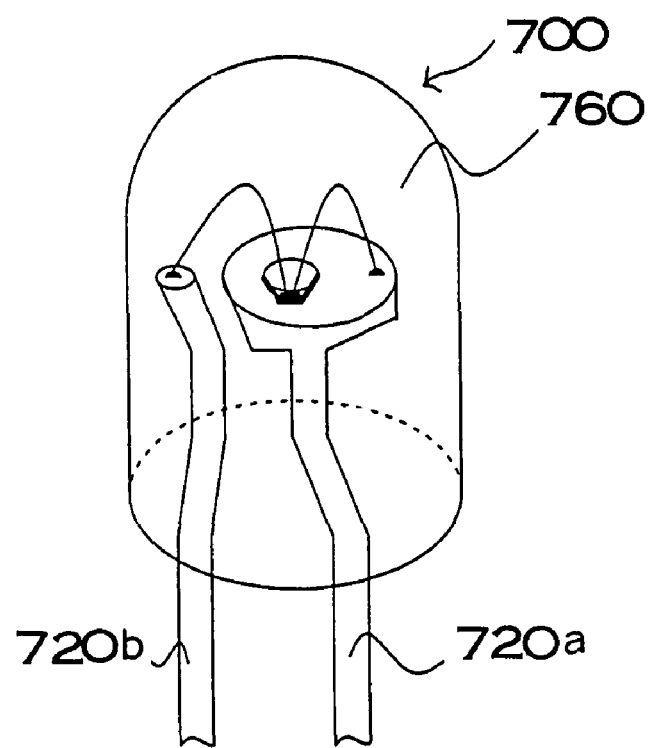

With reference to FIG. 36, a light emitting apparatus according to a seventh embodiment of the present invention is described. FIG. 36(a) is an enlarged schematic cross-sectional view of a recessed portion of a base member according to the seventh embodiment. FIG. 36(b) is a perspective view showing the light emitting apparatus. Specifically, the light emitting apparatus shown in these Figures is a bullet-shaped light emitting apparatus. A light emitting apparatus 700 has a light emitting element 710, a set of lead frames (base member) 720 where the light emitting element 710 is mounted, an inorganic binder 730 coating the light emitting element 710, a phosphor 750 contained in the inorganic binder 730, a resin 740 coating the inorganic binder 730, and a member 760. Curing the inorganic binder 730 produces voids 731. When they serve as the aforementioned members, their description is omitted.

The light emitting element 710 composed of a bullet-shaped light emitting apparatus 700, for example, is mounted in a substantially central part of a recessed portion 720a disposed on the upper part of a mount lead, which is a base member, by die-bonding. The electrodes formed in the light emitting element 710 are electrically connected to the mount lead 720 and an inner lead 720 of a lead frame 720 with wires 721. The Phosphor 750 contains a YAG group phosphor and a nitride group phosphor which absorb at least a part of light emitted light in the light emitting element 710 and emit luminescent radiation of wavelength different from the absorbed light. In addition, the nitride group phosphor can be coated with a coating material, such as microcapsule. This phosphor 750 is uniformly dispersed in the inorganic binder 730. The inorganic binder 730 containing the phosphor 750 is provided in the recessed portion where the light emitting element 710 is mounted. As mentioned above, in order to protect the light emitting element 710 and the phosphor 750 from external stress, moisture, dust, and so on, and to improve the light-outgoing efficiency, the lead frame 720 in which the light emitting element 710 and the phosphor 750 are provided is molded with a mold member 760, thus, the light emitting apparatus 700 is formed. A lens, or the like, may be formed of a mold member.

The inorganic binder 730 and the light emitting element 710 are coated with the resin 740 by using spray means or potting means. The recessed portion 720a of the lead frame 720 is filled with the resin 740. When the surface of the resin 740 is flat to control the directivity, the light-outgoing efficiency can be improved.

(Molding Member)

The molding member 760 can be provided to protect the light emitting element 710, the conductive wires 721, and the inorganic binder 730 layer containing the phosphor 750, resin 740, and so on, from the outside, or for the purpose of improving the light-outgoing efficiency depending on the application of the light emitting apparatus 700. The molding member 760 can be formed preferably of various kinds of resin or glass. Specifically, a transparent resin having high weather resistance such as epoxy resin, urea resin, silicone resin or fluorocarbon resin, or glass can be employed as a material of the molding member 760. A diffusion agent may also be contained in the molding member in order to mitigate the directivity of light emitted from the light emitting element 710 and to increase the viewing angle. The molding member 760 can be made of a material that is the same as or different from that of the resin 740.

Eighth Embodiment

Figure 37:
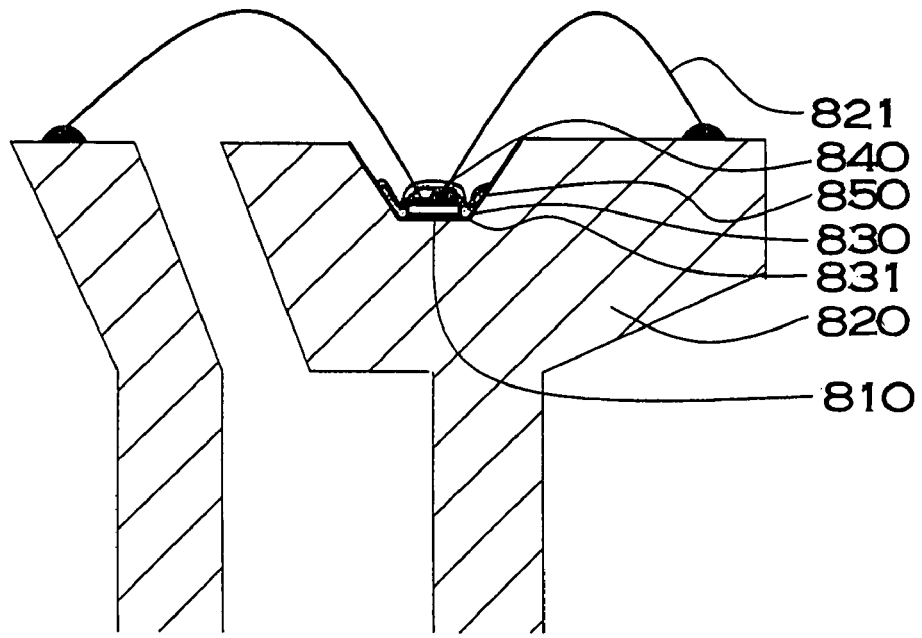
FIG. 37($a$) is an enlarged schematic cross-sectional view of a recessed portion of a base member of a light emitting apparatus according to an eighth embodiment of the present invention, and FIG. 37($b$) is a perspective view showing the light emitting apparatus.
Figure 37:
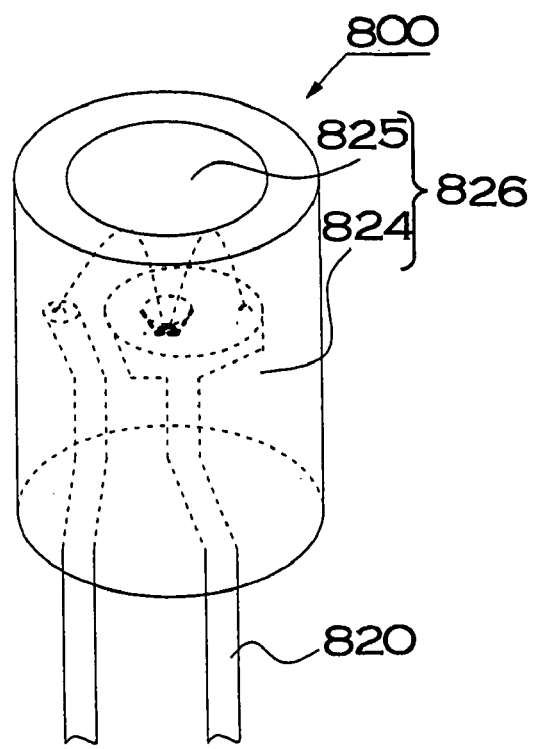

With reference to FIG. 37, a light emitting apparatus according to an eighth embodiment of the present invention is described. FIG. 37(a) is an enlarged schematic cross-sectional view of a recessed portion of a base member of the light emitting apparatus. FIG. 37(b) is a perspective view showing the light emitting apparatus. Specifically, the light emitting apparatus in this example is also a bullet-shaped light emitting apparatus 800. A light emitting apparatus 800 has a light emitting element 810, a set of lead frames (base member) 820 where the light emitting element 810 is mounted, an inorganic binder 230 coating the light emitting element 810, a phosphor 850 contained in the inorganic binder 830, a resin 840 coating the inorganic binder 830, and a cap 826. Curing the inorganic binder 830 produces voids 831. The electrode is electrically connected to the lead frame 820 with a wire 821. When they serve as the members in the foregoing seventh embodiment, their description is omitted.

In the light emitting apparatus 800, the lead frame 820 where the light emitting element 810 is mounted is sealed with the cap 826. It is preferable that this sealing is airtight sealing. A window portion 825 is provided on the upper surface of cap 826. The light from the light emitting element 810 passes through the window portion 825. A lid 824 supports the window portion 825.

Ninth Embodiment

Figure 38:
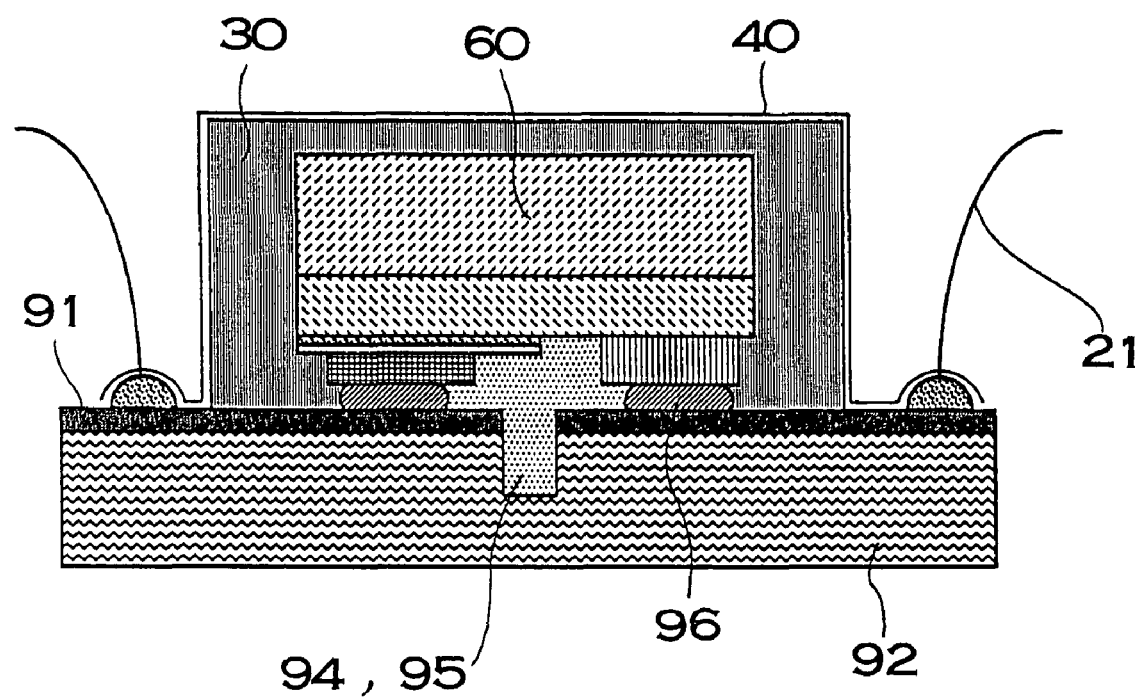
FIG. 38 is a schematic cross-sectional view showing a part of a light emitting apparatus according to a ninth embodiment of the present invention.

With reference to FIG. 38, a light emitting apparatus according to a ninth embodiment of the present invention is described. FIG. 38 is a schematic cross-sectional view showing a part of the light emitting apparatus. Particularly, it is a schematic cross-sectional view of the periphery of the light emitting element 60 coated the inorganic binder 30 and the resin 40 by using the screen printing means shown in FIG. 35. The light emitting element 60 is mounted on the submount substrate 92 in a facedown manner. The inorganic binder 30 is provided on the surface of the light emitting element 60 by using the screen printing means. Subsequently, the submount base member 92 where the light emitting element 60 is mounted is attached to the light emitting apparatus, and the wire 21 is bounded onto the conductive member 91. In addition, the inorganic binder 30 is impregnated with the resin 40 by using potting means, and so on. Thus, it is possible to provide a light emitting apparatus having the inorganic binder 30 the surface of which is impregnated with the resin 40. Additionally, the wire 21 may be bounded after the resin 40 is potted on inorganic binder 30.

EXAMPLES 30 to 32

Examples 30 and 31)

Figure 42:
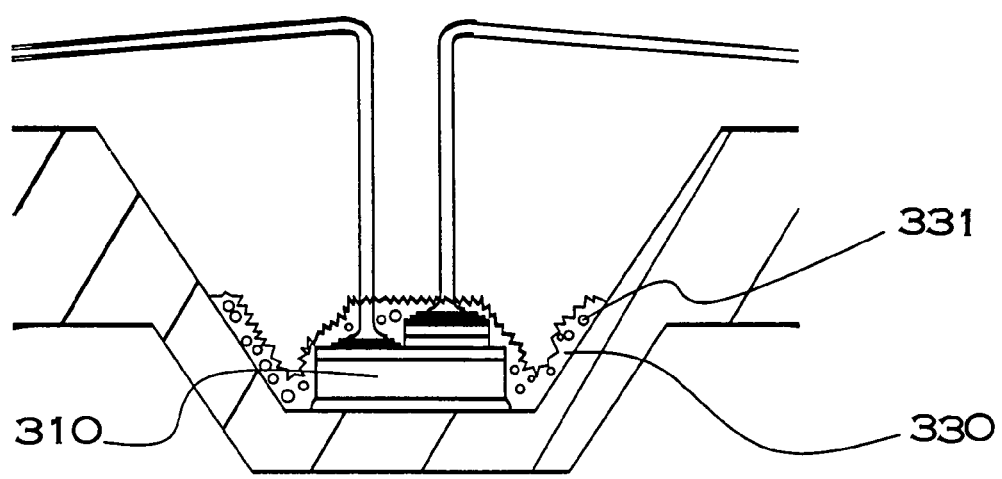
FIG. 42 is a schematic cross-sectional view showing a light emitting apparatus of a comparative example.

The result of examples 30 to 32 as examples produced corresponding to the foregoing embodiments 6 to 9 is described. The examples 30 and 31 were bullet-shaped light emitting apparatuses. FIG. 33 is a schematic view showing a part of process for producing a light emitting apparatus according to the examples 30 and 31. FIG. 34 is a schematic view showing a part of process for producing a light emitting apparatus according to the examples 30 and 31. FIG. 37(a) is an enlarged, schematic cross-sectional view showing a recessed portion of a base member according to the examples 30 and 31. FIG. 37(b) is a perspective view showing the light emitting apparatus 800 according to the examples 30 and 31. FIG. 42 is a schematic cross-sectional view showing a light emitting apparatus according to a comparative example 3.

The structure of the examples 30 and 31 is as follows. A dice of light emitting element with main light-emission wavelength of 400 nm and 0.35 mm square was used as the light emitting element 810. A wire consisting principally of Au is used as the wire 821. Yttrium oxide sol (yttrium oxide sol of Taki Chemical Co., Ltd.) was used for the inorganic binder 830. A YAG phosphor of $(Y_{0.8}Gd_{0.2})_3Al_5O_{12}$:Ce was used for the phosphor 850. As for the resin 840, a silicone resin for impregnation (trade name: KJF816, Shin-Etsu Silicones Chemical Co., Ltd.) was used in the example 30, and a silicone resin for impregnation (trade name: KJF816L, Shin-Etsu Silicones Chemical Co., Ltd.) was used in the example 31. The fundamental physical characteristics of the silicone resin for impregnation in the example 30 were viscosity 100 (mm$^2$/sec), specific gravity (25° C.) 0.97, volatile matter (105° C./3 hours) 0.5, cure state of rubber-shaped film, and hardness (ASCA C) 60. The fundamental physical characteristics of the silicone resin for impregnation in the example 31 were viscosity 60 (mm$^2$/sec), specific gravity (25° C.) 0.97, volatile matter (105° C./3 hours) 0.5, cure state of rubber-shaped film, and hardness (ASCA C) 60.

The examples 30 and 31 were produced by the following method. First, the light emitting element 810 was mounted onto the lead frame (base member) 820. The lead frame 820 was provided with the recessed portion 820a with a large opening. The light emitting element 810 was mounted onto the bottom of the recessed portion 820a. The substrate side of the light emitting element 810 was die-bonded so as to be in contact with the bottom of the recessed portion 820a. The light emitting element 810 was die-bonded with eutectic solder such as Au—Sn. After the light emitting element 810 was mounted, the electrode of the light emitting element 810 and the lead terminal were electrically connected with the wire 821.

After the phosphor 850 was measured, the prescribed amount of the phosphor 850 was added to a prescribed amount of the inorganic binder 830, and was uniformly mixed. Specifically, 10 g of yttrium oxide sol and 10 g of YAG phosphor was provided in a 100 ml beaker. Ethanol was added at 50% by weight relative to the yttria oxide sol. It was sufficiently stirred and mixed, thus, phosphor/sol slurry was obtained.

Subsequently, the inorganic binder 830 was sprayed onto the light emitting element 810 mounted onto the lead frame 820 by using spray means, thus, the inorganic binder 830 was adhered. The inorganic binder 830 was adhered by using spray means, thus, an inorganic binder 830 layer with substantially uniform thickness could be formed on the upper surface and the side surfaces of the light emitting element 810, and the bottom of the recessed portion 820a and the side surface of the lead frame 820. The mask 80 was provided so as to prevent the inorganic binder 830 from being adhered to a prescribed part, and the inorganic binder 830 was sprayed. After the inorganic binder 830 was sprayed and adhered, it was hated for curing at about 240° C. and for 30 minutes.

Subsequently, the resin 840 was potted to the surface of inorganic binder 830 layer by using a potting tool. The resin 840 is potted so as to drop substantially right above the light emitting element 810 and on the substantially center part of the inorganic binder 830 layer. The resin 840 quickly permeated from the surface center part of the inorganic binder 830 layer, and spread toward the peripheral thereof, and filled the voids the inorganic binder 830. The resin 840 coated the whole surface of the inorganic binder 830 layer until it was given a gloss. It was considered that capillary phenomenon caused the rise of the resin 840 to the surface of the inorganic binder 830 layer on the side surfaces of the recessed portion of the lead frame 820. Thus, the resin 840 layer with uniform thin thickness was formed on the surface of inorganic binder 830 layer. After the potting, the light emitting element 810 was coated with the inorganic binder 830 layer and the resin 840 layer. The lead frame 820 where the light emitting element 810 was mounted was heated at about 150° C. for about 3 hours, thus, the resin 840 was cured.

Finally, in a nitrogen gas atmosphere, lead frame 820 was sealed with the cap 826. The cap 826 was filled with nitrogen gas. The recessed portion 820a of the lead frame 820 was located under the window portion 825 of the cap 826. Thus, the light emitting apparatus 800 according to each of the examples 30 and 31 was produced.

(Measurement Result of Durability Test)

Figure 39:
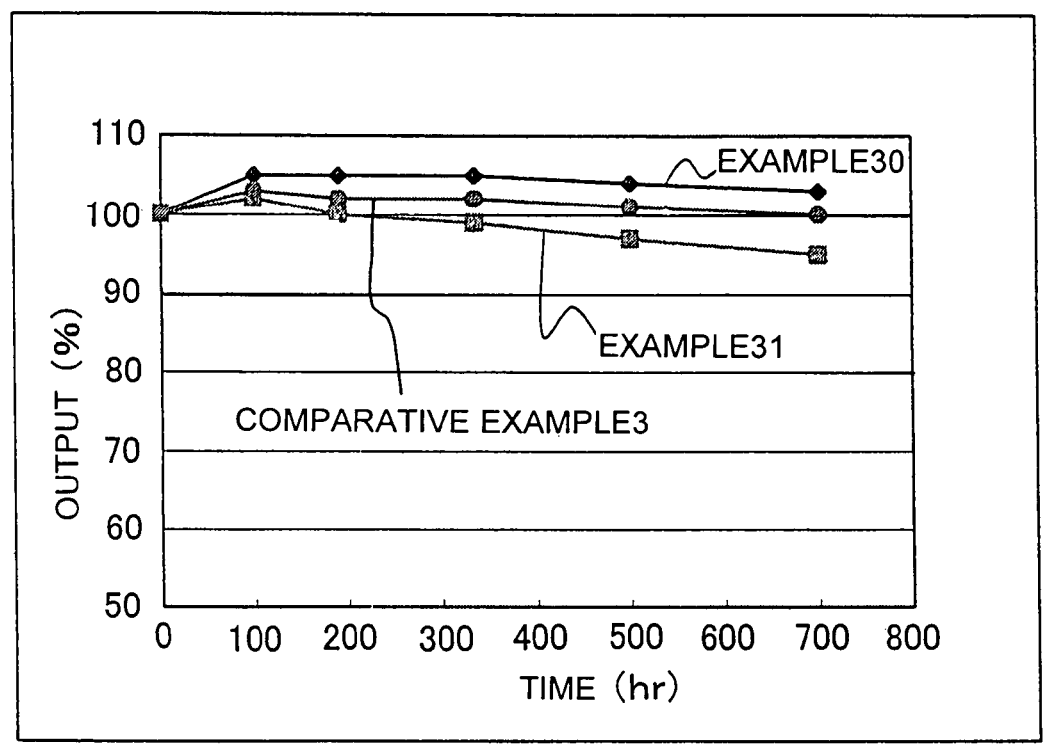
FIG. 39 is a graph showing a result of a durability test of the light emitting apparatuses of the examples.

A durability test was conducted for the light emitting apparatuses according to the examples 30 and 31. FIG. 39 is a graph showing the result of a durability test of the light emitting apparatuses according to the examples 30 and 31, and the comparative example 3. In the comparative example 3, the light emitting element 810 was not coated with the inorganic binder 830 nor the resin 840, and only the light emitting element 810 was mounted on the recessed portion 820a of the lead frame 820. Other structure was same as the example 30.

A drive test was conducted for the light emitting apparatuses according to the examples 30 and 31 at room temperature and 100 mA. The output values were measured after 100-hour operation, the 200-hour operation, the 350-hour operation, the 500-hour operation, and 700 hours, where the output value at 0-hour operation, which was immediately after start of operation, was defined as 100%. As a result, all the light emitting apparatuses according to the examples 30 and 31, and the comparative example 3 kept high output values even after 700-hour operation.

(Measurement Result of Light-Outgoing Efficiency)

Figure 40:
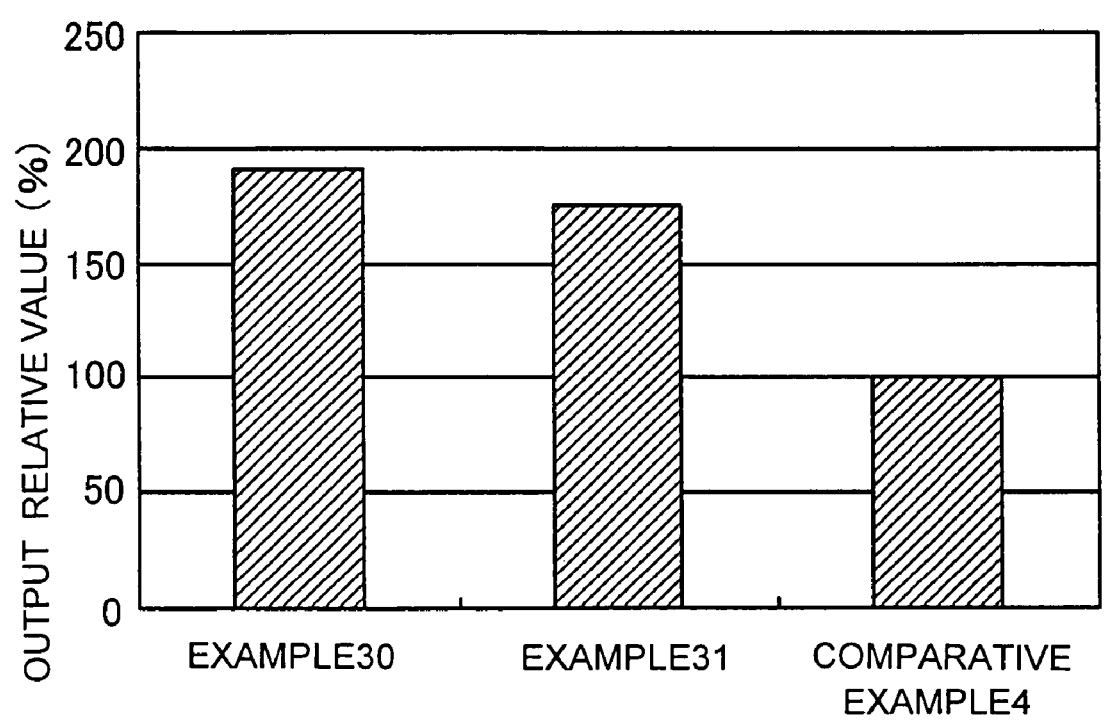
FIG. 40 is a graph showing a result of light-outgoing efficiency of the light emitting apparatuses of the examples.

The light-outgoing efficiency was measured for the light emitting apparatuses according to the examples 30 and 31. FIG. 40 is a graph showing the result of light-outgoing efficiency values of the light emitting apparatuses according to the examples 30 and 31, and the comparative example 4.

FIG. 42 is a schematic cross-sectional view showing the light emitting apparatus of the comparative example 4. In the comparative example 4, the inorganic binder is not coated with the resin, and only an inorganic binder 330 was used. The YAG phosphor 850 similar to the example 30 was used as the inorganic binder 330 in the comparative example 4. In the light emitting apparatus according to the comparative example 4, the upper surface of a light emitting element 310 was coated with the inorganic binder 330. The inorganic binder 330 contained numbers of voids 331.

A prescribed current was applied to the light emitting apparatus of each of the examples 30 and 31 and the comparative example 4, and the light output was measured. As a result, it was observed that the light-outgoing efficiency of the example 30 was 1.91 times increase than the comparative example 4. It was observed that the light-outgoing efficiency of the example 31 was 1.75 times increase than the comparative example 4. The reason was assumed that the voids 331 existing in the inorganic binder 330 layer according to the comparative example 4 reflected light from the light emitting element 310. In other words, since the air, such as nitrogen, was contained in the voids 331, the difference of the refractive indices between the inorganic binder 330 and the air caused reflection in the interface between the air and the inorganic binder 330. For this reason, the light emitting apparatuses of the examples 30 and 31 had excellent durability. Accordingly, it is possible to provide a light emitting apparatus with high light-outgoing efficiency.

(Measurement Result of Infrared Spectral Spectrum)

Figure 41:
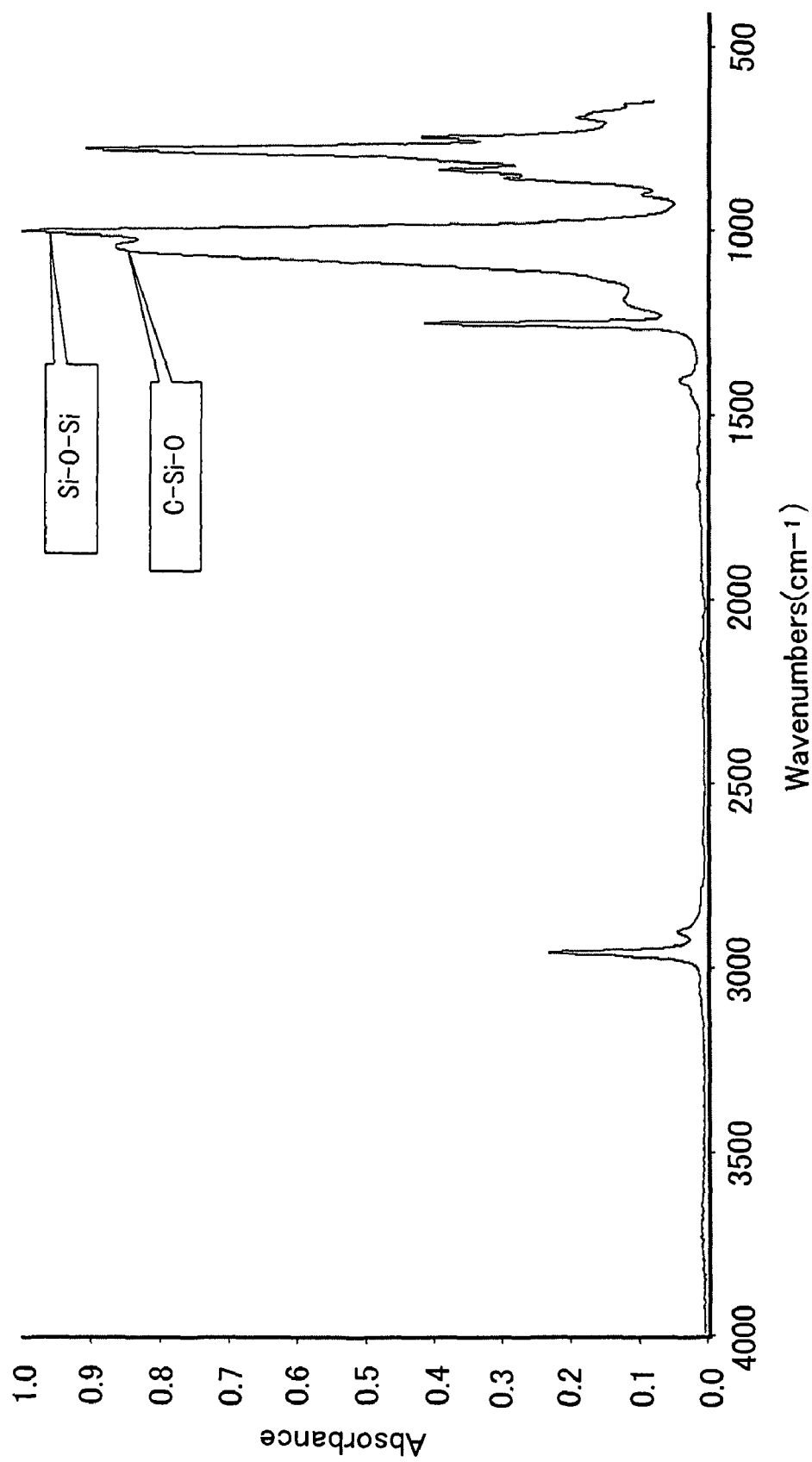
FIG. 41 is a graph showing a result of infrared spectral spectrum of coating of the example.
Figure 43:
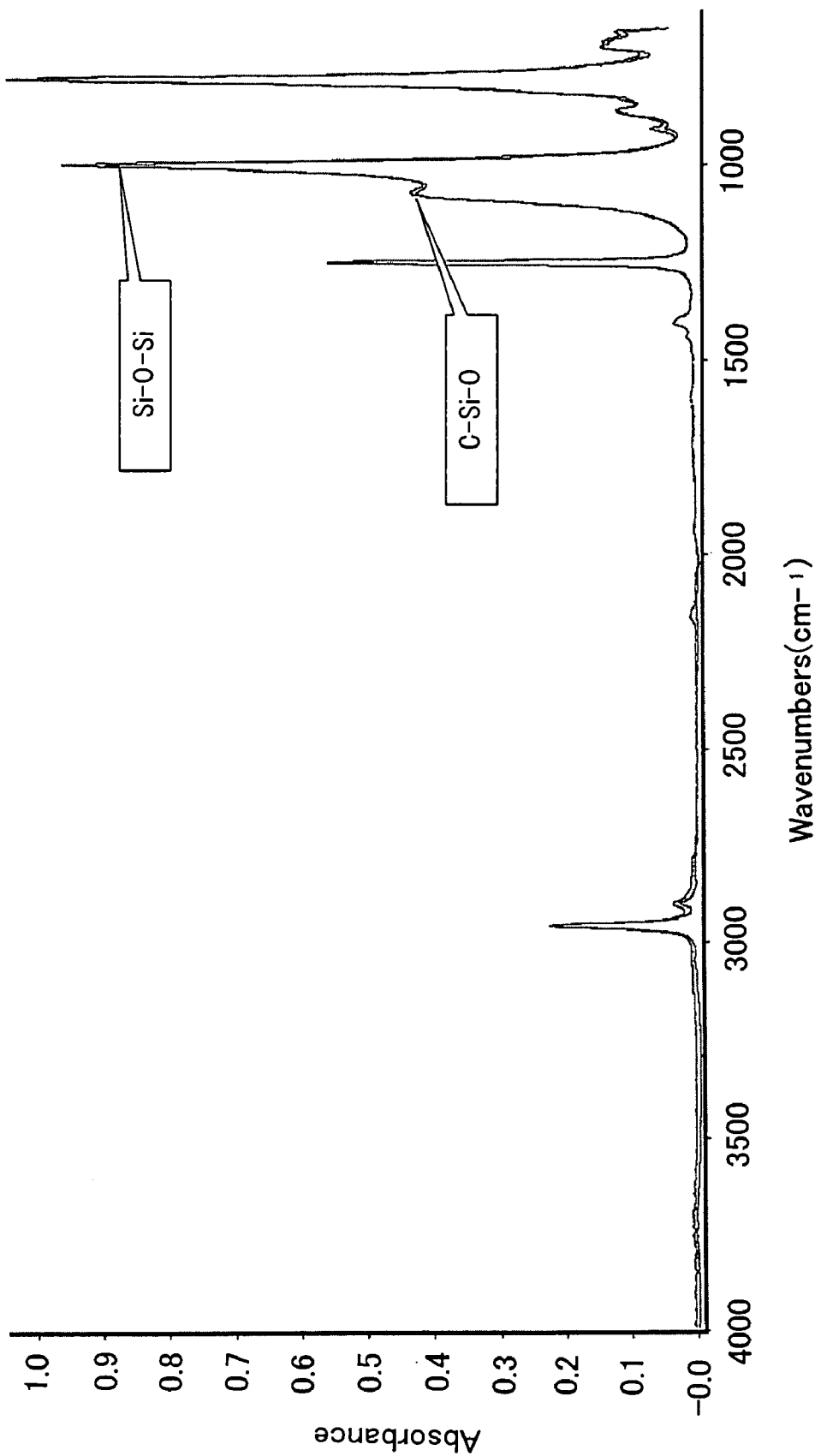
FIG. 43 is a graph showing a result of infrared spectral spectrum of coating of the comparative example.

The infrared spectrum of the silicone resin for impregnation in the example 30 was measured. The infrared spectrum of the silicone resin in the comparative example 5 was measured for sake of comparison. FIG. 41 is a graph showing a result of infrared spectral spectrum of coating of the example 30. FIG. 43 is a graph showing the result of infrared spectral spectrum of the coating of the comparative example 5. The infrared spectrum is the result of measurement by Fourier transform infrared spectroscopy. Nexus870<body> and Continu μm <microspectro> (both are made of Nireco Japan, Corporation) were used as a measuring apparatus of Fourier transform infrared spectroscopy.

The light emitting apparatus employing the silicone resin for impregnation in the example 30 had excellent light-outgoing efficiency, heat resistance, durability, and so on, as compared with the light emitting apparatus employing the silicone resin in the comparative example 5. In addition, the deterioration of the resin was kept in check. The reason was assumed that the rate of C—Si—O bonding was lower than Si—O—Si bonding. When the rate of C—Si—O bonding was small, three-dimensional network bonding with small bridge formation density was formed, thus, it was considered that resin coating in a rubber or gel state with relatively high flexibility could be formed. In the case of a rubber or gel state, it is possible to accelerate mitigation of the internal stress, and to prevent peel-off due to thermal expansion.

The strength ratio of C—Si—O bonding relative to Si—O—Si bonding in the composition of the resin of the coating in the comparative example 5 was 1.16/1. That of the coating in the example 30 was 2.21/1. In addition, the silicone resin of the comparative example 5 was a typical silicone resin.

Example 32

The example 32 was a bullet-shaped light emitting apparatus. FIG. 35 is a schematic view showing a part of process for producing a light emitting apparatus according to the example 32. FIG. 38 is a schematic cross-sectional view showing a part of a light emitting apparatus according to the ninth embodiment of the present invention. Particularly, it is a schematic cross-sectional view showing a process for coating the light emitting element 60 with the inorganic binder material 99 containing a phosphor by using the screen printing means shown in FIG. 35. FIG. 38 is a schematic cross-sectional view showing the periphery of the light emitting element 60 when the light emitting element 60 is coated with the inorganic binder 30, and the inorganic binder 30 is impregnated with the resin 40. The example 32 had substantially same structure as the examples 30 and 31 except the state where the light emitting element 810 was mounted. FIGS. 37(a) and 37(b) are perspective views showing the light emitting apparatus according to the examples 30 and 31. It has reference numerals different from the example 32, but has the substantially same structure as the example 32. The following description mainly describes parts of the example 32 different from the examples 30 and 31.

Alumina sol (trade name: Al-520, Nissan Chemical Industries, Ltd.) was used for the inorganic binder 30. The alumina sol was processed with an ion exchange resin, thus, the concentration of nitric acid ion which is a stabilizer could be low. 20 g of YAG phosphor of $(Y_{0.8}Gd_{0.2})_3Al_5O_{12}$:Ce was added to 10 g of alumina sol, and sufficiently mixed and stirred. The adjusted phosphor paste was used, and a phosphor film was formed on a dice wafer by using screen printing means in a screen printing manner. As for the resin 40, a silicone resin for impregnation (trade name: KJF816, Shin-Etsu Silicones Chemical Co., Ltd.) or a silicone resin for impregnation (trade name: KJF816L, Shin-Etsu Silicones Chemical Co., Ltd.) could be used.

The light emitting element 60 in the example 32 was mounted on the upper surface of the submount substrate 92 in a facedown manner. The inorganic binder 30 was provided on the surface of the light emitting element 60 that was mounted in a facedown manner by using screen printing means. The light emitting element 60 was mounted on and electrically connected to the submount substrate 92 through the conductive member 91 and the bump 96, and was bounded through the submount substrate 92 with the wire 21. The surface of the inorganic binder 30 was impregnated with the resin 40. After the impregnated of the resin 40, the surface of the inorganic binder 30 was given a gloss.

The following description describes a method for forming the inorganic binder 30 in the method for producing of the light emitting apparatus of the example 32. First, the conductive members 91 were provided on the surface of the submount substrate 92, and a conductive pattern with the insulating portion 94, which separated the positive electrode and the negative electrode, was formed.

It is preferable that the material of the submount base plate 92 is a material with coefficient of thermal expansion substantially equal to a semiconductor light emitting element, for example, aluminium nitride for a nitride semiconductor light emitting element. The thermal stress generated between the submount base plate 92 and the light emitting element 60 can be mitigated by employing such a material. Alternatively, it is preferable to use silicon which can be used as protective element with p-type semiconductor region and the n-type semiconductor region, and has relatively high heat diffusion, and is inexpensive. It is preferable to use silver, gold, or aluminum with high reflectivity as the conductive member 91.

In order to improve the reliability of the light emitting apparatus, the gap produced between the insulating portion 60 between positive and negative electrodes of the light emitting element 94 is filled with an under fill member 95. The under fill member 95 is provide in the periphery of the insulating portion 94 of the aforementioned submount base plate 92. The under fill member 95 is a thermosetting resin, such as, a silicon resin, and an epoxy resin. In addition, in order to mitigate the thermal stress of the under fill member 95, aluminum nitride, aluminum oxide, a mixture compound of them, and so on, may be mixed in the epoxy resin. The amount of the under fill is the extent to fill the space defined by the positive and negative electrodes of the light emitting element and the submount base plate 92.

The positive and negative electrodes of the light emitting element 60 was opposed to the positive and negative terminals of the aforementioned conductive pattern located on the submount substrate 92, respectively, and was fastened with the bump 96. When the submount is used as the protection element, the positive electrode and the negative electrode of the light emitting element are connected to the n-type semiconductor region and the p-type semiconductor region of the protective element, respectively. The bump 96, which is a conductive member, is formed on the positive and negative electrodes of the light emitting element 60. The bumps 96 may be formed for the positive and negative terminals of the conductive pattern of the submount substrate 92. When the under fill material 95 provided in the periphery of the insulating portion 94 of the submount substrate 92 was soft, the positive and negative electrodes of the light emitting element 60 were opposed to the positive and negative terminals of the aforementioned conductive pattern so as to interpose the bump 96 between the electrode and the terminal. Subsequently, the positive and negative electrodes of the light emitting element, the bumps 96, and the aforementioned conductive pattern were thermally compressed by load, heat, or supersonic wave. In this case, the under fill between the bump 96 and each of the positive and negative terminals of the aforementioned conductive pattern was removed, the electrodes of the light emitting element could be electrically connected to the aforementioned conductive pattern. For example, the material of the bump 96, which is a conductive member, is Au, eutectic solder (Au—Sn), Pb—Sn, lead free solder, or the like.

The screen plate 97 was provided from the substrate side of the light emitting element 60. Instead of the screen plate 97, a metal mask may be provided a position where an organic binder containing a phosphor layer should not be formed such as a ball bonding position of the conductive wire, and a parting line formation position.

A material containing a phosphor in alumina sol with thixotropy was adjusted, and was provided by screen printing with the squeegee (spatula) 98.

The screen plate 97 was detached, and the material containing a phosphor was cured. Cutting element by element along with parting lines provided the light emitting element 60 having an inorganic binder material containing a phosphor.

In addition, the aforementioned light emitting element 60 can be fastened to the bottom of the recessed portion of the package with Ag paste as an adhesive agent. The lead terminal partially exposed in the bottom of the recessed portion can be connected to the conductive pattern provided in the submount substrate with the conductive wire, thus, it is possible to provide a light emitting apparatus. For example, the light emitting apparatus in this example may have a lens for controlling directivity of the light emitting apparatus, a metal base member provided with a recessed portion, which improves heat diffusion and mounts the light emitting element, in a part of its bottom. Additionally, it is preferable that a mold member, such as silicone resin, is provided in the gap between the lower surface of the lens, and the wall surface of the recessed portion of the package. This construction can improve the outgoing efficiency of light from the light emitting element, and provide a light emitting apparatus with high reliability.

A method for producing of the light emitting apparatus of the example 32 is described. In the example 32, the description of the substantially same structure as the examples 30 and 31 is omitted.

First, the light emitting element 60 was mounted on the submount substrate 92 in a facedown manner. The submount base plate 92 was electrically connected to the light emitting element 60 with the bump 96. A groove portion was provided so as to form different-type terminals on the submount substrate 92 to prevent a short circuit between the different-type terminals by a filling insulating portion in the this groove portion.

Subsequently, screen printing was performed on the light emitting element 60 mounted in a facedown manner, and the submount base plate 92 by using the screen plate 97. The inorganic binder material 99 containing a phosphor was used for the inorganic binder 30 layer to be used for screen printing. However, the inorganic binder material 99 which does not contain a phosphor may also be used. The uniform inorganic binder 30 layer was formed on the upper surface and the side surfaces of the light emitting element 60 by using screen printing means. 20 g of YAG phosphor was added to 10 g of alumina sol was sufficiently mixed and stirred. It was used for a material of the inorganic binder 99 containing a phosphor. After the inorganic binder 30 was formed on the upper surface and the side surfaces of the light emitting element 60, the inorganic binder 30 was cured in a nitrogen atmosphere under the temperature rise conditions at about 150° C. for 30 minutes, and at about 240° C. for 30 minutes. The reason was to remove an organic component contained in the inorganic binder 30, for example. The temperature rise conditions are not limited, but the temperature rise conditions may be at about 100° C. for 30 minutes, and then at about 240° C. for one hour.

Subsequently, the light emitting element 60 (210) mounted on the aforementioned submount base plate 92 in a facedown manner was mounted on the lead frame (base member) 820. The lead frame 820 was provided with the recessed portion 820a with a large opening. The light emitting element 60 (210) was mounted onto the bottom of the recessed portion 820a. The substrate side of the light emitting element 60 (210) was die-bonded so as to be in contact with the bottom of the recessed portion 820a. The light emitting element 60 (210) was die-bonded with eutectic solder such as Au—Sn. After the light emitting element 60 (210) was mounted, the conductive member 91 of the submount base plate 92 was electrically connected to the lead terminal with the wire 821.

Subsequently, the resin 40 (240) film was potted to the surface of inorganic binder 30 (230) film by using a potting tool. The resin 40 (240) was potted so as to drop substantially right above the light emitting element 60 (210) and on the substantially center part of the inorganic binder 30 (230) film. The resin 40 (240) quickly permeated from the surface center part of the inorganic binder 30 (230) film, and spread toward the peripheral thereof, and filled the voids the inorganic binder 30 (230). The resin 40 (240) coated the whole surface of the inorganic binder 30 (230) film until it was given a gloss. Thus, the resin 40 (240) film with uniform thin thickness was formed on the surface of inorganic binder 30 (230) film. After the potting, the light emitting element 60 (210) was coated with the inorganic binder 30 (230) film and the resin 40 (240) film. The lead frame 820 where the light emitting element 60 (210) was mounted was heated at about 150° C. for about 3 hours, thus, the resin 840 was cured. A silicone resin for impregnation (trade name: KJF816, Shin-Etsu Silicones Chemical Co., Ltd) was used for the silicone resin.

Finally, in a nitrogen gas atmosphere, lead frame 820 was sealed with the cap 826. The cap 826 was filled with nitrogen gas. The recessed portion 820a of the lead frame 820 was located under the window portion 825 of the cap 826. Thus, the light emitting apparatus according to the example 32 was produced.

Tenth Embodiment

Figure 44:
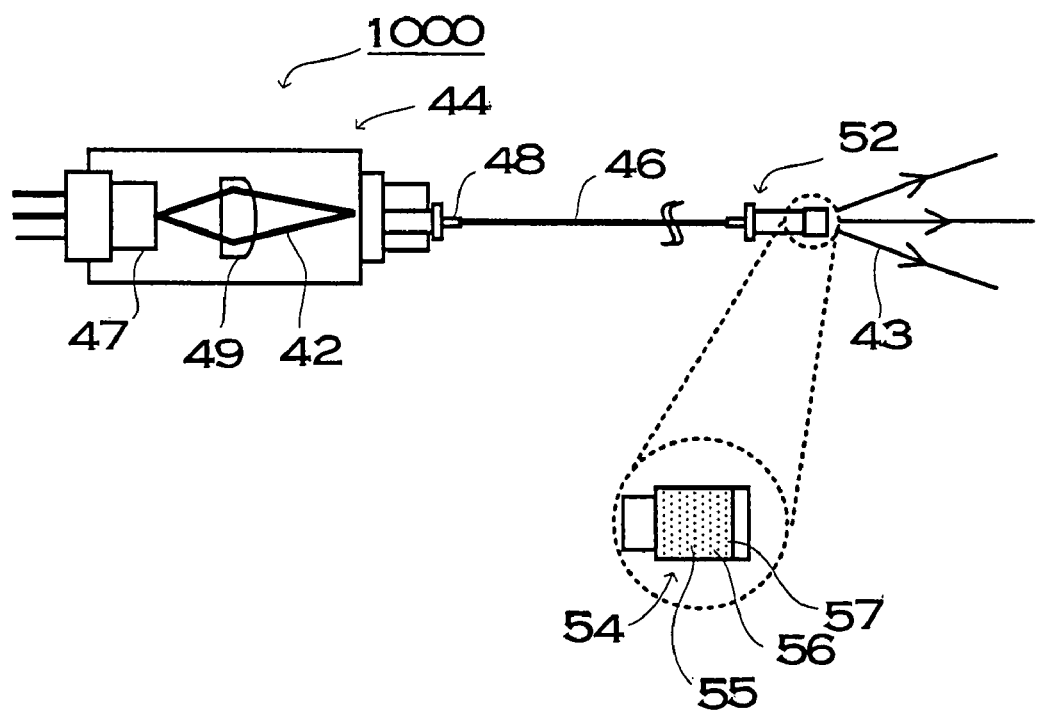
FIG. 44 is a schematic view showing a light emitting apparatus according to a tenth embodiment of the present invention.

With reference to FIG. 44, a light emitting apparatus according to a tenth embodiment of the present invention is described. FIG. 44 is a schematic view showing a light emitting apparatus 1000 with a luminescent film according to the tenth embodiment of the present invention. The light emitting apparatus 1000 has an excitation light source 44, a luminescent material 54, and an optical fiber 46. The excitation light source 44 launches excitation light 42. The luminescent material 54 absorbs the excitation light 42 launched from the excitation light source 44, and emits lighting light 43 of prescribed wavelength region converted from the excitation light 42. The optical fiber 46 is provided with the excitation light source 44 at one end, and the luminescent material 54 at another end. In the optical fiber 46, the refractive index of a center portion (core) is higher than a periphery portion (clad) so that the excitation light 42 launched from the excitation light source 44 is guided to the luminescent material 54.

The excitation light source 44 has a light emitting element 47. The light emitted from the light emitting element 47 is guided from an injection portion 48 to the optical fiber 46. In order to efficiently guide the light emitted from the light emitting element 47 to the injection portion 48, a lens 49 is provided between the light emitting element 47 and the injection portion 48.

One end of the optical fiber 46 is connected to the injection portion 48. The optical fiber 46 is provided with an output portion 52 which guides externally light at another end. The output portion 52 includes the luminescent material 54. In this embodiment, an inorganic phosphor 55 is used as the luminescent material 54. The luminescent material 54 absorbs the excitation light 42 launched from the excitation light source 44, and emits lighting light 43 of prescribed wavelength region converted from the excitation light 42. The phosphor 55 is previously mixed with a filler member 56 and a binder member 57. The filler member 56 and binder member 57 provide located in the output portion 52. The amounts of the filler member 56 and the binder member 57 can adjust the amount of the phosphor 55, for example. The filler member 56 is an inorganic filler. The binder member 57 is an inorganic compound including a hydroxide oxide containing at least a metallic element. A hydroxide oxide of Al, or Y having boehmite structure or pseudoboehmite structure can be used as the hydroxide oxide of metallic element contained in the binder member 57.

In the case where the light emitting element 47 with light emission peak wavelength near 400 nm in the short wavelength region of the visible light, and mixture of a phosphor emitting luminescent radiation of blue light and a phosphor emitting luminescent radiation of yellow light as the phosphor 55 are used, the lighting light 43 consist of mainly of white light emitted from the phosphor 55. Since human eyes are less sensitive to light near 400 nm, blue light, yellow, and white light to which human eyes are sensitive serve as the lighting light 43.

In the case where the light emitting element 47 with light emission peak wavelength near 460 nm in the short wavelength region of the visible light, and mixture of a phosphor emitting luminescent radiation of yellow light and a phosphor emitting luminescent radiation of red light as the phosphor 55 are used, mixed color light of the excitation light 42 launched from the light emitting element 47 and the light emitted from the phosphor 55 is externally guided as the lighting light 43. In this case, the lighting light 43 is reddish white light.

In the case where the light emitting element 47 with light emission peak wavelength near 365 nm in the ultraviolet region of the visible light, and mixture of a phosphor emitting luminescent radiation of blue light and a phosphor emitting luminescent radiation of yellow light as the phosphor 55 are used, the lighting light 43 consists of the light emitted from the phosphor 55. Since human eyes are insensitive to ultraviolet rays, the lighting light 43 consists only of the light with wavelength converted to visible light emitted from the phosphor 55. Thus, the white light emitted from the phosphor 55 composes the lighting light 43.

In addition, various combinations as the phosphor 55 can be used. For example, a combination of light of three primary colors (blue, green, red) provides a wide region of color tone. Or, a combination of two complementary color, such as blue and yellow, bluish green and red, green and red, and bluish purple and yellowish green provides various color tones. One of these colors may be replaced by light launched from the light emitting element 47. The complementary color refers to the relationship that provides light in the white region when light of one light emission peak wavelength and light of another light emission peak wavelength are mixed. The above relationship between the color name and the wavelength range is based on JIS Z8110. In order to achieve high color rendering, combined various kinds of phosphors may be used as the phosphor 55.

Color rendering refers to the characteristics of a light source that gives influence on a perceived color of a surface illuminated by the light source. Color temperature psychically and physically expresses the color of light source itself in absolute temperature (K) of a Planckian radiator which has the same chromaticity as the light source. Generally, it is represented in the extent of agreement between the perceived color of a surface illuminated by a light source and that of the same surface illuminated by a reference light source with the same color temperature. The general color rendering index (Ra) is calculated based on the average value of color difference between a tested light source and a reference light source when the eight kinds of color samples are illuminated by both light sources. The special color rendering indices are calculated based on color difference in the seven kinds of color samples other than the above eight kinds of color samples, but are not the average value of the seven kinds. Among them, R9 is in the case of red.

This light emitting apparatus 1000 can be applied to a medical field, such as an endoscope which displays an image of the subject to be illuminated, a lighting apparatus and a display which provide various kinds of colors by using a plurality of excitation light sources 44, and so on. Light emitted from the light emitting apparatus 1000 is directly observed by human eyes, or may be detected by a CCD camera, and so on, to obtain an image. The excitation light source 44 and the phosphor 55 are suitably selected depending on the sensitivity of an image pickup device, such as a CCD camera.

The operation of the light emitting apparatus 1000 is described. The excitation light 42 launched from the light emitting element 47 contained in the excitation light source 44 passes through the lens 49, and guided the injection portion 48. The lens 49 focuses the excitation light 42 launched from the light emitting element 47 on the injection portion 48. The excitation light 42 launched from the injection portion 48 is guided to the optical fiber 46. Excitation light 42 is guided to the output portion 52 which is another end, while repeatedly undergoing total reflection inside the optical fiber 46. The guided excitation light 42 is illuminated to the phosphor 55 which is the luminescent material 54 provided in the output portion 52. The phosphor 55 absorbs at least a part of the excitation light 42, and emits luminescent radiation of converted wavelength in a prescribed wavelength region. This light is externally guided as the lighting light 43. Alternatively, the mixture lighting light 43 of the light emitted from the phosphor 55 and the excitation light 42 is externally guided. In the output portion 52, since light is absorbed and scattered by the phosphor 55, the light density is high. For this reason, it is necessary to provide a member with excellent heat resistance and light resistance by employing the inorganic filler 32 or the binder member 57.

Thus, white light can be obtained by the at least one light emitting element 47. Since white light can be obtained by only one light emitting element 47, it is possible to provide a light emitting apparatus with less color tone variation and excellent color reproduction characteristics. Since the light emitting element 47 and the phosphor 55 are used, it is possible to provide a light emitting apparatus with well-mixed color and high color rendering. Moreover, is possible to provide a light emitting apparatus with high luminescence intensity. Since the phosphor 55 is not applied to the light emitting element 47, the phosphor 55 does not deteriorate due to the heat generated by operation of the light emitting element 47. When the laser diode element is used as the excitation light source 44, the light density is very high. A resin mixed with the phosphor 55 cannot be used for the output portion 52. On the other hand, in the case where alumina sol, yttrium sol, and so on, mixed with the phosphor 55 is employed as the binder member 57 for the output portion 52, since the binder member 57 has excellent light resistance and heat resistance, it is possible to provide a light emitting apparatus with excellent weather resistance, but without deterioration due to relatively high light density.

(Excitation Light Source)

The excitation light source 44 can be any light source as long as capable of emitting light that excites the phosphor 55, such as semiconductor light emitting element, lamp, and source with electron beam, plasma and EL as energy source. Since the light emitting element 47 is small, and have high luminescence intensity, it is preferably used, but not limited to this. A light emitting diode element (LED), a laser diode element (LD), and so on, can be used as the light emitting element 47.

(Luminescent Material)

The luminescent material 54 can be any material as long as capable of absorbing the excitation light launched from the excitation light source 44 and emitting luminescent light of prescribed wavelength region converted from the excitation light 42, such as the phosphor 55, and pigment. The emission spectrum of the excitation light source 44 is different from the emission spectrum of the luminescent material 54. Since the light launched from the excitation light source 44 is excitation light, the luminescent material 54 has light emission peak wavelength in the wavelength side longer than the light emission peak wavelength of the excitation light source 44. Particularly, even when a laser diode element is used as the light emitting element 47, lighting light has the broad emission spectrum with wide half-value width. Accordingly, it is possible to provide good visibility. The aforementioned phosphor 55, filler member 56, and binder member 57 can be used. As for an application method to the output portion 52, the phosphor 55, the filler member 56, and the binder member 57 are mixed, and provided in a prescribed container, then glass, transparent resin, or the like, caps and seals it. Alternatively, the phosphor 55, the filler member 56, and the binder member 57 are mixed, and provided in a prescribed container, then it is impregnated with resin. However, the method is not specifically limited to them. In addition, in order to improve heat diffusion, a transparent inorganic filler with good heat conductivity can be provided.

(Optical Fiber)

The optical fiber 46 can be any optical fiber as long as capable of guiding light launched from the excitation light source 44 to the luminescent material 54. Particularly, in terms of energy efficiency, it is preferable that light launched from the excitation light source 44 is guided to the luminescent material 54 without attenuation. For example, combination of materials with high and low refractive indices, or a material with high reflectivity can be used. Specifically, the optical fiber 46 can be used.

The optical fiber 46 is a very thin glass fiber used for a transmission medium of light in transmission of light. It is made of quartz glass or plastic. The refractive index of the center portion (core) is higher than the periphery portion (clad), thus, a light signal can be transmitted without attenuation.

Since the optical fiber 46 is movable, it is possible to illuminate a desired part with the lighting light 43. In addition, the optical fiber 46 is also flexible. The optical fiber 46 can consist of a single fiber. It is preferable that the core diameter of the single fiber is 400 μm or less.

(Cut-Off Member)

A cut-off member can be a material which cuts off 90% or more of light from the excitation light source. For example, when a light emitting element 47 emitting ultraviolet rays harmful to human is used as the light emitting element 47, in order to cut off the ultraviolet rays, an ultraviolet absorption agent can be used as the cut-off member. Moreover, a prescribed filter can be provided to the output portion 52, thus, a prescribed wavelength can be cut off.

Industrial Applicability

As described above, the luminescent film and the light emitting apparatus, the method for producing a luminescent film, and the method for producing a light emitting apparatus according to the present invention can be applied to a light source for lighting, an LED display, a back light source, a signal light, an illuminated switch, various sensors, and various indicators, and so on.

The invention claimed is:

1. A luminescent film for coating a light emitting element, the luminescent film comprising:
    a filler member including at least a luminescent material; and
    a binder member,
    wherein said binder member contains at least a hydroxide oxide of a metallic element, said hydroxide oxide being a hydroxide oxide of Al or a hydroxide oxide of yttrium,
    wherein said binder member is in a gel state and is filled with inorganic particles containing said hydroxide oxide,
    wherein said luminescent film is operable to absorb a light emitted from the light emitting element and to fluoresce luminescent radiation of a wavelength different from the light emitted from the light emitting element, and
    wherein said hydroxide oxide is transparent.

2. The luminescent film according to claim 1, wherein said luminescent material is an inorganic phosphor, and said filler member is an inorganic filler,
    wherein said binder member is an inorganic binder consisting essentially of said hydroxide oxide of said metallic element, and
    wherein said metallic element has a constant ionic charge number.

3. The luminescent film according to claim 2, wherein said binder member is non silicated binder.

4. The luminescent film according to claim 1, wherein said luminescent material is an inorganic phosphor, and said filler member is an inorganic filler,
    wherein said binder member is an inorganic binder consisting essentially of said hydroxide oxide of said metallic element, and
    wherein said metallic element is a group IIIA or group IIIB element.

5. The luminescent film according to claim 1, wherein said luminescent material is an inorganic phosphor and said filler member is an inorganic filler,
    wherein said binder member is an inorganic binder consisting essentially of said hydroxide oxide of said metallic element, and
    wherein said metallic element is selected from the group consisting of Sc, Y, Gd, Lu, B, Al, Ga, and In.

6. The luminescent film according to claim 1, wherein said hydroxide oxide is a hydroxide oxide of Al having a boehmite structure or a pseudoboehmite structure.

7. The luminescent film according to claim 1, wherein said metallic element is aluminum, and
    wherein said binder member further contains a hydroxide oxide of an element in group IIIA or group IIIB other than aluminum.

8. The luminescent film according to claim 7, wherein said binder member is composed of 0.5% to 50% by weight of said hydroxide oxide of said element in group IIIA or group IIIB.

9. The luminescent film according to claim 1, wherein said binder member contains 0.5% to 50% of boron oxide or boric acid by weight relative to the binder member.

10. The luminescent film according to claim 1, wherein said hydroxide oxide of said metallic element is a hydroxide oxide of yttrium.

11. The luminescent film according to claim 10, wherein said metallic element is yttrium,
    wherein said binder member further contains a hydroxide oxide of an element in group IIIA or group IIIB other than yttrium.

12. The luminescent film according to claim 1, wherein said binder member is a porous material with a bridge structure, a network structure or a polymer structure which is formed of particle aggregation containing said hydroxide oxide.

13. The luminescent film according to claim 1, wherein the light transmittance of said luminescent film in said gel state is higher than the transmittance in a polycrystalline state or an amorphous polycrystalline state.

14. The luminescent film according to claim 1, wherein said binder member contains 10% or less of hydroxyl group or water of crystallization by weight relative to the binder member.

15. The luminescent film according to claim 1, wherein the weight ratio of the filler member to the binder member is 0.05 to 30.

16. The luminescent film according to claim 1, wherein said binder member does not contain silica.

17. A luminescent film coated on a light emitting element, the luminescent film comprising:
   a filler member including at least a luminescent material; and
   a binder member,
   wherein said binder member contains a hydroxide oxide of Al or a hydroxide oxide of yttrium and has a porous structure,
   wherein said luminescent film is operable to absorb a light emitted from the light emitting element and to fluoresce luminescent radiation of a wavelength different from the light emitted from the light emitting element, and
   wherein said hydroxide oxide is transparent.

* * * * *